United States Patent
Ko et al.

(10) Patent No.: US 12,265,677 B1
(45) Date of Patent: Apr. 1, 2025

(54) ELECTRONIC DEVICE

(71) Applicant: Samsung Display Co., Ltd., Yongin-si (KR)

(72) Inventors: Gwang-Bum Ko, Yongin-si (KR); Hyungbae Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/821,938

(22) Filed: Aug. 30, 2024

(30) Foreign Application Priority Data

Nov. 27, 2023 (KR) .................. 10-2023-0167244
Dec. 27, 2023 (KR) .................. 10-2023-0192905
Jul. 25, 2024 (KR) .................. 10-2024-0098453

(51) Int. Cl.
*G06F 3/041* (2006.01)
*G06F 3/044* (2006.01)
*G06F 3/046* (2006.01)
*H10K 59/40* (2023.01)

(52) U.S. Cl.
CPC ...... *G06F 3/04166* (2019.05); *G06F 3/04164* (2019.05); *G06F 3/0446* (2019.05); *G06F 3/046* (2013.01); *H10K 59/40* (2023.02); *G06F 2203/04106* (2013.01); *G06F 2203/04107* (2013.01)

(58) Field of Classification Search
CPC ........... G06F 3/044–0448; G06F 3/046; G06F 2203/04107; G06F 2203/04106; G06F 3/04164
See application file for complete search history.

(56) References Cited

U.S. PATENT DOCUMENTS

| 5,134,689 | A | 7/1992 | Murakami et al. |
| 9,392,735 | B2 | 7/2016 | Jang et al. |
| 9,507,390 | B2 | 11/2016 | Jang et al. |
| 9,983,740 | B2 * | 5/2018 | Mäkeläinen ......... H05K 9/0096 |
| 11,169,634 | B2 | 11/2021 | Jeong et al. |
| 11,275,404 | B2 * | 3/2022 | Bae .................. G06F 3/046 |
| 11,550,422 | B2 * | 1/2023 | Chang ................ G06F 3/0412 |

(Continued)

FOREIGN PATENT DOCUMENTS

| CN | 115955765 A | 4/2023 |
| CN | 116225257 A | 6/2023 |

(Continued)

*Primary Examiner* — Patrick F Marinelli
(74) *Attorney, Agent, or Firm* — Womble Bond Dickinson (US) LLP

(57) ABSTRACT

An electronic device includes a display panel including a first area, a bending area at which the display panel is bent, a second area overlapping the first area, first electrodes arranged in a first direction in the first area, second electrodes arranged in a second direction in the first area, and crossing the first electrodes, and third electrodes in the first area, and overlapping with the first electrodes, a circuit board coupled to the display panel at the second area, and including connection lines arranged in the first direction, and respectively electrically connected to the third electrodes, a metal lower sheet between the display panel and the circuit board, a first magnetic-field-shielding layer between the third electrodes and the metal lower sheet, and a second magnetic-field-shielding layer between the connection lines of the circuit board and the metal lower sheet.

30 Claims, 38 Drawing Sheets

(56) References Cited

U.S. PATENT DOCUMENTS

| | | | |
|---|---|---|---|
| 11,570,911 B2* | 1/2023 | Shin | G06F 3/046 |
| 11,625,118 B2 | 4/2023 | Kim et al. | |
| 11,698,704 B2* | 7/2023 | Yoo | H10K 59/65 |
| | | | 345/174 |
| 11,703,961 B2 | 7/2023 | Jeon et al. | |
| 11,758,655 B2 | 9/2023 | Lee et al. | |
| 11,775,018 B2* | 10/2023 | Bouthinon | G06F 1/1656 |
| | | | 361/679.55 |
| 11,836,003 B2* | 12/2023 | Bae | G06F 3/04186 |
| 11,836,324 B2* | 12/2023 | Son | G06F 1/1652 |
| 11,849,622 B2* | 12/2023 | Kim | G06F 1/1616 |
| 11,886,238 B2* | 1/2024 | Shin | G06F 1/1616 |
| 11,893,179 B2* | 2/2024 | Wang | G06F 3/0446 |
| 11,943,879 B2* | 3/2024 | Shin | G06F 3/046 |
| 2015/0189799 A1* | 7/2015 | Makelainen | G06F 3/0443 |
| | | | 345/174 |
| 2020/0301477 A1* | 9/2020 | Bouthinon | G06V 40/1318 |
| 2021/0173437 A1* | 6/2021 | Bae | H10K 59/40 |
| 2022/0019330 A1* | 1/2022 | Chang | G06F 1/1643 |
| 2022/0043481 A1* | 2/2022 | Shin | G06F 1/1616 |
| 2022/0061169 A1* | 2/2022 | Shin | G06F 1/1643 |
| 2022/0197440 A1* | 6/2022 | Son | G06F 3/0418 |
| 2022/0197442 A1* | 6/2022 | Bae | G06F 3/046 |
| 2022/0397972 A1* | 12/2022 | Yoo | H10K 59/65 |
| 2023/0084467 A1* | 3/2023 | Gu | G06F 1/1616 |
| | | | 361/679.01 |
| 2023/0148409 A1 | 5/2023 | Hong et al. | |
| 2023/0156930 A1* | 5/2023 | Shin | G06F 3/046 |
| | | | 345/174 |
| 2023/0214046 A1* | 7/2023 | Wang | G06F 3/0445 |
| | | | 345/174 |
| 2023/0305669 A1* | 9/2023 | Yoo | H05K 9/0054 |
| 2023/0418409 A1 | 12/2023 | Lim | |
| 2024/0069684 A1* | 2/2024 | Yoo | H10K 59/126 |
| 2024/0134413 A1* | 4/2024 | Yoo | G06F 1/1652 |
| 2024/0184382 A1 | 6/2024 | Kim et al. | |
| 2024/0192791 A1* | 6/2024 | Ko | G06F 3/0443 |
| 2024/0231425 A9* | 7/2024 | Yoo | G06F 1/1656 |
| 2024/0231532 A1 | 7/2024 | Kim et al. | |
| 2024/0321898 A1* | 9/2024 | Shuai | H01L 27/124 |

FOREIGN PATENT DOCUMENTS

| | | |
|---|---|---|
| CN | 117396042 A | 1/2024 |
| KR | 10-2013-0090385 A | 8/2013 |
| KR | 10-2019-0140132 A | 12/2019 |
| KR | 10-2022-0001634 A | 1/2022 |
| KR | 10-2022-0023952 A | 3/2022 |
| KR | 10-2022-0062191 A | 5/2022 |
| KR | 10-2022-0129123 A | 9/2022 |
| KR | 10-2022-0139285 A | 10/2022 |
| KR | 10-2023-0020061 A | 2/2023 |
| KR | 10-2024-0000691 A | 1/2024 |
| WO | WO 2013/183913 A1 | 12/2013 |

* cited by examiner

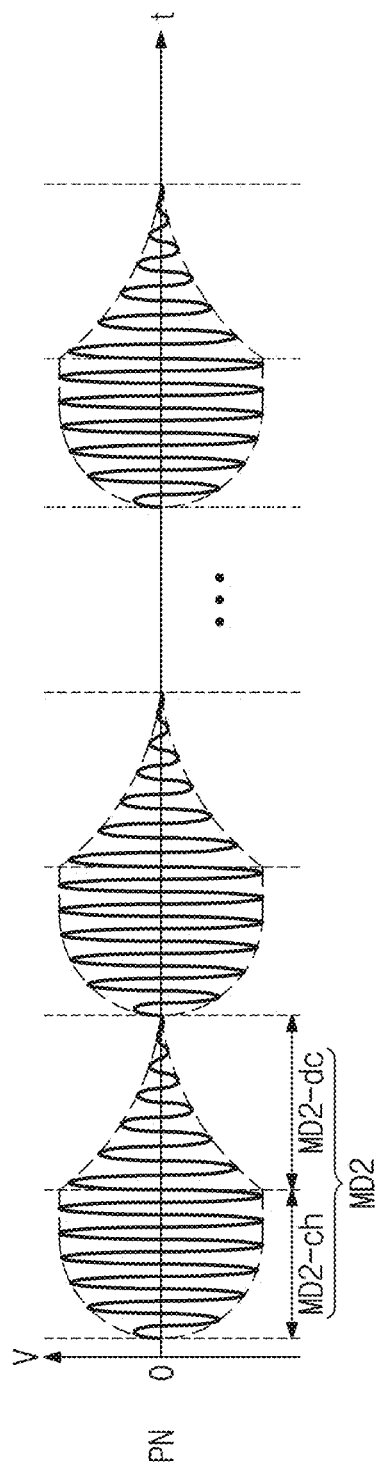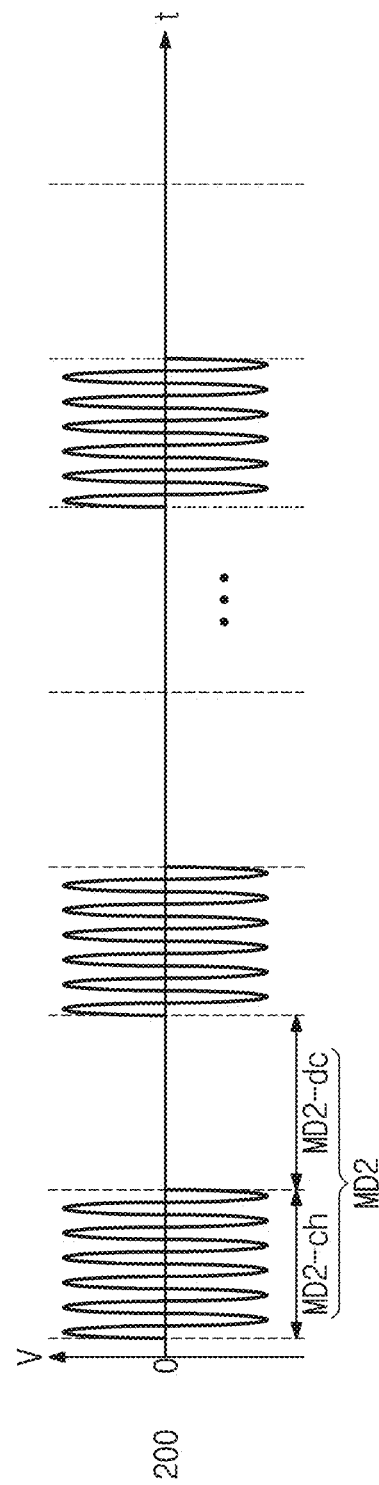

ELECTRONIC DEVICE

CROSS-REFERENCE TO RELATED APPLICATIONS

The present application claims priority to, and the benefit of, Korean Patent Application No. 10-2023-0167244, filed on Nov. 27, 2023, Korean Patent Application No. 10-2023-0192905, filed on Dec. 27, 2023, and Korean Patent Application No. 10-2024-0098453, filed on Jul. 25, 2024 in the Korean Intellectual Property Office, the entire disclosures of which are incorporated herein by reference.

BACKGROUND

1. Field

The present disclosure herein relates to an electronic device capable of sensing an input by a pen.

2. Description of the Related Art

Multimedia electronic devices, such as televisions, mobile phones, tablet computers, laptop computers, navigators, game consoles, and the like includes a display device for displaying an image. Such an electronic device may include a sensor layer (or an input sensor), which is capable of providing a touch-based input manner that allows a user to easily input information or commands intuitively and conveniently in addition to usual input manners, such as a button, a keyboard, a mouse, and the like. The sensor layer may sense a user's touch or pressure. There is an increasing demand for using a pen for fine touch input for a user who is familiar with information input using a writing instrument or a specific application program (for example, application program for sketching or drawing).

SUMMARY

The present disclosure provides an electronic device capable of sensing an input by a pen.

One or more embodiments of the present disclosure provide an electronic device including a display panel including a first area, a bending area at which the display panel is bent, a second area overlapped by the first area, first electrodes arranged in a first direction in the first area, second electrodes arranged in a second direction crossing the first direction in the first area, and crossing the first electrodes, and third electrodes in the first area, and overlapping with the first electrodes, a circuit board coupled to the display panel at the second area, and including connection lines arranged in the first direction, and respectively electrically connected to the third electrodes, a metal lower sheet between the display panel and the circuit board, a first magnetic-field-shielding layer between the third electrodes of the display panel and the metal lower sheet, and a second magnetic-field-shielding layer between the connection lines of the circuit board and the metal lower sheet.

The connection lines may be respectively electrically connected to the third electrodes at the first area, at the bending area, or at the second area.

The display panel may further include a display layer and a sensor layer, the sensor layer including first loop trace lines respectively electrically connected to first ends of the third electrodes, and arranged in the first direction, and a second loop trace line electrically connected to second ends of the third electrodes.

The first loop trace lines may be spaced from the connection lines respectively electrically connected thereto in the first direction.

The second loop trace line may include a first line portion electrically connected to the third electrodes, a second line portion extending from a first end of the first line portion in the second direction, and a third line portion extending from a second end of the first line portion in the second direction, wherein the second line portion, the first loop trace lines, and the third line portion are sequentially arranged in the first direction.

At least one of the display panel or the circuit board may further include bridge lines respectively electrically connecting the connection lines and the third electrodes.

The bridge lines may extend in the first direction.

The bridge lines may be in the first area.

The first area may include a sensing area for sensing an external input, and a peripheral area adjacent to the sensing area, wherein at least some of the bridge lines are in the peripheral area.

The bridge lines may be separated from the bending area.

Some of the bridge lines may be in the first area, wherein others of the bridge lines are in the circuit board.

One or more embodiments of the present disclosure provide an electronic device including a display panel including a first area, a bending area at which the display panel is bent, a second area overlapped by the first area, first electrode portions arranged in a first direction in the first area, second electrode portions arranged in the first direction in the bending area, and electrically connected to the first electrode portions, and third electrode portions arranged in the first direction in the second area, and electrically connected to the second electrode portions, a circuit board coupled to the display panel at the second area, and including connection lines arranged in the first direction, and electrically connected to the third electrode portions, a metal lower sheet between the first electrode portions and the connection lines, a first magnetic-field-shielding layer between the first electrode portions and the metal lower sheet, and a second magnetic-field-shielding layer between the connection lines and the metal lower sheet.

The connection lines may have an arrangement order in the first direction that is different from an arrangement order in the first direction of the third electrode portions respectively connected thereto.

The arrangement order of the third electrode portions may be opposite to the arrangement order of the connection lines.

One or more embodiments of the present disclosure provide an electronic device including a display panel including a first area, a bending area at which the display panel is bent, a second area overlapped by the first area, first electrode portions arranged in a first direction in the first area, second electrode portions arranged in the first direction in the bending area, and electrically connected to the first electrode portions, and third electrode portions arranged in the first direction in the second area, and electrically connected to the second electrode portions, a circuit board coupled to the display panel at the second area, and including connection lines electrically connected to the third electrode portions at a first layer, extension connection lines connected to connection lines at a second layer that is different from the first layer, a first conductive shielding layer between the first electrode portions and the connection lines, and a second conductive shielding layer between the connection lines and the extension connection lines, a metal lower sheet between the display panel and the circuit board, and a magnetic-field-shielding layer between the display panel and the metal lower sheet.

The first conductive shielding layer or the second conductive shielding layer may be grounded.

The first conductive shielding layer or the second conductive shielding layer may be configured to receive a constant voltage.

The circuit board may be below the display panel at the first area, and may further include a first conductive layer including the connection lines and a second conductive layer including the extension connection lines, and the first conductive layer is between the second conductive layer and the first area of the display panel.

The first conductive layer may be below the first conductive shielding layer, and may partially overlap the second area of the display panel.

The second conductive layer may be below the second conductive shielding layer, and may partially overlap the second area of the display panel.

One or more embodiments of the present disclosure provide an electronic device including a substrate including a first area, a bending area at which the substrate is bent, and a second area overlapped by the first area, a circuit layer above the substrate, and including a transistor, a light-emitting element layer above the circuit layer, and including a light-emitting element electrically connected to the transistor, a sensor layer above the light-emitting element layer, and including electrodes arranged in a first direction in the first area, a sensor driver configured to use the electrodes to generate a magnetic field for charging a pen including an RLC resonance circuit, a circuit board coupled to the substrate at the second area, and including connection lines electrically connected to the electrodes, a metal lower sheet between the electrodes and the connection lines, a first magnetic-field-shielding layer between the electrodes and the metal lower sheet, and a second magnetic-field-shielding layer between the connection lines and the metal lower sheet.

The sensor driver may be configured to selectively operate in a first mode in which the sensor layer is driven to sense a touch input, or in a second mode including a charging-driving mode in which the sensor layer is driven to sense a pen input.

The sensor layer may be configured to sense the pen input by applying a first signal to at least one of the electrodes, and by applying a second signal to at least one other of the electrodes.

The sensor layer may further include a first mesh line having a first width, a second mesh line above the first mesh line and having a second width that is equal to or greater than the first width, and an intermediate insulating layer between the first mesh line and the second mesh line.

The connection lines may have an arrangement order in the first direction that is different from an arrangement order in the first direction of the electrodes respectively connected thereto.

The electronic device may further include bridge lines in the first area of the substrate and/or in the circuit board, the bridge lines respectively electrically connecting the electrodes to the connection lines.

The bridge lines may be within a limited distance from a bending edge defined in the bending area.

The electronic device may further include a display driver in the second area and configured to control the circuit layer, wherein the circuit board overlaps the first area.

The second magnetic-field-shielding layer may overlap the second area of the substrate and the circuit board.

The first magnetic-field-shielding layer may have a surface area that is equal to or greater than that of the second magnetic-field-shielding layer.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain principles of the present disclosure. In the drawings:

FIG. 17A is a view for explaining an operation of the pen according to one or more embodiments of the present disclosure;

FIG. 17B is a view for explaining an operation of a sensor layer according to one or more embodiments of the present disclosure;

DETAILED DESCRIPTION

Figure 1A:
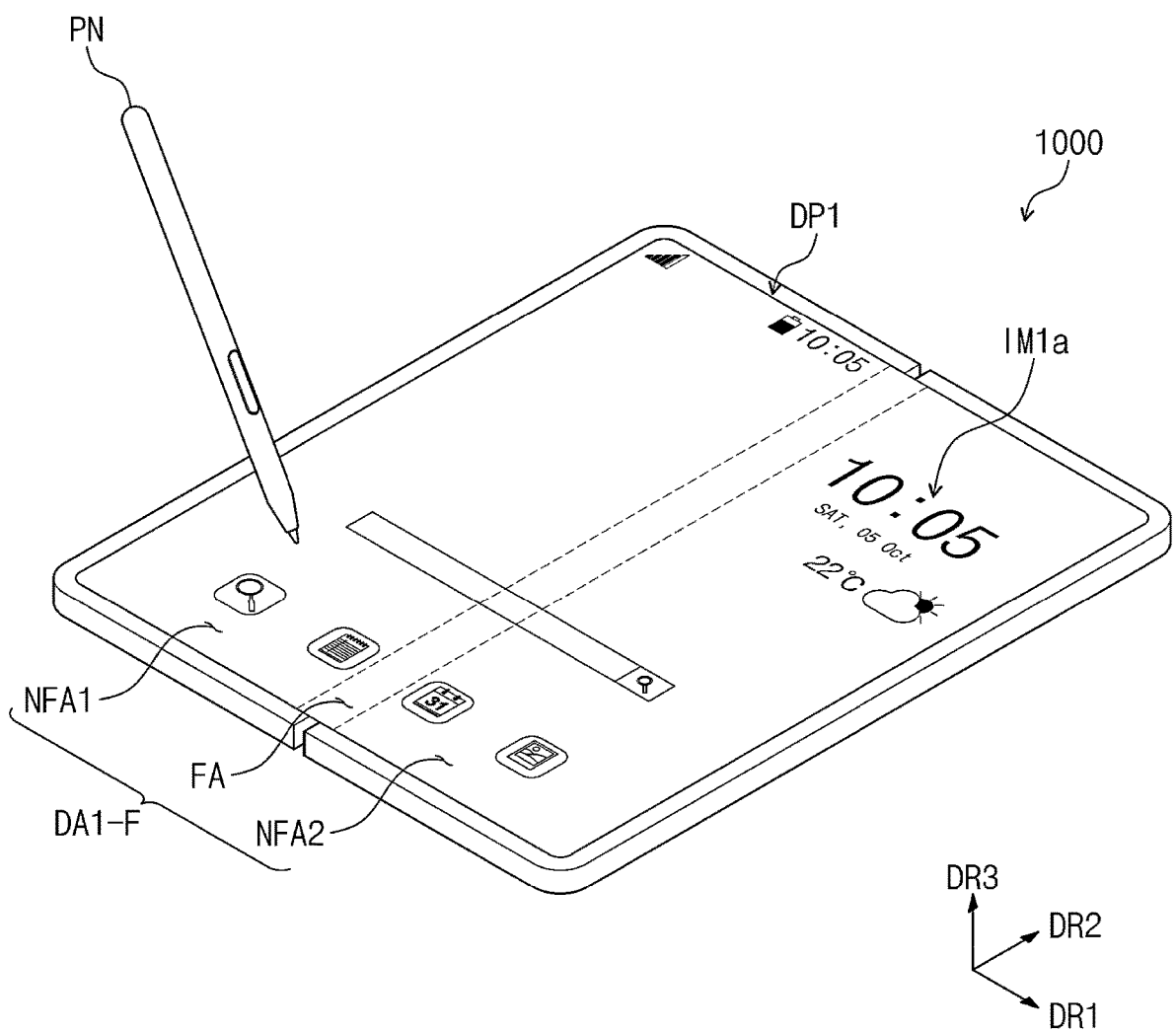
FIG. 1A is a perspective view of an electronic device according to one or more embodiments of the present disclosure.

Aspects of some embodiments of the present disclosure and methods of accomplishing the same may be understood more readily by reference to the detailed description of embodiments and the accompanying drawings. The described embodiments are provided as examples so that this disclosure will be thorough and complete, and will fully convey the aspects of the present disclosure to those skilled in the art. Accordingly, processes, elements, and techniques that are redundant, that are unrelated or irrelevant to the description of the embodiments, or that are not necessary to those having ordinary skill in the art for a complete understanding of the aspects of the present disclosure may be omitted. Unless otherwise noted, like reference numerals, characters, or combinations thereof denote like elements throughout the attached drawings and the written description, and thus, repeated descriptions thereof may be omitted.

The described embodiments may have various modifications and may be embodied in different forms, and should not be construed as being limited to only the illustrated embodiments herein. The use of "can," "may," or "may not" in describing an embodiment corresponds to one or more embodiments of the present disclosure. The present disclosure covers all modifications, equivalents, and replacements within the idea and technical scope of the present disclosure. Further, each of the features of the various embodiments of the present disclosure may be combined with each other, in part or in whole, and technically various interlocking and driving are possible. Each embodiment may be implemented independently of each other or may be implemented together in an association.

In the drawings, the relative sizes of elements, layers, and regions may be exaggerated for clarity and/or descriptive purposes. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result of, for example, manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the illustrated shapes of elements, layers, or regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Spatially relative terms, such as "beneath," "below," "lower," "lower side," "under," "above," "upper," "upper side," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below," "beneath," "or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include stack, face or facing, extending over, covering, or partly covering or any other suitable term as would be appreciated and understood by those of ordinary skill in the art. The expression "not overlap" may include meaning, such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

It will be understood that when an element, layer, region, or component is referred to as being "formed on," "on," "connected to," or "(operatively or communicatively) coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or one or more intervening layers, regions, or components may be present. The one or more intervening components may include a switch, a resistor, a capacitor, and/or the like. In describing embodiments, an expression of connection indicates electrical connection unless explicitly described to be direct connection, and "directly connected/directly coupled," or "directly on," refers to one component directly connecting or coupling another component, or being on another component, without an intermediate component.

In addition, in the present specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion. Meanwhile, other expressions describing relationships between components, such as "between," "immediately between" or "adjacent to" and "directly adjacent to," may be construed similarly. It will be understood that when an element or layer is referred to as being "between" two elements or layers, it can be the only element or layer between the two elements or layers, or one or more intervening elements or layers may also be present.

For the purposes of this disclosure, expressions such as "at least one of," or "any one of," or "one or more of" when preceding a list of elements, modify the entire list of elements and do not modify the individual elements of the list. For example, "at least one of X, Y, and Z," "at least one of X, Y, or Z," "at least one selected from the group consisting of X, Y, and Z," and "at least one selected from the group consisting of X, Y, or Z" may be construed as X only, Y only, Z only, any combination of two or more of X, Y, and Z, such as, for instance, XYZ, XYY, YZ, and ZZ, or any variation thereof. Similarly, the expressions "at least one of A and B" and "at least one of A or B" may include A, B, or A and B. As used herein, "or" generally means "and/or," and the term "and/or" includes any and all combinations of one or more of the associated listed items. For example, the expression "A and/or B" may include A, B, or A and B. Similarly, expressions such as "at least one of," "a plurality of," "one of," and other prepositional phrases, when preceding a list of elements, modify the entire list of elements and do not modify the individual elements of the list.

It will be understood that, although the terms "first," "second," "third," etc., may be used herein to describe various elements, components, regions, layers and/or sections, these elements, components, regions, layers and/or sections should not be limited by these terms. These terms do not correspond to a particular order, position, or superiority, and are used only used to distinguish one element, member, component, region, area, layer, section, or portion from another element, member, component, region, area, layer, section, or portion. Thus, a first element, component, region, layer or section described below could be termed a second element, component, region, layer or section, without departing from the spirit and scope of the present disclosure. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

In the examples, the x-axis (e.g., DR1-axis), the y-axis (e.g., DR2-axis), and/or the z-axis (e.g., DR3-axis) are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing embodiments only and is not intended to be limiting of the present disclosure. As used herein, the singular forms "a" and "an" are intended to include the plural forms as well, while the plural forms are also intended to include the singular forms, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

When one or more embodiments may be implemented differently, a specific process order may be performed differently from the described order. For example, two consecutively described processes may be performed substantially at the same time or performed in an order opposite to the described order.

As used herein, the term "substantially," "about," "approximately," and similar terms are used as terms of approximation and not as terms of degree, and are intended to account for the inherent deviations in measured or calculated values that would be recognized by those of ordinary skill in the art. For example, "substantially" may include a range of +/−5% of a corresponding value. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within +30%, 20%, 10%, 5% of the stated value. Further, the use of "may" when describing embodiments of the present disclosure refers to "one or more embodiments of the present disclosure."

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

The terms "part" and "unit" refer to a software component or hardware component that performs a specific function. The hardware components may include, for example, a field-programmable gate array (FPGA) or an application-specific integrated circuit (ASIC). The software component may refer to executable code and/or data used by the executable code in an addressable storage medium. Thus, software components may be, for example, object-oriented software components, class components and task components, processes, functions, properties, procedures, subroutines, program code segments, drivers, firmware, microcodes, circuits, data, databases, data structures, tables, arrays, or variables.

Hereinafter, embodiments of the present disclosure will be described with reference to the accompanying drawings.

Figure 1B:
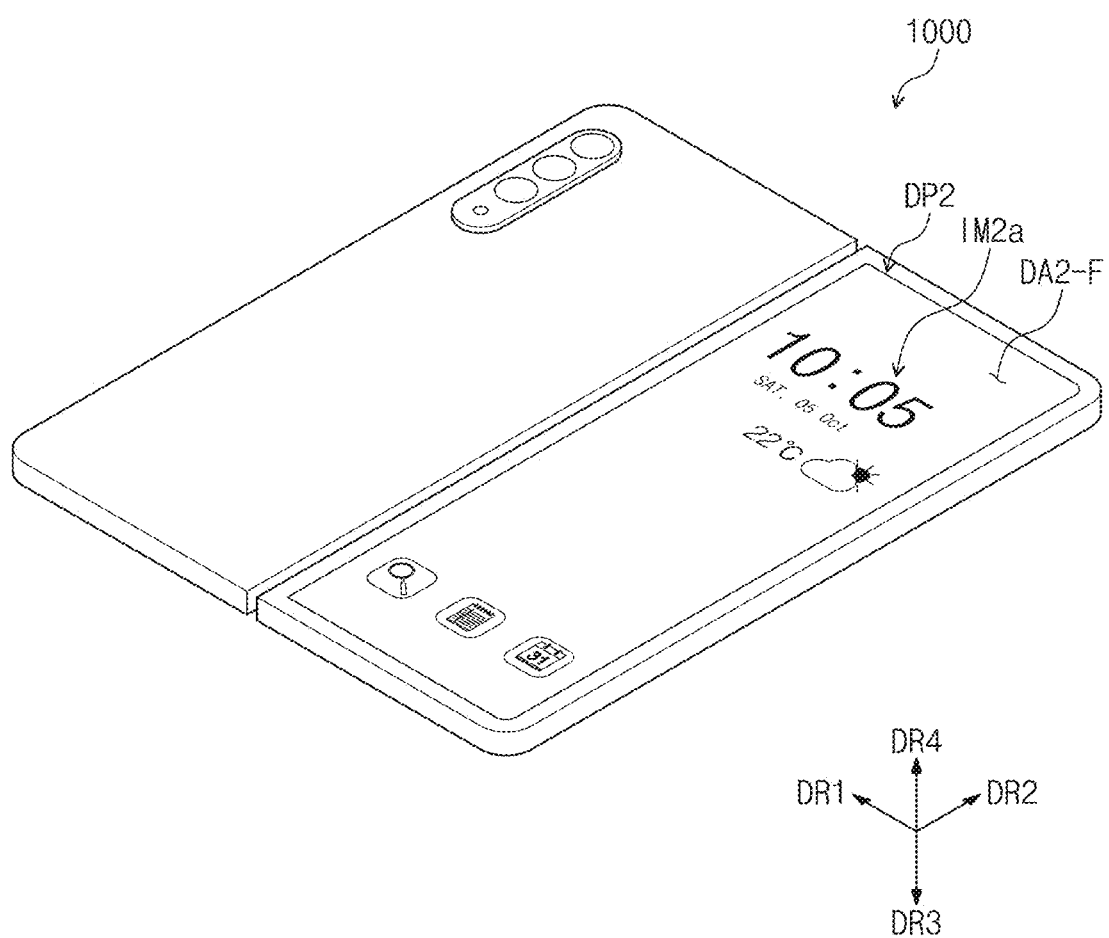
FIG. 1B is a rear perspective view of the electronic device according to one or more embodiments of the present disclosure.

FIG. 1A is a perspective view of an electronic device 1000 according to one or more embodiments of the present disclosure. FIG. 1B is a rear perspective view of the electronic device 1000 according to one or more embodiments of the present disclosure.

Referring to FIGS. 1A and 1B, an electronic device 1000 may be a device that is activated according to an electrical signal. For example, the electronic device 1000 may display an image and sense inputs applied from the outside. The external input may be a user's input. The user's input may include various types of external inputs, such as a portion of a user's body, a pen PN, light, heat, or a pressure.

The electronic device 1000 may include a first display panel DP1 and a second display panel DP2. The first display panel DP1 and the second display panel DP2 may be separate panels that are separated from each other. The first display panel DP1 may be referred to as a main display panel, and the second display panel DP2 may be referred to as an auxiliary display panel, or as an external display panel.

The first display panel DP1 may include a first display part DA1-F, and the second display panel DP2 may include a second display part DA2-F. A surface area of the second display panel DP2 may be less than that of the first display panel DP1. The surface area of the first display part DA1-F may be greater than that of the second display part DA2-F to correspond to a size of each of the first display panel DP1 and the second display panel DP2.

In a state in which the electronic device 1000 is unfolded, the first display part DA1-F may have a plane that is substantially parallel to a first direction DR1 and a second direction DR2. A thickness direction of the electronic device 1000 may be parallel to a third direction DR3 crossing the first direction DR1 and the second direction DR2. Thus, a front surface (or top surface) and a rear surface (or bottom surface) of each of members constituting the electronic device 1000 may be defined based on the third direction DR3.

The first display panel DP1 or the first display part DA1-F may include a folding area FA that is folded and unfolded, and a plurality of non-folding areas NFA1 and NFA2 that are spaced apart from each other with the folding area FA therebetween. The second display panel DP2 may overlap one of the plurality of non-folding areas NFA1 and/or NFA2. For example, the second display panel DP2 may overlap the first non-folding area NFA1.

The display direction of the first image IM1a displayed on a portion of the first display panel DP1, for example, in the second non-folding area NFA2, and a display direction of a second image IM2a displayed on the second display panel DP2, may be opposite to each other. For example, the first image IM1a may be displayed in the third direction DR3, and the second image IM2a may be displayed in a fourth direction DR4, which is opposite to the third direction DR3.

In one or more embodiments of the present disclosure, the folding area FA may be bent relative to a folding axis extending in a direction parallel to a long side of the electronic device 1000, for example, in a direction parallel to the second direction DR2. When the electronic device 1000 is folded, the folding area FA may have a curvature and curvature radius (e.g., predetermined curvature and curvature radius). The first non-folding area NFA1 and the second non-folding area NFA2 may face each other, and the electronic device 1000 may be inner-folded so that the first display part DA1-F is not exposed to the outside.

In one or more embodiments of the present disclosure, the electronic device 1000 may be outer-folded so that the first display part DA1-F is exposed to the outside. In one or more embodiments of the present disclosure, the electronic device 1000 may be capable of being both in-folded and out-folded from the unfolded state, but is not limited thereto.

In FIG. 1A, an example in which one folding area FA is defined in the electronic device 1000 is illustrated, but the present disclosure is not limited thereto. For example, an electronic device 1000 may define a plurality of folding axes and a plurality of folding areas corresponding thereto, and the electronic device 1000 may be in-folded, out-folded, or in the unfolded state at each of the folding areas.

According to one or more embodiments of the present disclosure, at least one of the first display panel DP1 or the second display panel DP2 may sense an input by the pen PN even if it does not include a digitizer. Thus, because the digitizer for sensing the pen PN is omitted, an increase in thickness, an increase in weight, and a decrease in flexibility of the electronic device 1000 due to the addition of the digitizer may be avoided. Thus, not only the first display panel DP1 but also the second display panel DP2 may be designed to sense the pen PN.

Figure 2:
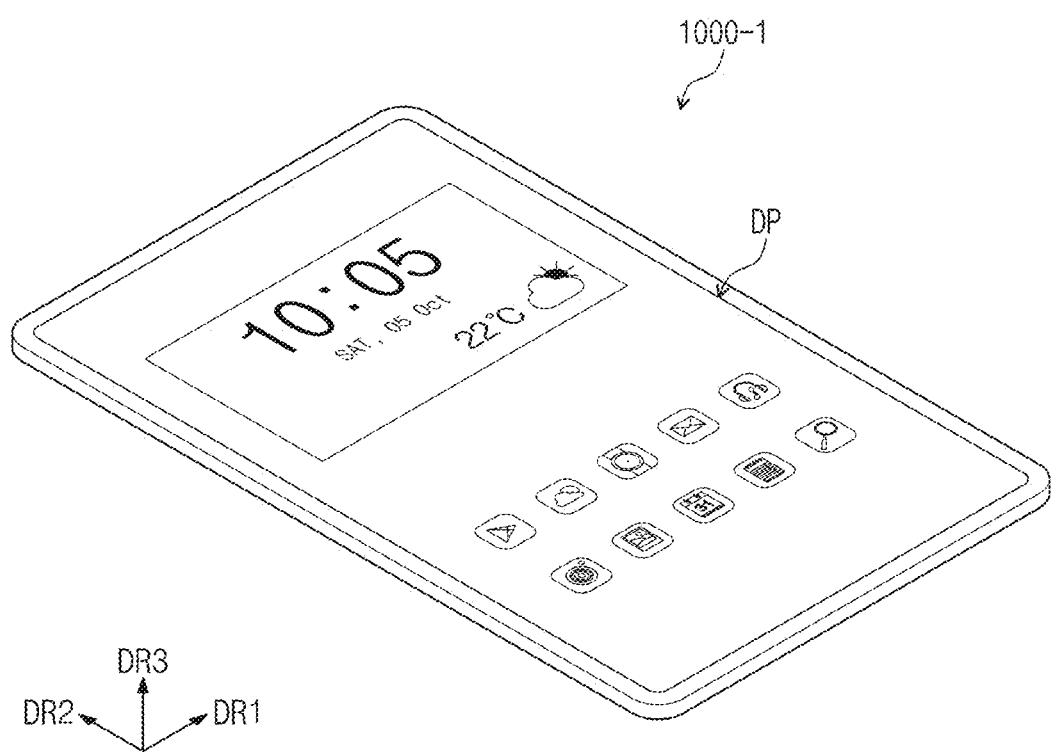
FIG. 2 is a perspective view of an electronic device according to one or more embodiments of the present disclosure.
Figure 3:
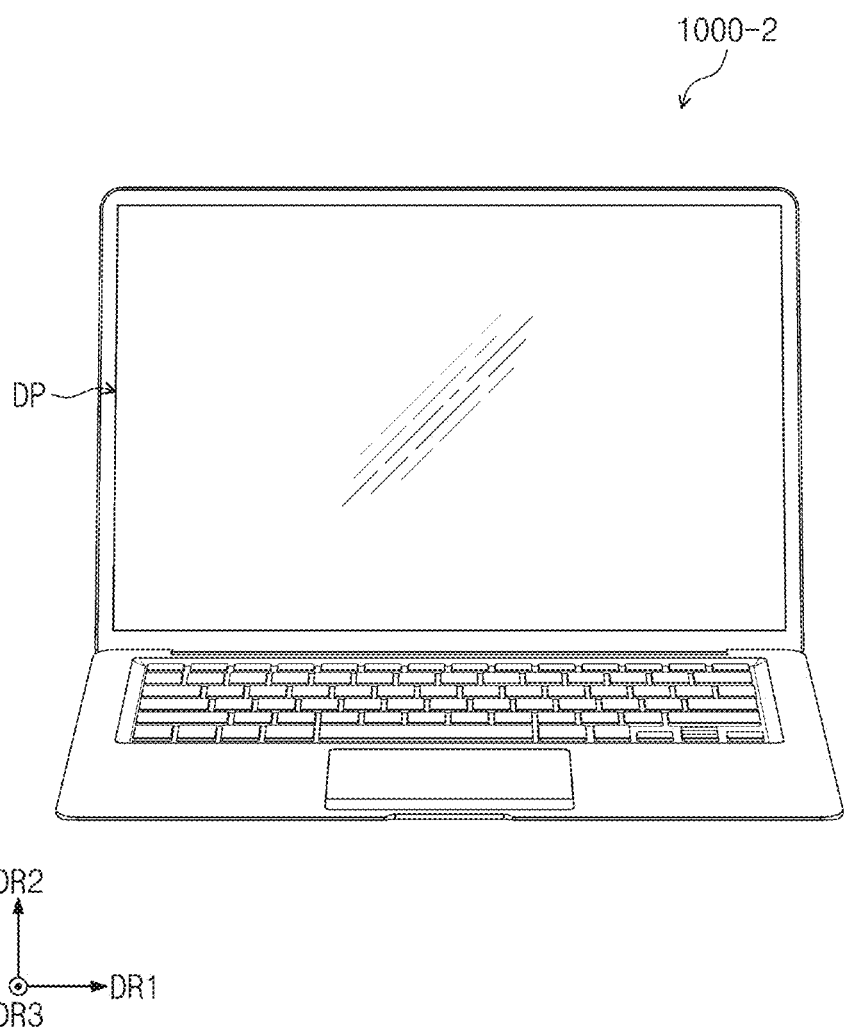
FIG. 3 is a perspective view of an electronic device according to one or more embodiments of the present disclosure.

FIG. 2 is a perspective view of an electronic device 1000-1 according to one or more embodiments of the present disclosure. FIG. 3 is a perspective view of an electronic device 1000-2 according to one or more embodiments of the present disclosure.

FIG. 2 illustrates an example in which the electronic device 1000-1 is a mobile phone, and the electronic device 1000-1 may include a display panel DP. FIG. 3 illustrates an example in which the electronic device 1000-2 is a laptop computer, and the electronic device 1000-2 may include a display panel DP. Although FIG. 3 is the perspective view of an electronic device 1000-2, the coordinate axes included in FIG. 3 are displayed based on the display panel DP within the electronic device 1000-2.

In one or more embodiments of the present disclosure, the display panel DP may sense inputs applied from the outside. The external input may be a user's input. The user's input may include various types of external inputs, such as a portion of a user's body, a pen PN (see FIG. 1A), light, heat, or a pressure.

According to one or more embodiments of the present disclosure, the display panel DP may sense an input by the pen PN even if it does not include the digitizer. Thus, because the digitizer for sensing the pen PN is omitted, an increase in thickness, weight, and a decrease in flexibility of the electronic device 1000-1 or 1000-2 due to the addition of the digitizer may not occur.

In FIG. 1A, a foldable-type electronic device 1000 may be illustrated as an example, and in FIG. 2, a bar-type electronic device 1000-1 may be illustrated as an example. However, the present disclosure to be described below is not limited thereto. For example, descriptions described below may be applied to various electronic devices, such as a rollable-type electronic device, a slidable-type electronic device, and a stretchable-type electronic device.

Figure 4:
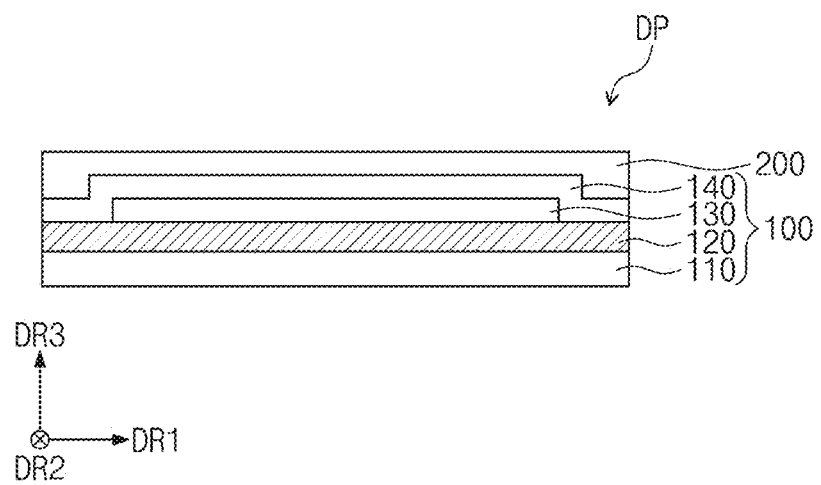
FIG. 4 is a schematic cross-sectional view of a display panel according to one or more embodiments of the present disclosure.

FIG. 4 is a schematic cross-sectional view of a display panel DP according to one or more embodiments of the present disclosure.

Referring to FIG. 4, the display panel DP may include a display layer 100 and a sensor layer 200.

The display layer 100 may be configured to substantially generate an image. The display layer 100 may be an emission-type display layer. For example, the display layer 100 may be an organic light-emitting display layer, an inorganic light-emitting display layer, an organic-organic light-emitting display layer, a quantum dot display layer, a micro LED display layer, or a nano LED display layer. The display layer 100 may include a base layer 110, a circuit layer 120, a light-emitting element layer 130, and an encapsulation layer 140.

The base layer 110 may be a member that provides a base surface on which a circuit layer 120 is located. The base layer 110 may have a single-layered structure or a multilayered structure. The base layer 110 may be a glass substrate, a metal substrate, a silicon substrate, or a polymer substrate, but the present disclosure is not particularly limited thereto.

The circuit layer 120 may be located on (e.g., "on" may mean "above," as used herein) the base layer 110. The circuit layer 120 may include an insulating layer, a semiconductor pattern, a conductive pattern, and a signal line. The insulating layer, the semiconductor layer, and the conductive layer may be formed on the base layer 110 in a manner, such as coating or vapor deposition, and then, the insulating layer, the semiconductor layer, and the conductive layer may be selectively patterned through a plurality of photolithography processes.

A light-emitting element layer 130 may be located on the circuit layer 120. The light-emitting element layer 130 may include a light-emitting element. For example, the light-emitting element layer 130 may include an organic light-emitting material, an inorganic light-emitting material, an organic-inorganic light-emitting material, a quantum dot, a quantum rod, a micro LED, or a nano LED.

An encapsulation layer 140 may be located on the light-emitting element layer 130. The encapsulation layer 140 may protect the light-emitting element layer 130 against moisture, oxygen, and foreign substances, such as dust particles.

The sensor layer 200 may be located on the display layer 100. The sensor layer 200 may sense an external input applied from the outside. The sensor layer 200 may be an integrated sensor formed continuously during the process of manufacturing the display layer 100, or the sensor layer 200 may be an external sensor attached to the display layer 100. The sensor layer 200 may be referred to as a sensor, an input-sensing layer, an input-sensing panel, or an electronic device for sensing input coordinates.

According to one or more embodiments of the present disclosure, the sensor layer 200 may sense both inputs from a passive type input unit, such as the user's body and an input device that generates magnetic fields having a resonance frequency (e.g., predetermined resonance frequency). The input device may be referred to as a pen, an input pen, a magnetic pen, a stylus pen, or an electromagnetic resonance pen.

Figure 5:
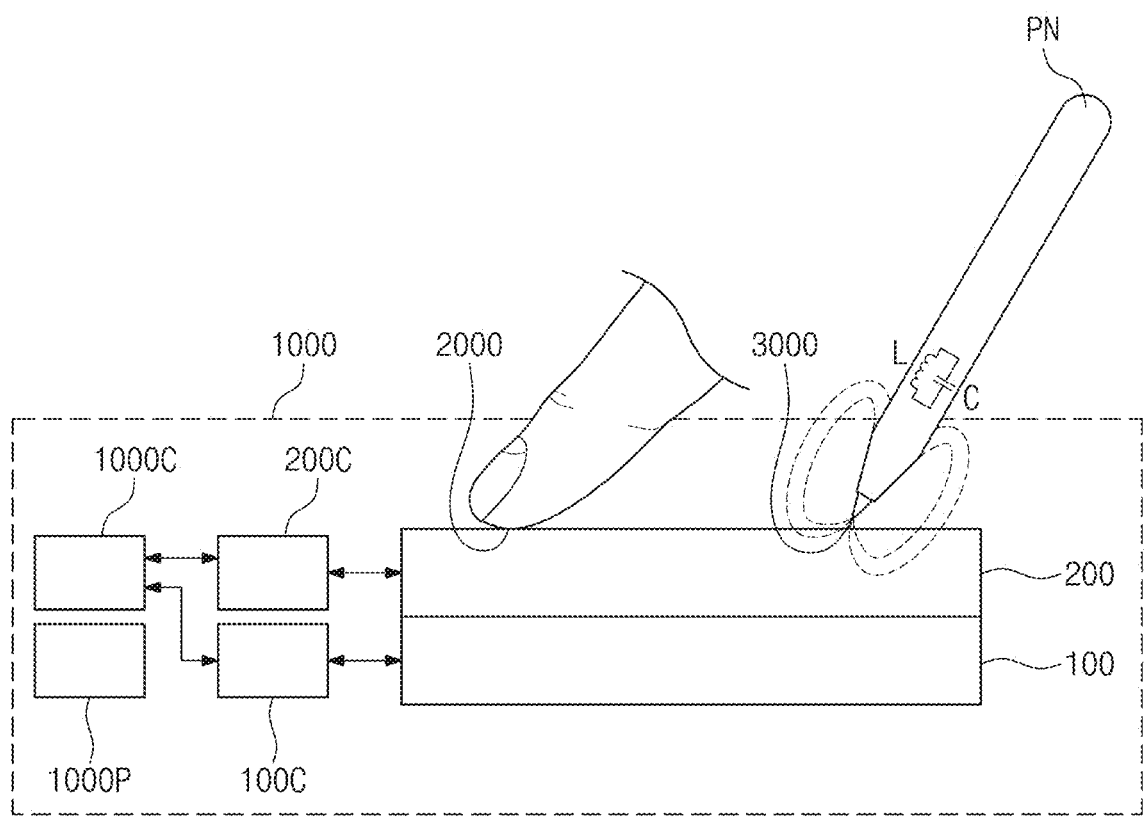
FIG. 5 is a view for explaining an operation of the electronic device according to one or more embodiments of the present disclosure.

FIG. 5 is a view for explaining an operation of the electronic device 1000 according to one or more embodiments of the present disclosure.

Referring to FIG. 5, the electronic device 1000 may include a display layer 100, a sensor layer 200, a display driver 100C (e.g., a first driver circuit), a sensor driver 200C (e.g., a second driver circuit), a main driver 1000C (e.g., a third driver circuit), and a power circuit 1000P.

The sensor layer 200 may sense a first input 2000 or a second input 3000 applied from the outside. Each of the first input 2000 and the second input 3000 may be an input unit capable of providing a change in capacitance of the sensor layer 200, or an input unit capable of causing induced current in the sensor layer 200. For example, the first input 2000 may be a passive input unit, such as the user's body. The second input 3000 may be an input using the pen PN or a radio-frequency integrated circuit (RFIC) tag. For example, the pen PN may be a passive type pen or an active type pen.

In one or more embodiments of the present disclosure, the pen PN may be a device that generates magnetic fields having a resonance frequency (e.g., predetermined resonance frequency). The pen PN may be configured to transmit an output signal based on electromagnetic resonance. The pen PN may be referred to as an input device, an input pen, a magnetic pen, a stylus pen, or an electromagnetic resonance pen.

The pen PN may include an RLC resonance circuit, and the RLC resonance circuit may include an inductor L and a capacitor C. In one or more embodiments of the present disclosure, the RLC resonance circuit may be a variable resonance circuit that varies in resonance frequency. In this case, the inductor L may be a variable inductor, and/or the capacitor C may be a variable capacitor, but neither is particularly limited thereto.

The inductor L may generate current by the magnetic fields generated in the electronic device 1000, for example, the sensor layer 200. However, the present disclosure is not particularly limited thereto. For example, if the pen PN operates as an active type, then the pen PN may generate current even if it does not receive magnetic fields from the outside. The generated current may be transferred to the capacitor C. The capacitor C may charge the current input from the inductor L, and may discharge the charged current to the inductor L. Thereafter, the inductor L may emit magnetic fields at the resonance frequency. The induced current may flow in the sensor layer 200 due to the magnetic fields emitted by the pen PN, and the induced current may be transmitted to the sensor driver 200C as a received signal (or a sensing signal, a signal, and the like).

The main driver 1000C may control an overall operation of the electronic device 1000. For example, the main driver 1000C may control operations of the display driver 100C and the sensor driver 200C. The main driver 1000C may include at least one microprocessor, and may further include a graphic controller. The main driver 1000C may be referred to as an application processor, a central processing unit, or a main processor.

The display driver 100C may control the display layer 100. The display driver 100C may receive image data and a control signal from the main driver 1000C. The control signal may include various signals. For example, the control signal may include an input vertical synchronization signal, an input horizontal synchronization signal, a main clock signal, and a data enable signal.

The sensor driver 200C may control the sensor layer 200. The sensor driver 200C may receive the control signal from the main driver 1000C. The control signal may include a clock signal of the sensor driver 200C. In addition, the control signal may further include a mode decision signal that determines a driving mode of the sensor driver 200C and the sensor layer 200.

The sensor driver 200C may be implemented as an integrated circuit (IC), and may be electrically connected to the sensor layer 200. For example, the sensor driver 200C may be mounted directly on an area (e.g., predetermined area) of the display panel, or may be mounted on a separate printed circuit board using a chip-on-film (COF) method, and may be electrically connected to the sensor layer 200.

The sensor driver 200C and the sensor layer 200 may selectively operate in a first mode or a second mode. For example, the first mode may be a mode for sensing a touch input, for example, the first input 2000. The second mode may be a mode for sensing a pen (PN) input, for example, the second input 3000. The first mode may be referred to as a touch-sensing mode, and the second mode may be referred to as a pen-sensing mode.

Switching between the first mode and the second mode may be accomplished in various manners. For example, the sensor driver 200C and the sensor layer 200 are time-division driven in the first mode and the second mode, and may sense the first input 2000 and the second input 3000. Alternatively, the switching between the first mode and the second mode may occur due to the user's selection or a corresponding action (or input) of the user, or one of the first mode and/or the second mode may be activated or deactivated by activating or deactivating a corresponding application, or may be switched from one to the other. Alternatively, if the first input 2000 is sensed while the sensor driver 200C and the sensor layer 200 are operating alternately in the first mode and the second mode, then the sensor driver 200C and the sensor layer 200 may be maintained in the first mode, and if the second input 3000 is sensed, then the sensor driver 200C and the sensor layer 200 may be maintained in the second mode.

The sensor driver 200C may calculate input coordinate information based on the signal received from the sensor layer 200, and may provide a coordinate signal with the input coordinate information to the main driver 1000C. The main driver 1000C may execute an operation corresponding to a user input based on the coordinate signal. For example, the main driver 1000C may operate the display driver 100C to display a new application image on the display layer 100.

The power circuit 1000P may include a power management integrated circuit (PMIC). The power circuit 1000P may generate a plurality of driving voltages for driving the display layer 100, the sensor layer 200, the display driver 100C, and the sensor driver 200C. For example, the plurality of driving voltages may include a gate high voltage, a gate low voltage, a first driving voltage (e.g., ELVSS voltage), a second driving voltage (e.g., ELVDD voltage), an initialization voltage, etc., but the present disclosure is not particularly limited thereto.

Figure 6A:
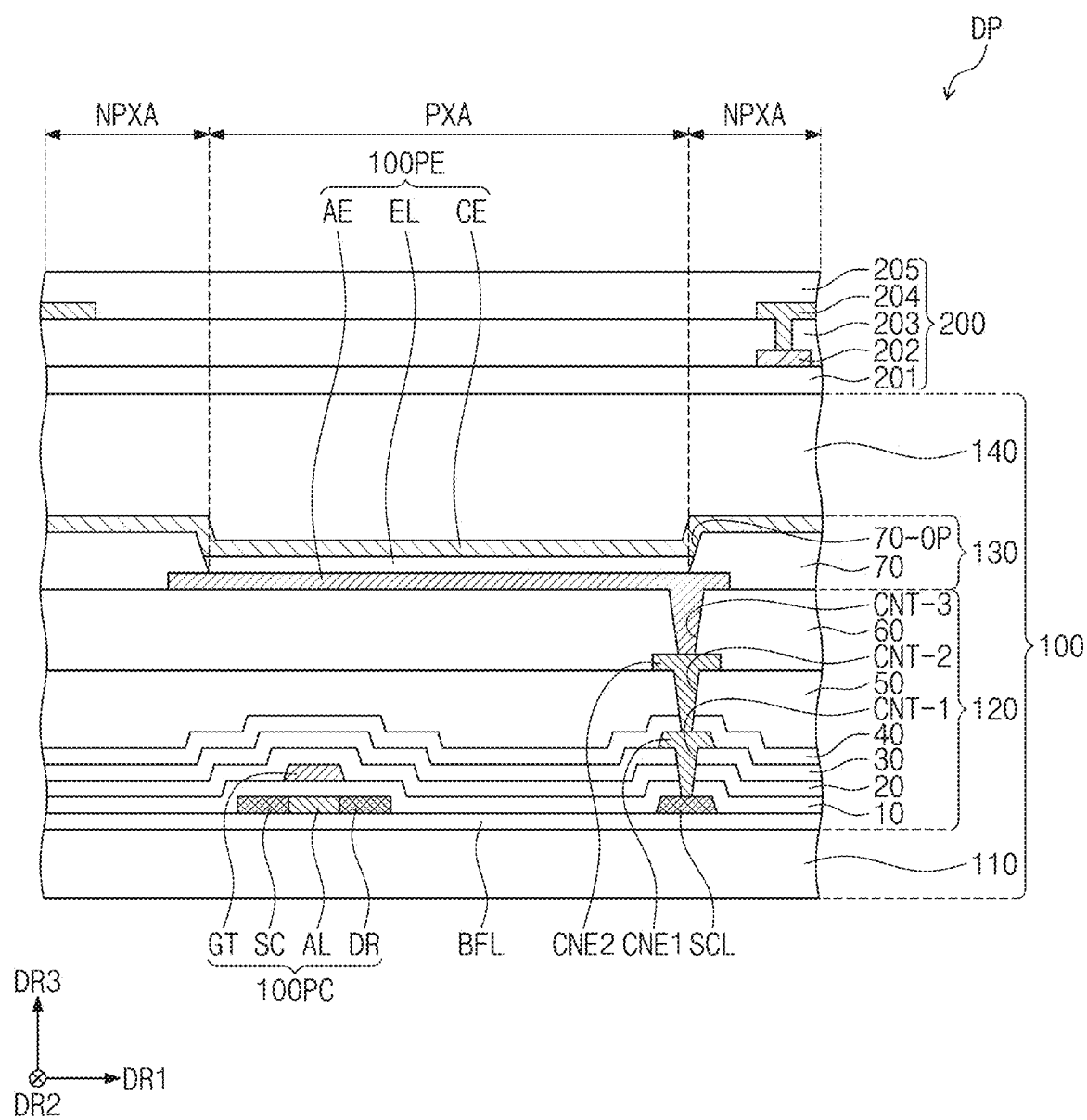
FIG. 6A is a cross-sectional view of the display panel according to one or more embodiments of the present disclosure.

FIG. 6A is a cross-sectional view of the display panel DP according to one or more embodiments of the present disclosure.

Referring to FIG. 6A, at least one buffer layer BFL may be located on a top surface of the base layer 110. The buffer layer BFL may improve bonding force between the base layer 110 and the semiconductor pattern. The buffer layer BFL may be provided as a multilayer. Alternatively, the display layer 100 may further include a barrier layer. The buffer layer BFL may include at least one of silicon oxide, silicon nitride, or silicon oxynitride. For example, the buffer layer BFL may include a structure in which the silicon oxide layer and the silicon nitride layer are alternately laminated.

Semiconductor patterns SC, AL, DR, and SCL may be located on the buffer layer BFL. Each of the semiconductor patterns SC, AL, DR, and SCL may include polysilicon. However, each of the semiconductor patterns SC, AL, DR, and SCL is not limited thereto, and may include amorphous silicon, low-temperature polycrystalline silicon, or an oxide semiconductor.

FIG. 6A illustrates only some semiconductor patterns SC, AL, DR, and SCL, and an additional semiconductor pattern may be further located in one or more other areas. The semiconductor patterns SC, AL, DR, and SCL may be arranged in corresponding arrangements over pixels. The semiconductor patterns SC, AL, DR, and SCL may have different electrical properties depending on whether the semiconductor patterns SC, AL, DR, and SCL are doped. The semiconductor patterns SC, AL, DR, and SCL may include first areas SC, DR, and SCL having high conductivity, and a second area AL having low conductivity. The first areas SC, DR, and SCL may be doped with an N-type dopant or a P-type dopant. A P-type transistor may include a doped region doped with the P-type dopant, and an N-type transistor may include a doped region doped with the N-type dopant. The second area AL may be a non-doped region, or may be doped at a concentration that is less than that of the first areas SC, DR, and SCL.

The conductivity of the first areas SC, DR, and SCL may be greater than that of the second area AL, and may substantially serve as an electrode or a signal line. The second area AL may substantially correspond to an active area AL (or channel) of the transistor 100PC. In other words, a portion AL of the semiconductor pattern SC, AL, DR, and SCL may be the active area AL of the transistor 100PC, and other portions SC and DR may respectively be a source area SC or a drain area DR of the transistor 100PC, and another portion SCL may be a connection electrode or a connection signal line SCL.

Each of the pixels may have an equivalent circuit including a plurality of transistors, at least one capacitor, and at least one light-emitting element. An equivalent circuit diagram of the pixel may be modified in various forms. In FIG. 6A, one transistor 100PC and one light-emitting element 100PE provided in the pixel are illustrated as an example.

The source area SC, the active area AL, and the drain area DR of the transistor 100PC may be formed from the semiconductor patterns SC, AL, DR, and SCL. The source area SC and the drain area DR may respectively extend in opposite directions from the active area AL on a cross-section. FIG. 6A illustrates a portion of the connection signal line SCL formed from the semiconductor patterns SC, AL, DR, and SCL. In one or more embodiments, the connection signal line SCL may be connected to the drain area DR of the transistor 100PC on the plane.

A first insulating layer 10 may be located on the buffer layer BFL. The first insulating layer 10 may commonly overlap a plurality of pixels, and may cover the semiconductor patterns SC, AL, DR, and SCL. The first insulating layer 10 may include an inorganic layer and/or an organic layer, and may have a single-layered or multilayered structure. The first insulating layer 10 may include at least one of aluminum oxide, titanium oxide, silicon oxide, silicon nitride, silicon oxynitride, zirconium oxide, or hafnium oxide. The first insulating layer 10 may include a single-layered silicon oxide layer. The insulating layer of the circuit layer 120, which will be described later, as well as the first insulating layer 10, may be an inorganic layer and/or an organic layer, and may have a single-layered or a multilayered structure. The inorganic layer may include at least one of the above-described materials, but is not limited thereto.

A gate GT of the transistor 100PC is located on the first insulating layer 10. The gate GT may be a portion of a metal pattern. The gate GT overlaps the active area AL. In the process of doping or reducing the semiconductor patterns SC, AL, DR, and SCL, the gate GT may function as a mask.

The second insulating layer 20 may be located on the first insulating layer 10 to cover the gate GT. A second insulating layer 20 may commonly overlap the pixels. The second insulating layer 20 may be an inorganic layer and/or an organic layer, and may have a single-layered or multilayered structure. The second insulating layer 20 may include at least one of silicon oxide, silicon nitride, or silicon oxynitride. The second insulating layer 20 may have a multilayer structure including a silicon oxide layer and a silicon nitride layer.

A third insulating layer 30 may be located on the second insulating layer 20. The third insulating layer 30 may have a single-layer structure or multilayer structure. For example, the third insulating layer 30 may have a multilayer structure including a silicon oxide layer and a silicon nitride layer.

A first connection electrode CNE1 may be located on the third insulating layer 30. The first connection electrode CNE1 may be connected to the connection signal line SCL through a contact hole CNT-1 passing through the first, second, and third insulating layers 10, 20, and 30.

A fourth insulating layer 40 may be located on the third insulating layer 30. The fourth insulating layer 40 may be a single-layered silicon oxide layer. A fifth insulating layer 50 may be located on the fourth insulating layer 40. The fifth insulating layer 50 may be an organic layer.

A second connection electrode CNE2 may be located on the fifth insulating layer 50. The second connection electrode CNE2 may be connected to the first connection electrode CNE1 through a contact hole CNT-2 passing through the fourth insulating layer 40 and the fifth insulating layer 50.

A sixth insulating layer 60 may be located on the fifth insulating layer 50 to cover the second connection electrode CNE2. The sixth insulating layer 60 may be an organic layer.

A light-emitting element layer 130 may be located on the circuit layer 120. The light-emitting element layer 130 may include a light-emitting element 100PE. For example, the light-emitting element layer 130 may include an organic light-emitting material, an inorganic light-emitting material, an organic-inorganic light-emitting material, a quantum dot, a quantum rod, a micro LED, or a nano LED. Hereinafter, the light-emitting element 100PE is described as an example of an organic light-emitting element, but the present disclosure is not particularly limited thereto.

The light-emitting element 100PE may include a first electrode AE, an emission layer EL, and a second electrode CE.

The first electrode AE may be located on the sixth insulating layer 60. The first electrode AE may be connected to the second connection electrode CNE2 through a contact hole CNT-3 passing through the sixth insulating layer 60.

A pixel-defining layer 70 may be located on the sixth insulating layer 60 to cover a portion of the first electrode AE. An opening 70-OP is defined in the pixel-defining layer 70. The opening 70-OP of the pixel-defining layer 70 exposes at least a portion of the first electrode AE.

The first display part DA1-F (see FIG. 1A) may include an emission area PXA, and a non-emission area NPXA adjacent to the emission area PXA. A non-emission area NPXA may surround the emission area PXA (e.g., in plan view). An emission area PXA may be defined to correspond to a portion of an area of the first electrode AE, which is exposed by the opening 70-OP.

The emission layer EL may be located on the first electrode AE. The emission layer EL may be located in an area corresponding to the opening 70-OP. FIG. 6A illustrates an example in which the emission layer EL is located within the opening 70-OP, but the present disclosure is not particularly limited thereto. For example, the emission layer EL may extend to cover some of the top surface of the pixel-defining layer 70 and the side surfaces of the pixel-defining layer 70 that define the opening 70-OP.

According to one or more embodiments of the present disclosure, the emission layer EL may be located separately for each of the pixels. When the emission layer EL is located separately for each of the pixels, each of the emission layers EL may emit light having at least one of blue, red, or green color. However, the present disclosure is not limited thereto. For example, the emission layer EL may be included in a plurality of pixels in common while having an integral shape. In this case, the emission layer EL may provide blue light or white light.

The second electrode CE may be located on the emission layer EL. The second electrode CE may be included in a plurality of pixels in common while having an integral shape.

In one or more embodiments of the present disclosure, a hole control layer may be located between the first electrode AE and the emission layer EL. The hole control layer may be commonly located in the emission area PXA and the non-emission area NPXA. The hole control layer may include a hole transport layer, and may further include a hole injection layer. An electron control layer may be located between the emission layer EL and the second electrode CE. The electron control layer may include an electron transport layer, and may further include an electron injection layer. The hole control layer and the electron control layer may be commonly provided in the pixels by using an open mask or inkjet process.

An encapsulation layer 140 may be located on the light-emitting element layer 130. The encapsulation layer 140 may include an inorganic layer, an organic layer, and another inorganic layer, which are sequentially laminated, but layers constituting the encapsulation layer 140 are not limited thereto. The inorganic layers may protect the light-emitting element layer 130 against moisture and oxygen, and the organic layer may protect the light-emitting element layer 130 against foreign substances, such as dust particles. The inorganic layers may include a silicon nitride layer, a silicon oxynitride layer, a silicon oxide layer, a titanium oxide layer, or an aluminum oxide layer. The organic layer may include an acrylic-based organic layer, but the present disclosure is not limited thereto.

The sensor layer 200 may include a base layer 201, a first conductive layer 202, an intermediate insulating layer 203, a second conductive layer 204, and a cover insulating layer 205.

The base layer 201 may be an inorganic layer containing at least one of silicon nitride, silicon oxynitride, or silicon oxide. Alternatively, the base layer 201 may be an organic layer including an epoxy resin, an acrylic resin, or an imide-based resin. The base layer 201 may have a single-layered structure or a multilayered structure in which a plurality of layers are laminated in the third direction DR3. In one or more embodiments of the present disclosure, the sensor layer 200 may omit the base layer 201.

Each of the first conductive layer 202 and the second conductive layer 204 may have a single-layered structure or a multilayered structure in which a plurality of layers are laminated in the third direction DR3.

In one or more embodiments, each of the first conductive layer 202 and the second conductive layer 204 has a single layer structure, and may include a metal layer or a transparent conductive layer. The metal layer may include molybdenum, silver, titanium, copper, aluminum, or an alloy thereof. The transparent conductive layer may include transparent conductive oxide, such as indium tin oxide (ITO), indium zinc oxide (IZO), zinc oxide (ZnO), or indium zinc tin oxide (IZTO). In addition, the transparent conductive layer may include conductive polymers, such as poly(3,4-ethylenedioxythiophene) (PEDOT), metal nanowires, graphene, and the like.

In one or more embodiments, each of the first conductive layer 202 and the second conductive layer 204 has a multi-layered structure, and may include a metal layer. The metal layers may have a three-layered structure of titanium/aluminum/titanium. The conductive layer having the multilayered structure may include at least one metal layer and at least one transparent conductive layer.

In one or more embodiments of the present disclosure, a thickness of the first conductive layer 202 may be equal to or greater than that of the second conductive layer 204. When the thickness of the first conductive layer 202 is greater than that of the second conductive layer 204, components (e.g., electrodes, sensing patterns, or bridge patterns, etc.) included in the first conductive layer 202 may be reduced in resistance. In addition, because the first conductive layer 202 is located below the second conductive layer 204, even if the thickness of the first conductive layer 202 increases, a probability of visible recognition of the components may be lower than that of the second conductive layer 204.

At least one of the intermediate insulating layer 203 or the cover insulating layer 205 may include an inorganic layer. The inorganic layer may include at least one of aluminum oxide, titanium oxide, silicon oxide, silicon nitride, silicon oxynitride, zirconium oxide, or hafnium oxide.

At least one of the intermediate insulating layer 203 or the cover insulating layer 205 may include an organic layer. The organic layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, or a perylene-based resin.

Previously, it is described as an example that the sensor layer 200 includes the first conductive layer 202 and the second conductive layer 204, that is, a total of two conductive layers, but it is not particularly limited thereto. For example, the sensor layer 200 may include three or more conductive layers.

Figure 6B:
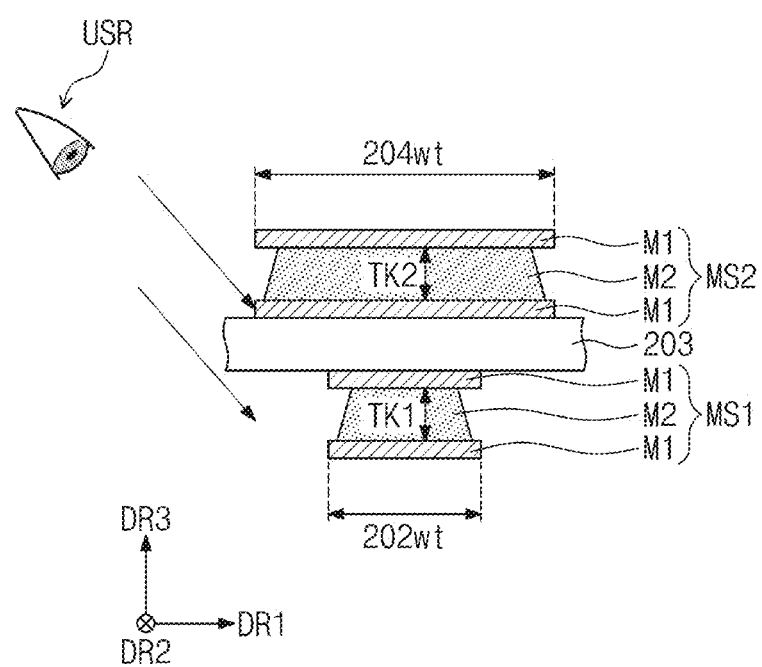
FIG. 6B is a cross-sectional view of a sensor layer according to one or more embodiments of the present disclosure.

FIG. 6B is a cross-sectional view of the sensor layer 200 according to one or more embodiments of the present disclosure.

Referring to FIGS. 6A and 6B, a second width 204wt of a second mesh line MS2 included in the second conductive layer 204 may be equal to or greater than a first width 202wt of a first mesh line MS1 included in the first conductive layer 202. When a user USR views the first mesh line MS1 and the second mesh line MS2 from the side, because the first mesh line MS1 has the width that is less than that of the second mesh line MS2, a probability at which the first mesh line MS1 is visibly recognized by the user USR may be reduced.

Each of the first mesh line MS1 and the second mesh line MS2 may include first metal layers M1 and a second metal layer M2 located between the first metal layers M1. For example, each of the first metal layers M1 may include titanium (Ti), and the second metal layers M2 may include aluminum (Al). However, this is only an example, and the present disclosure is not particularly limited thereto.

In one or more embodiments of the present disclosure, a first thickness TK1 of the second metal layer M2 of the first mesh line MS1, and a second thickness TK2 of the second metal layer M2 of the second mesh line MS2, may be substantially the same, but the present disclosure is not particularly limited thereto. For example, the first thickness TK1 may be greater than the second thickness TK2. Alternatively, the second thickness TK2 may be greater than the first thickness TK1. In one or more embodiments of the present disclosure, each of the first thickness TK1 and the second thickness TK2 may be about 1,000 angstroms or more, for example, about 6,000 angstroms.

Figure 7:
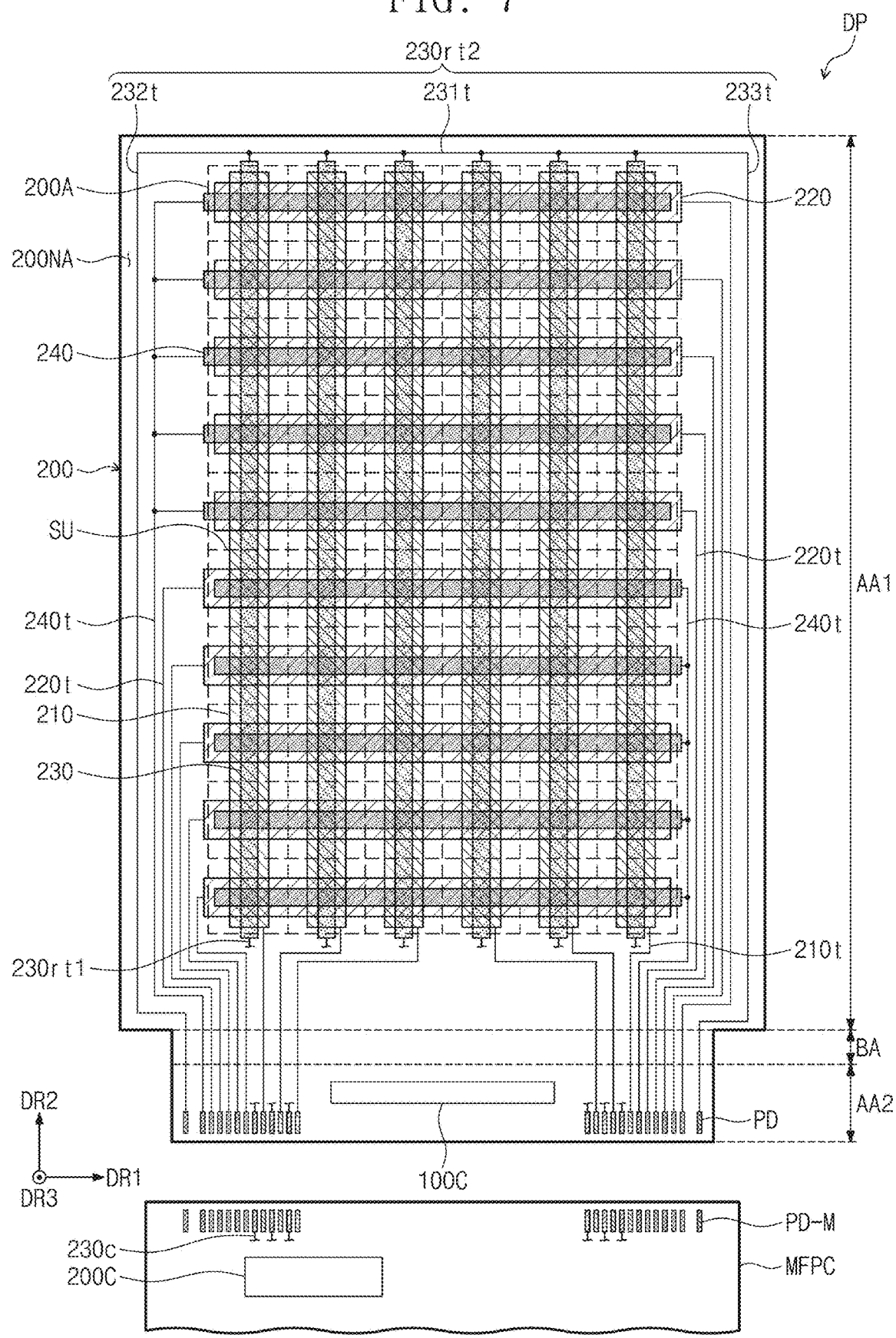
FIG. 7 is a plan view of a display panel and a circuit board according to one or more embodiments of the present disclosure.

FIG. 7 is a plan view of a display panel DP and a circuit board MFPC according to one or more embodiments of the present disclosure.

Referring to FIG. 7, the display panel DP may include a first area AA1, a bending area BA, and a second area AA2. The bending area BA may be located between the first area AA1 and the second area AA2, which are spaced apart from each other in the second direction DR2. Each of the bending area BA and the second area AA2, which extend to be parallel to the first direction DR1, may have a width (or length) that is less than the width of the first area AA1 in the first direction DR1. An area having a short length in a direction of a bending axis may be bent more easily.

The display panel DP illustrated in FIG. 7 is a plan view of the display panel DP in an unfolded state before being assembled with other components, that is, before being modularized. A portion of the display panel DP may be bent and modularized. For example, the bending area BA may be bent so that the second area AA2 is located below the first area AA1 (e.g., in the third direction DR3).

The display driver 100C may be mounted on the second area AA2 of the display panel DP. The display driver 100C may be referred to as a first driving chip. The display driver 100C may include driving elements for driving pixels included in the display layer 100 (see FIG. 5) of the display panel DP, for example, a data driving circuit.

The circuit board MFPC may be coupled to the second area AA2 of the display panel DP. The circuit board MFPC may be electrically connected to pads PD of the display panel DP through an anisotropic conductive adhesive layer. However, one or more embodiments of the present disclosure is not particularly limited thereto. For example, pads PD-M of the circuit board MFPC may be directly coupled to the pads PD of the display panel DP. The circuit board MFPC may be referred to as a flexible circuit board, a flexible circuit film, a multilayer flexible substrate, or a multilayer flexible film.

The sensor driver 200C may be mounted on the circuit board MFPC. The sensor driver 200C may be referred to as a second driver chip. Although FIG. 7 illustrates a structure in which the display driver 100C is mounted on the display panel DP, and in which the sensor driver 200C is mounted on the circuit board MFPC, the present disclosure is not limited thereto. For example, the display driver 100C may also be mounted on the circuit board MFPC.

The display panel DP includes a sensor layer 200. A sensing area 200A, and a peripheral area 200NA adjacent to the sensing area 200A, may be defined on the sensor layer 200. The first area AA1 may overlap some of the sensing area 200A and the peripheral area 200NA. The bending area BA and the second area AA2 may overlap the other portion of the peripheral area 200NA.

The sensor layer 200 may include a plurality of first electrodes 210, a plurality of second electrodes 220, a plurality of third electrodes 230, and a plurality of fourth electrodes 240, which are located in the first area AA1 and the sensing area 200A.

Each of the first electrodes 210 may cross the second electrodes 220. Each of the first electrodes 210 may extend in the second direction DR2, and the first electrodes 210 may be arranged to be spaced apart from each other in the first direction DR1. Each of the second electrodes 220 may extend in the first direction DR1, and the second electrodes 220 may be arranged to be spaced apart from each other in the second direction DR2. The sensing unit SU of the sensor layer 200 may be an area in which one first electrode 210 and one second electrode 220 cross each other.

In FIG. 7, six first electrodes 210, and ten second electrodes 220 may be illustrated as an example, and sixty sensing units SU may be illustrated as an example. However, the numbers of the first electrodes 210 and the second electrodes 220 are not limited thereto.

Each of the third electrodes 230 may extend in the second direction DR2, and the third electrodes 230 may be arranged to be spaced apart from each other in the first direction DR1. One third electrode 230 may at least partially overlap one first electrode 210. According to one or more embodiments of the present disclosure, an overlapping area between one first electrode 210 and one third electrode 230 may be adjusted to adjust capacitance (or coupling capacitance) between one first electrode 210 and one third electrode 230. The third electrodes 230 may also be referred to as loop electrodes.

The fourth electrodes 240 may be arranged along the second direction DR2, and the fourth electrodes 240 may extend along the first direction DR1. One fourth electrode 240 may at least partially overlap one second electrode 220. According to one or more embodiments of the present disclosure, an overlapping area between one second electrode 220 and one fourth electrode 240 may be adjusted to adjust capacitance (or coupling capacitance) between one second electrode 220 and one fourth electrode 240.

In one or more embodiments of the present disclosure, at least some of the fourth electrodes 240 may be electrically connected to each other to form one electrode group. For example, in FIG. 7, five of the fourth electrodes 240 may be connected to the same single trace line, for example, an auxiliary trace line 240t, to form one electrode group. Thus, in FIG. 7, two electrode groups are illustrated to be arranged along the second direction DR2. However, the number of fourth electrodes 240 constituting one electrode group is not limited thereto. For example, the number of fourth electrodes 240 constituting one electrode group may be 10, and in this case, the sensor layer 200 may include one electrode group.

The sensor layer 200 may further include a plurality of first trace lines 210t and a plurality of second trace lines 220t, which are located in the peripheral area 200NA. The first trace lines 210t may one-to-one correspond to and be electrically connected to the first electrodes 210. The second trace lines 220t may be in one-to-one correspondence to, and may be electrically connected to, the second electrodes 220.

The sensor layer 200 may further include a plurality of first loop trace lines 230rt1, a second loop trace line 230rt2, and a plurality of auxiliary trace lines 240t, which are located in the peripheral area 200NA.

The first loop trace lines 230rt1 may be connected to one-to-one correspond to the third electrodes 230. That is, the number of first loop trace lines 230rt1 may correspond to the number of third electrodes 230. In FIG. 7, six first loop trace lines 230rt1 and six third electrodes 230 are illustrated as examples.

In one or more other embodiments of the present disclosure, one first loop trace line may be electrically connected to a plurality of third electrodes. The plurality of third electrodes connected to one first loop trace line may be referred to as one electrode group. In this case, as the number of third electrodes, which are connected in parallel, included in one electrode group increases, resistance of one electrode group may be lowered to improve power efficiency and sensing sensitivity. Conversely, as the number of third electrodes included in one electrode group decreases, a loop coil pattern formed using one electrode group may be implemented in more diverse forms.

The second loop trace line 230rt2 may be electrically connected to the third electrodes 230. In one or more embodiments of the present disclosure, the second loop trace line 230rt2 may be electrically connected to all of the third electrodes 230. The second loop trace line 230rt2 may include a first line portion 231t extending in the first direction DR1 and electrically connected to the third electrodes 230, a second line portion 232t extending from a first end of the first line portion 231t in the second direction DR2, and a third line portion 233t extending from a second end of the first line portion 231t in the second direction DR2.

It should be noted that the third electrodes 230, the first loop trace lines 230rt1, and the second line portion 232t, and the third line portion 233t of the second loop trace line 230rt2 may each have first, second, and/or third electrode portions. For example, each of electrodes or lines described herein may have a first electrode portion in the first area AA1, a second electrode portion in the bending area BA, and a third electrode portion in the second area AA2.

First portions of the first loop trace lines 230rt1, a first portion of the second line portion 232t, a first portion of the third line portion 233t, and each of the third electrodes 230 are disposed in the first area AA1 and may correspond to the first electrode portions, respectively. Second portions of the first loop trace lines 230rt1, a second portion of the second line portion 232t, and a second portion of the third line portion 233t are disposed in the bending area BA and may correspond to the second electrode portions, respectively. Third portions of the first loop trace lines 230rt1, a third portion of the second line portion 232t, and a third portion of the third line portion 233t are disposed in the second area AA2 and may correspond to the third electrode portions, respectively. In one or more embodiments of the present disclosure, each of resistance of the second line portion 232t and resistance of the third line portion 233t may be substantially equal to that of one of the third electrodes 230. Thus, there may be an effect in which the second line portion 232t and the third line portion 233t effectively serve as third electrodes 230 located in the peripheral area 200NA. For example, one of the second line portion 232t or the third line portion 233t and one of the third electrodes 230 may form a coil. Thus, a pen located on an area adjacent to the peripheral area 200NA may also be sufficiently charged by a loop including the second line portion 232t or the third line portion 233t.

In one or more embodiments of the present disclosure, to adjust the resistance of the second line portion 232t and the resistance of the third line portion 233t, a width of each of the second line portion 232t and the third line portion 233t in the first direction DR1 may be adjusted. However, this is only an example, and the first, second, and third line portions 231t, 232t, and 233t may have substantially the same width.

The auxiliary trace lines 240t may be spaced apart from each other with the sensing area 200A therebetween. FIG. 7 illustrates an example in which two electrode groups are arranged. The auxiliary trace line 240t connected to five fourth electrodes 240 located at an upper side, and the auxiliary trace line 240t connected to five fourth electrodes 240 located at a lower side, may be spaced apart from each other with the sensing area 200A therebetween. However, the present disclosure is not particularly limited thereto.

According to one or more embodiments of the present disclosure, at least a portion of each of the first trace lines 210t, the second trace lines 220t, the first loop trace lines 230rt1, the second loop trace line 230rt2, and the plurality of auxiliary trace lines 240t may have a multi-layer structure. For example, portions, which extend in the second direction DR2, of the first trace lines 210t, the second trace lines 220t, the first loop trace lines 230rt1, the second loop trace line 230rt2, and the plurality of auxiliary trace lines 240t may have a multi-layer structure. For example, the portions may be located in the bending area BA and the second area AA2. Each of the portions may include a first line portion included in the first conductive layer 202 (see FIG. 6A), and a second line portion included in the second conductive layer 204 (see FIG. 6A).

Figure 8A:
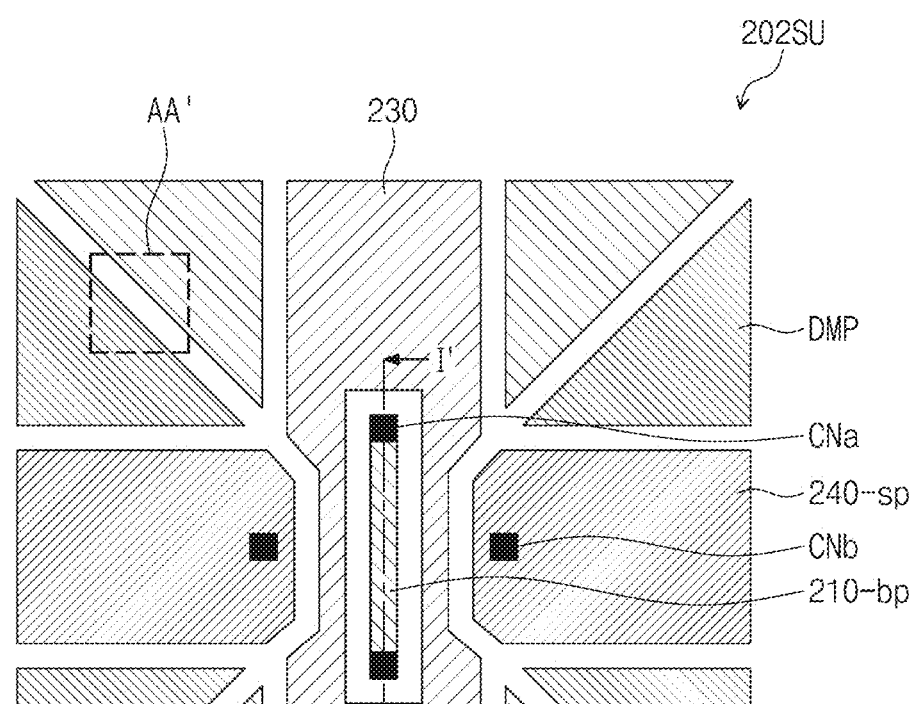
FIG. 8A is a plan view illustrating a first conductive layer of a sensing unit according to one or more embodiments of the present disclosure.
Figure 8B:
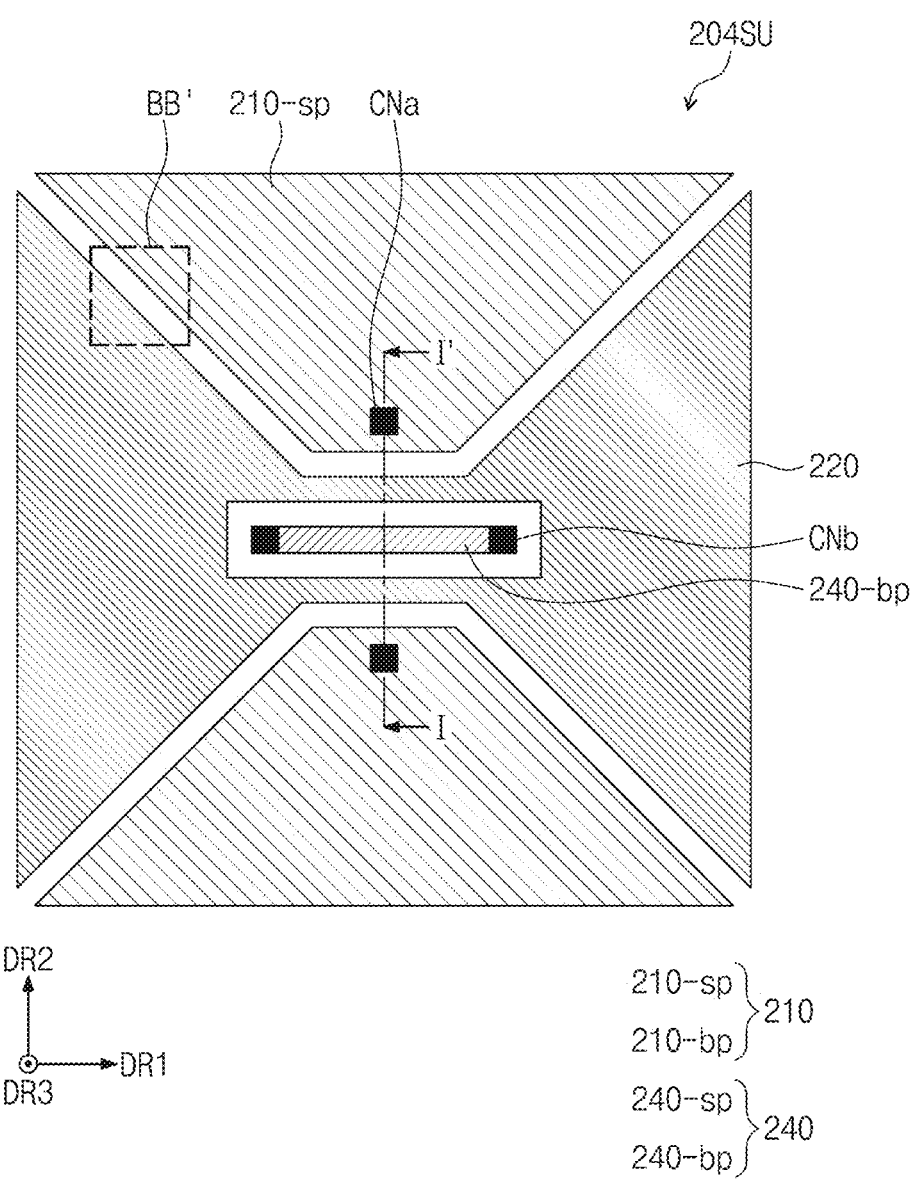
FIG. 8B is a plan view illustrating a second conductive layer of the sensing unit according to one or more embodiments of the present disclosure.
Figure 9:
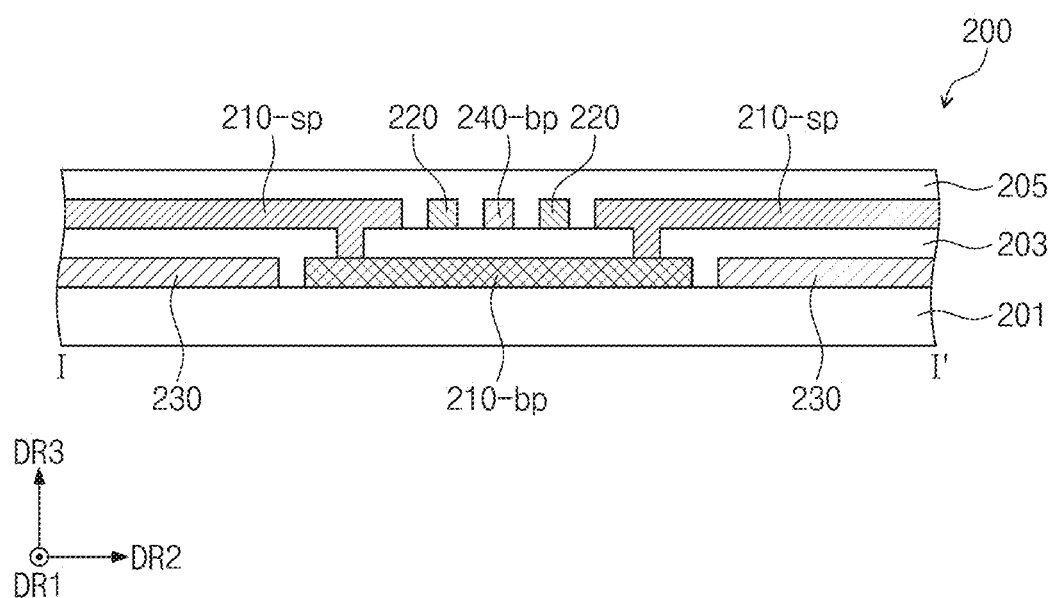
FIG. 9 is a cross-sectional view of a sensor layer, taken along the line I-I' of FIGS. 8A and 8B according to one or more embodiments of the present disclosure.

FIG. 8A is a plan view illustrating a first conductive layer 202SU of a sensing unit according to one or more embodiments of the present disclosure. FIG. 8B is a plan view illustrating a second conductive layer 204SU of the sensing unit according to one or more embodiments of the present disclosure. FIG. 9 is a cross-sectional view of the sensor layer 200, taken along the line I-I' of FIGS. 8A and 8B according to one or more embodiments of the present disclosure.

A shape of the sensing unit SU described with reference to FIGS. 8A and 8B is only an example, and the shape of the sensing unit SU is not limited thereto.

Referring to FIGS. 8A, 8B, and 9, the first electrode 210 may include first sensing patterns 210-sp and a first bridge pattern 210-bp. The first sensing patterns 210-sp and the first bridge pattern 210-bp may be electrically connected to each other through a first contact CNa. The second electrode 220 may be located on the same layer as the first sensing patterns 210-sp. For example, the first sensing patterns 210-sp may be spaced apart from each other with the second electrode 220 therebetween. The first bridge pattern 210-bp may be located on a different layer from the second electrode 220, and may be insulated from, and may cross, the second electrode 220.

The third electrode 230 may be located on the same layer as the first bridge pattern 210-bp. An opening surrounding the first bridge pattern 210-bp may be defined in the third electrode 230. The third electrode 230 may overlap the first sensing patterns 210-sp. Thus, a coupling capacitor may be defined between the first electrode 210 and the third electrode 230.

The fourth electrode 240 may include second sensing patterns 240-sp and a second bridge pattern 240-bp. The second sensing patterns 240-sp and the second bridge pattern 240-bp may be electrically connected to each other through a second contact CNb. The third electrode 230 may be located on the same layer as the second sensing patterns 240-sp. For example, the second sensing patterns 240-sp may be spaced apart from each other with the third electrode 230 therebetween. The second bridge pattern 240-bp is located on a different layer from the third electrode 230, and may be insulated from, and may cross, the third electrode 230.

In one or more embodiments of the present disclosure, the first conductive layer 202SU may include the first bridge pattern 210-bp, the third electrode 230, and the second sensing patterns 240-sp. The second conductive layer 204SU may include first sensing patterns 210-sp, a second electrode 220, and a second bridge pattern 240-bp.

In one or more embodiments of the present disclosure, the first conductive layer 202SU may further include dummy patterns DMP. Because the dummy patterns DMP are located in an empty space, a probability of visible recognition of corresponding patterns due to reflection of external light may be reduced. In other words, the electronic device 1000 (see FIG. 1A) having improved visibility due to the reflection of the external light may be provided. Each of the dummy patterns DMP may be electrically floated or electrically grounded. In one or more embodiments of the present disclosure, the dummy patterns DMP may be omitted.

Referring to FIGS. 8A and 8B, an area occupied by the components included in the first electrode 210 and the second electrode 220 in the second conductive layer 204SU within one sensing unit SU may be greater than that occupied by the components included in the third electrode 230 and the fourth electrode 240. A change in capacitance due to the first input 2000 (see FIG. 5) may increase as a distance becomes shorter. Thus, components for sensing the first input 2000 (see FIG. 5) may be located within a relatively larger area on a layer adjacent to a surface of the electronic device 1000 (see FIG. 1A). As a result, touch performance may be improved.

Previously, FIGS. 6A to 9 illustrate a structure in which the first to fourth electrodes 210, 220, 230, and 240 are respectively located in two conductive layers 202SU and 204SU, but the present disclosure is not particularly limited thereto. For example, the first to fourth electrodes 210, 220, 230, and 240 may be divided into three or four conductive layers.

In one or more embodiments of the present disclosure, the third electrode 230, to which a signal is applied in a charging-driving mode, may be included in the third conductive layer located below the first and second conductive layers 202SU and 204SU. For example, the third conductive layer may be provided below a base layer 201. The third conductive layer may be located between the base layer 201 and the display layer 100, may be located under the display layer 100, or may be included in the display layer 100.

The first, second, and fourth electrodes 210, 220, and 240 may be included in the first and second conductive layers 202SU and 204SU. For example, if the third electrode 230 is implemented as a separate conductive layer, such as the third conductive layer, then the shape of the third electrode 230 may be designed more freely. For example, the third electrode 230 may be provided in a form including a plurality of coils. In addition, the third electrode 230 may be provided more densely by using the third conductive layer, and in this case, pen-sensing sensitivity may be improved. In one or more other embodiments of the present disclosure, the third conductive layer may include a fourth electrode 240 instead of the third electrode 230.

Figure 10A:
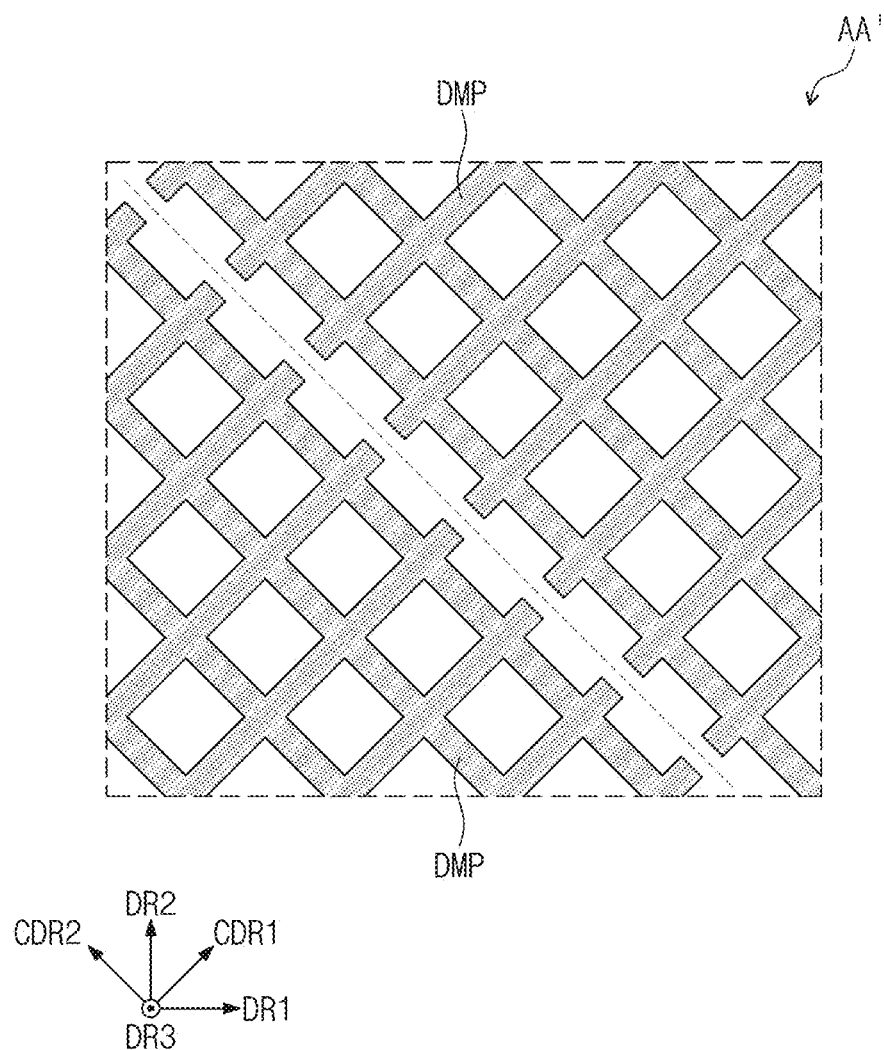
FIG. 10A is an enlarged plan view of an area AA' of FIG. 8A.
Figure 10B:
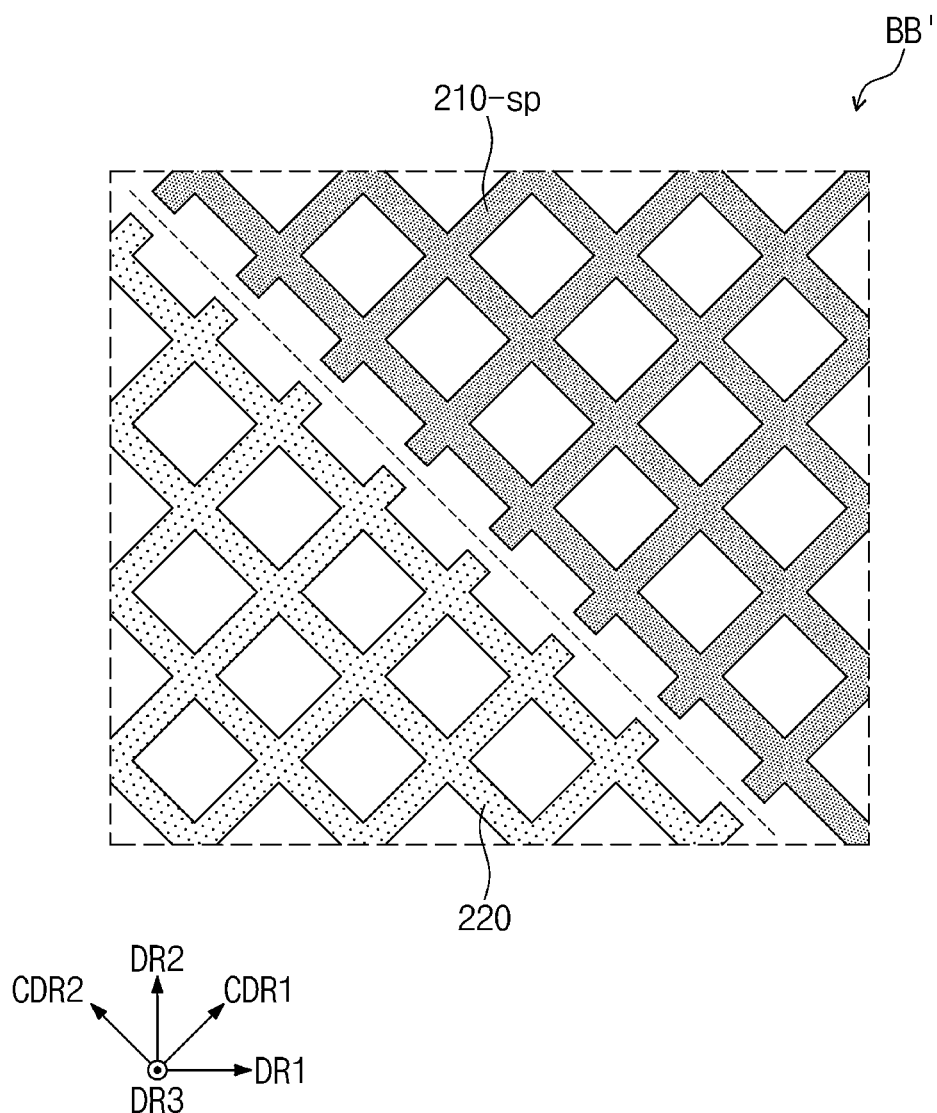
FIG. 10B is an enlarged plan view of an area BB' of FIG. 8B.

FIG. 10A is an enlarged plan view of an area AA' of FIG. 8A. FIG. 10B is an enlarged plan view of an area BB' of FIG. 8B.

Referring to FIGS. 8A, 8B, 10A, and 10B, each of first electrodes 210, second electrodes 220, third electrodes 230, fourth electrodes 240, and dummy patterns DMP may have a mesh structure. Each of the mesh structures may include a plurality of mesh lines. Each of the plurality of mesh lines may have a shape extending in a direction (e.g., predetermined direction), and the plurality of mesh lines may be connected to each other. The mesh line may have various shapes, such as a straight line, a line with protrusions, or an uneven line. Openings in which the mesh structure are not provided may be defined (e.g., provided or formed) in each of the first electrodes 210, the second electrodes 220, the third electrodes 230, the fourth electrodes 240, and the dummy patterns DMP.

FIGS. 10A and 10B illustrate an example in which the mesh structure includes mesh lines extending in a first crossing direction CDR1, which crosses the first direction DR1 and the second direction DR2, and mesh lines extending in a second crossing direction CDR2, which crosses the first crossing direction CDR1. However, the extension direction of the mesh lines constituting the mesh structure is not particularly limited to that illustrated in FIGS. 10A and 10B. For example, the mesh structure may include only mesh lines extending in the first direction DR1 and the second direction DR2, or may include mesh lines extending in the first direction DR1, the second direction DR2, the first crossing direction CDR1, and the second crossing direction CDR2. That is, the mesh structure may be changed into various forms.

Figure 11:
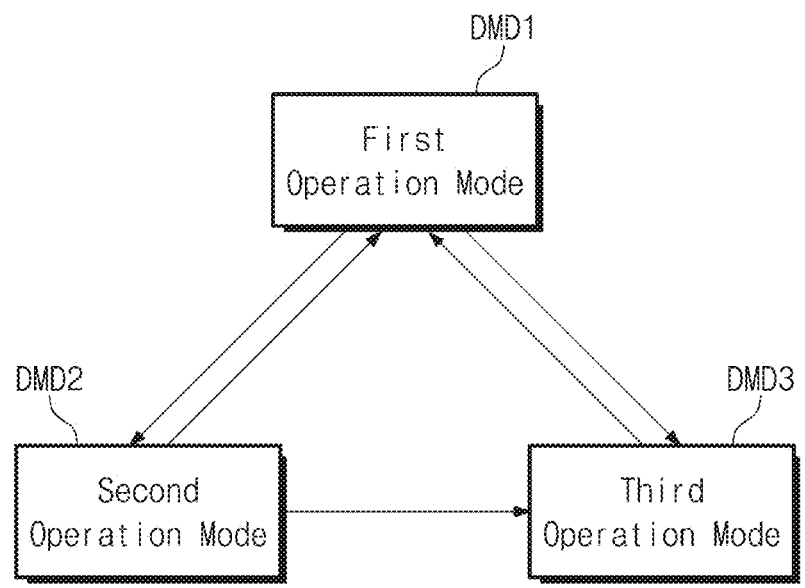
FIG. 11 is a view illustrating an operation of a sensor driver according to one or more embodiments of the present disclosure.

FIG. 11 is a view illustrating an operation of the sensor driver according to one or more embodiments of the present disclosure.

Referring to FIGS. 5 and 11, the sensor driver 200C may be configured to be selectively driven in one of a first operation mode DMD1, a second operation mode DMD2, and/or a third operation mode DMD3.

The first operation mode DMD1 may be referred to as a touch-and-pen-standby mode, the second operation mode DMD2 may be referred to as a touch-activation-and-pen-standby mode, and the third operation mode DMD3 may be referred to as a pen activation mode. The first operation mode DMD1 may be a mode that waits for a first input 2000 and a second input 3000. The second operation mode DMD2 may be a mode that senses the first input 2000 and waits for the second input 3000. The third operation mode DMD3 may be a mode for sensing the second input 3000.

In one or more embodiments of the present disclosure, the sensor driver 200C may be driven first in the first operation mode DMD1. When the first input 2000 is sensed in the first operation mode DMD1, the sensor driver 200C may be switched (or changed) to the second operation mode DMD2. Alternatively, if the second input 3000 is sensed in the first operation mode DMD1, then the sensor driver 200C may be switched (or changed) to the third operation mode DMD3.

In one or more embodiments of the present disclosure, if the second input 3000 is sensed in the second operation mode DMD2, then the sensor driver 200C may be switched to the third operation mode DMD3. When the first input 2000 is released (or no longer detected) in the second operation mode DMD2, the sensor driver 200C may be switched to the first operation mode DMD1. When the second input 3000 is released (or no longer sensed) in the third operation mode DMD3, the sensor driver 200C may be switched to the first operation mode DMD1.

Figure 12:
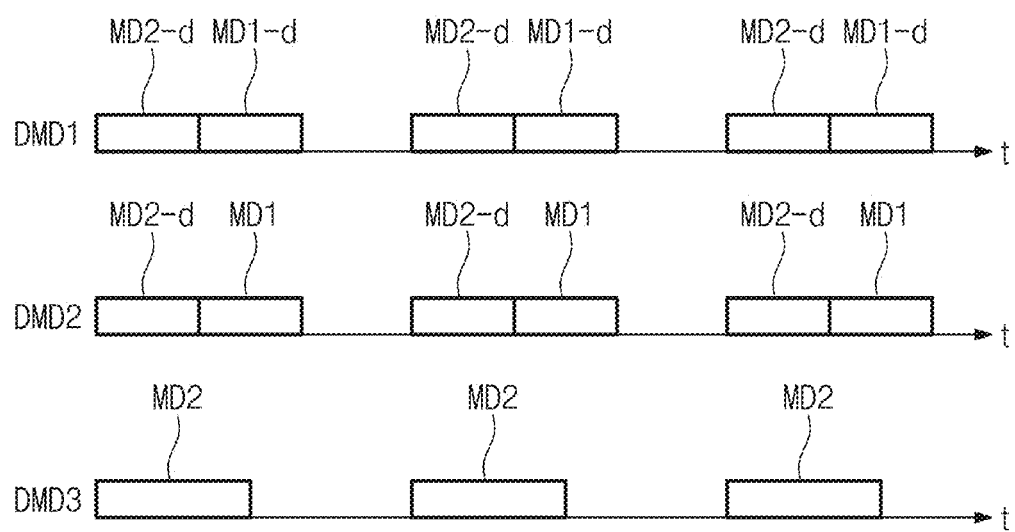
FIG. 12 is a view illustrating an operation of a sensor driver according to one or more embodiments of the present disclosure.

FIG. 12 is a view illustrating an operation of a sensor driver according to one or more embodiments of the present disclosure.

Referring to FIGS. 5, 11, and 12, operations in the first, second, and third operation modes DMD1, DMD2, and DMD3 are illustrated in order of time (t).

In the first operation mode DMD1, the sensor driver 200C may be repeatedly driven in a second mode MD2-*d* and a first mode MD1-*d*. During the second mode MD2-*d*, the sensor layer 200 may be scan-driven to detect the second input 3000. During the first mode MD1-*d*, the sensor layer 200 may be scan-driven to detect the first input 2000. FIG. 12 illustrates an example in which the sensor driver 200C operates in the first mode MD1-*d* continuously (e.g., immediately) after the second mode MD2-*d*, but the order is not limited thereto.

In the second operation mode DMD2, the sensor driver 200C may be repeatedly driven in the second mode MD2-*d* and the first mode MD1. During the second mode MD2-*d*, the sensor layer 200 may be scan-driven to detect the second input 3000. During the first mode MD1, the sensor layer 200 may be scan-driven to detect coordinates by the first input 2000.

In the third operation mode DMD3, the sensor driver 200C may be driven in the second mode MD2. During the second mode MD2, the sensor layer 200 may be scan-driven to detect coordinates by the second input 3000. In the third operation mode DMD3, the sensor driver 200C may not operate in the first mode MD1-*d* or MD1 until the second input 3000 is released (or not detected).

Figure 13:
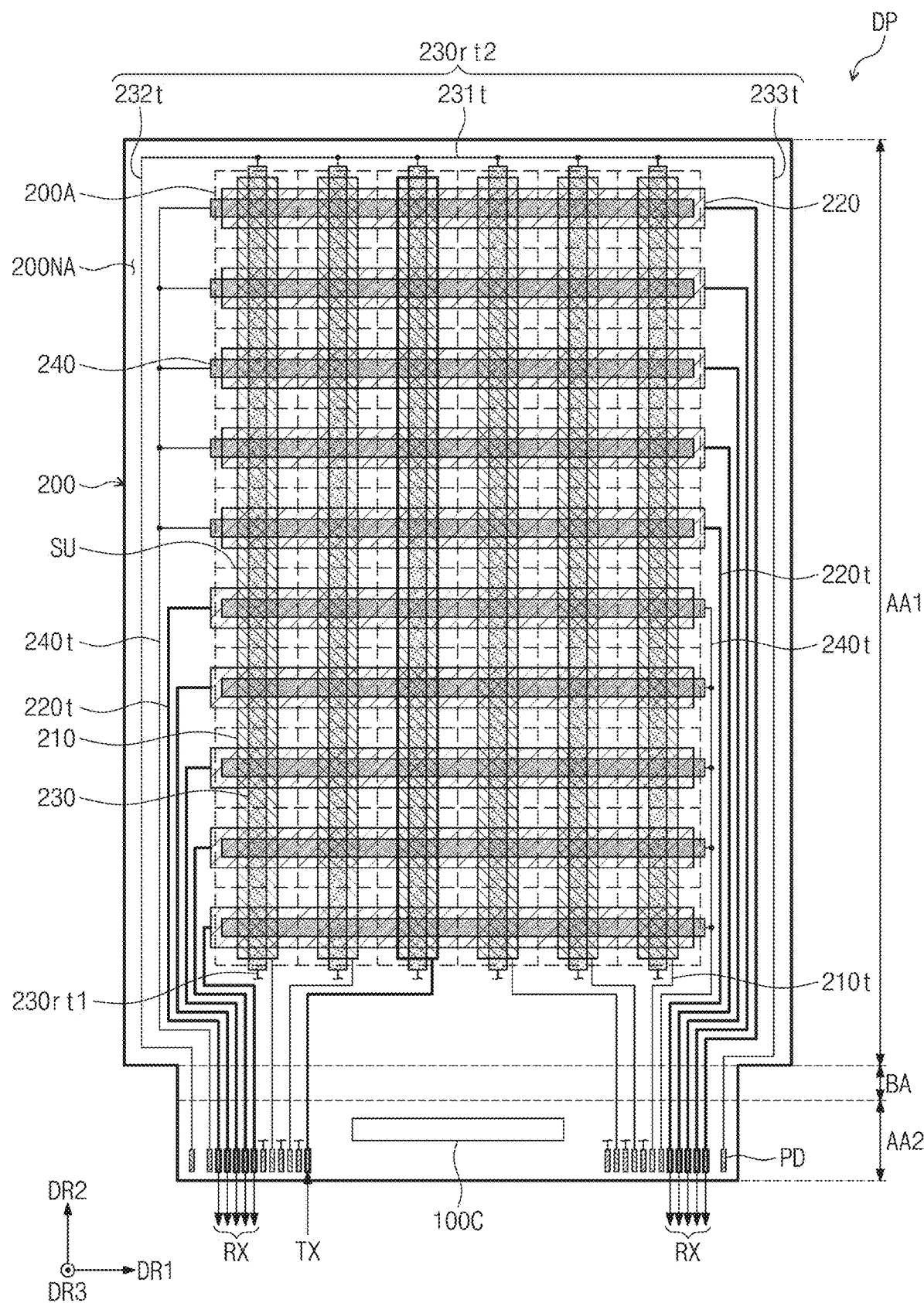
FIG. 13 is a plan view for explaining a first mode according to one or more embodiments of the present disclosure.

FIG. 13 is a plan view for explaining the first mode according to one or more embodiments of the present disclosure.

Referring to FIGS. 5, 12, and 13, the first mode MD1-*d* of the first operation mode DMD1 and the first mode MD1 of the second operation mode DMD2 may include a mutual capacitance detection mode. FIG. 13 is a view for explaining a mutual capacitance detection mode in the first mode MD1-*d* of the first operation mode DMD1 and/or the first mode MD1 of the second operation mode DMD2.

In the mutual capacitance detection mode, the sensor driver 200C may sequentially provide a transmission signal TX to the first electrodes 210, and may detect coordinates for the first input 2000 by using a reception signal RX detected through the second electrodes 220. For example, the sensor driver 200C may be configured to calculate input coordinates by sensing changes in mutual capacitance between the first electrodes 210 and the second electrodes 220.

FIG. 13 illustrates an example in which the transmission signal TX is provided to one first electrode 210, and the reception signal RX is output from the second electrodes 220. To clarify the expression of the signal, only one first electrode 210 to which the transmission signal TX is provided may be shown in bold in FIG. 13. The sensor driver 200C may detect the input coordinates for the first input 2000 by sensing a change in capacitance between the first electrode 210 and each of the second electrodes 220.

In one or more other embodiments of the present disclosure, at least one of the first mode MD1-*d* of the first operation mode DMD1 or the first mode MD1 of the second operation mode DMD2 may further include a self-capacitance detection mode. The sensor driver 200C may be configured to output driving signals to the first electrodes 210 and the second electrodes 220 in the self-capacitance detection mode, and may be configured to calculate input coordinates by sensing changes in capacitance of each of the second electrodes 220.

In the first mode MD1-*d* of the first operation mode DMD1 and the first mode MD1 of the second operation mode DMD2, all of the third electrodes 230 and the fourth electrodes 240 may be grounded. Thus, touch noise may be reduced or may be prevented from flowing through the third electrodes 230 and the fourth electrodes 240.

Figure 14:
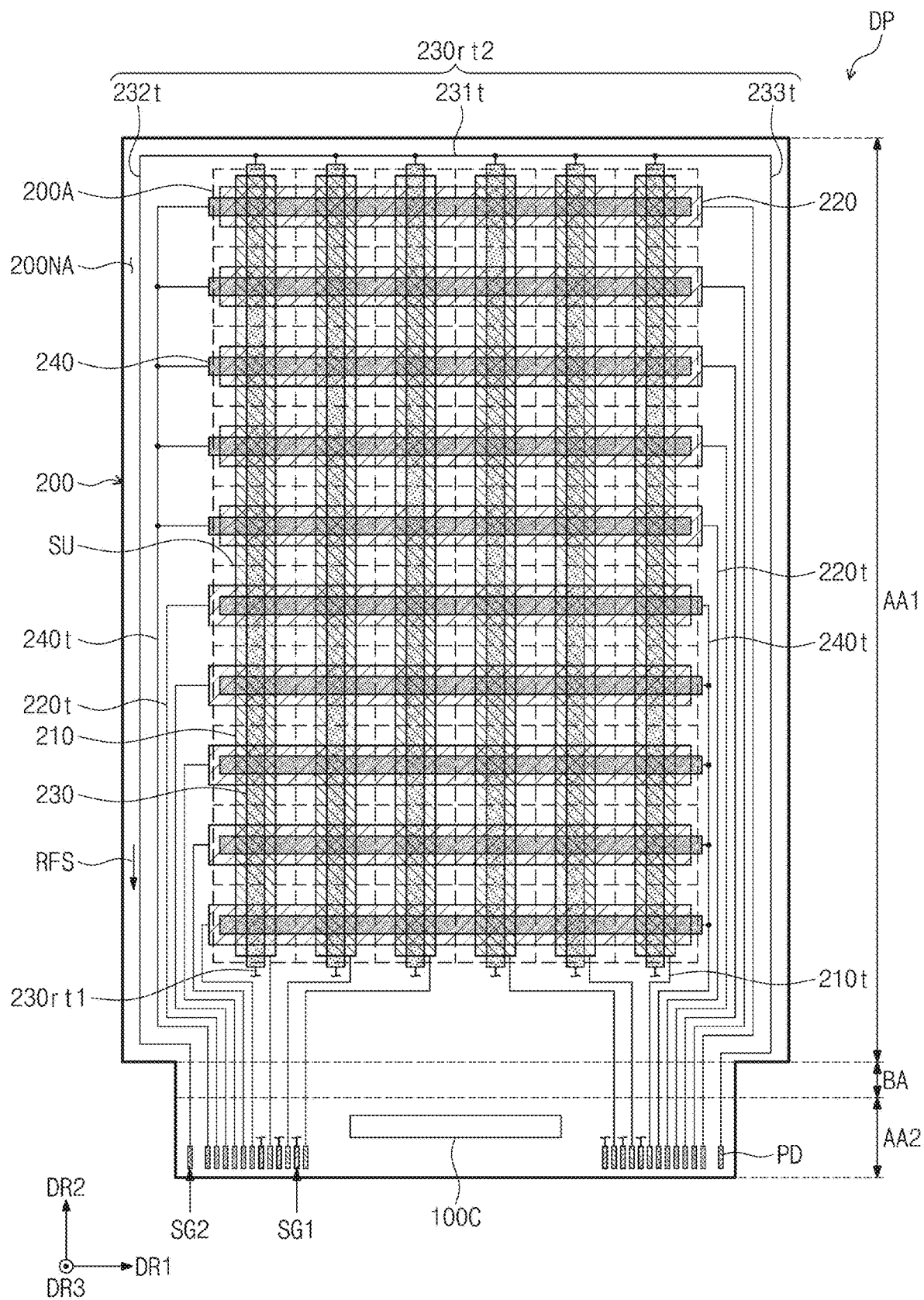
FIG. 14 is a plan view for explaining a second mode according to one or more embodiments of the present disclosure.
Figure 15A:
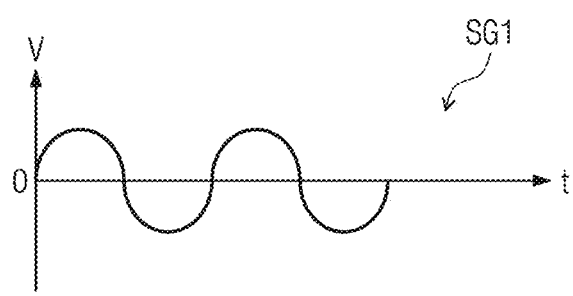
FIG. 15A is a graph illustrating a waveform of a first signal according to one or more embodiments of the present disclosure.
Figure 15B:
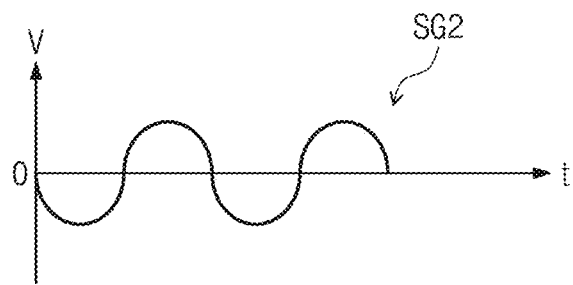
FIG. 15B is a graph illustrating a waveform of a second signal according to one or more embodiments of the present disclosure.

FIG. 14 is a plan view for explaining the second mode according to one or more embodiments of the present disclosure. FIG. 15A is a graph illustrating a waveform of a first signal according to one or more embodiments of the present disclosure. FIG. 15B is a graph illustrating a waveform of a second signal according to one or more embodiments of the present disclosure.

Referring to FIGS. 14, 15A, and 15B, the second mode MD2 may include a charging-driving mode. The charging-driving mode may include a search-charging-driving mode and a tracking-charging-driving mode.

The search-charging-driving mode may be a driving mode before sensing a position of the pen. Thus, a first signal SG1 and/or a second signal SG2 may be provided to all channels included in the sensor layer 200. That is, an entire area of the sensor layer 200 may be scanned in the search-charging-driving mode. When the pen PN (see FIG. 5) is sensed in the search-charging-driving mode, the sensor layer 200 may be driven for tracking charging. For example, in the tracking-charging-driving mode, the sensor driver 200C may sequentially output the first signal SG1 and the second signal SG2 to an area that overlaps a point at which the pen PN is sensed, rather than the entire sensor layer 200.

In the charging-driving mode, the sensor driver 200C may apply the first signal SG1 to one pad, and may apply the second signal SG2 to the other pad. The second signal SG2 may be an inverse signal of the first signal SG1. For example, the first signal SG1 may be a sinusoidal wave signal.

Because the first signal SG1 and the second signal SG2 are applied to at least two pads, current RFS may have a current path flowing from one pad to one other pad. Additionally, because the first signal SG1 and the second signal SG2 are sinusoidal wave signals having an inverse relationship with each other, the direction of the current RFS may be changed periodically. In one or more other embodiments of the present disclosure, the first signal SG1 and the second signal SG2 may be square wave signals that have an anti-phase relationship with each other.

When the first signal SG1 and the second signal SG2 have the anti-phase relationship, noise caused in the display layer 100 (see FIG. 4) by the first signal SG1 may be offset by noise caused by the second signal SG2. Thus, a flicker phenomenon may not occur in the display layer 100, and display quality of the display layer 100 may be improved.

In one or more other embodiments of the present disclosure, the first signal SG1 may be a sinusoidal wave signal. However, the present disclosure is not limited thereto, and the first signal SG1 may be a square wave signal. In addition, the second signal SG2 may have a constant voltage V (e.g., predetermined constant voltage V). For example, the second signal SG2 may be a ground voltage. In other words, the pad to which the second signal SG2 is applied may be viewed as grounded. Even in this case, current RFS may flow from one pad to the other pad. In addition, even if the other pad is grounded, a direction of the current RFS may be changed periodically because the first signal SG1 is the sinusoidal wave signal or the square wave signal.

Referring to FIG. 14, the first signal SG1 may be provided to one pad connected to one first loop trace line 230*rt*1, and the second signal SG2 may be provided to one pad connected to the second loop trace line 230*rt*2. The current RFS may flow through a current path defined by one first loop trace line 230*rt*1, one third electrode 230 connected to one first loop trace line 230*rt*1, and a portion of the second loop trace line 230*rt*2. The current path may have a coil shape. That is, the first signal SG1 may be provided to one third electrode 230 connected to one first loop trace line 230*rt*1, and the second signal SG2 may be provided to at least one other third electrode 230 connected to a second loop trace line 230*rt*2. Thus, in the charging-driving mode of the second mode, a RLC resonance circuit of the pen PN may be charged by the current path.

According to one or more embodiments of the present disclosure, a current path of a loop coil pattern may be implemented by the components included in the sensor layer

200. Thus, the electronic device 1000 (see FIG. 1A) may charge the pen PN using the sensor layer 200. Thus, because there is no need to separately add the coil for charging the pen PN, the electronic device 1000 may not increase in thickness and weight, and may not be deteriorated in flexibility.

In the charging-driving mode, the first electrodes 210, the second electrodes 220, and the fourth electrodes 240 may be grounded, may have a constant voltage applied, or may be electrically floated. For example, the first electrodes 210, the second electrodes 220, and the fourth electrodes 240 may be floated. In this case, the current RFS may not flow through the first electrodes 210, the second electrodes 220, and the fourth electrodes 240.

Figure 16:
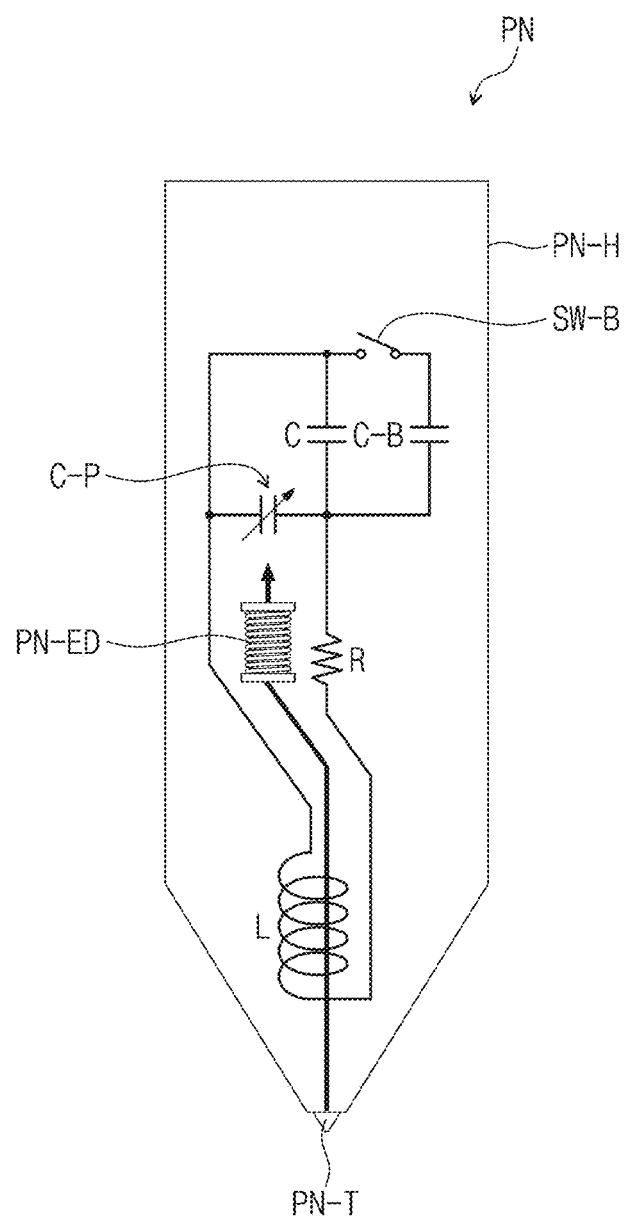
FIG. 16 is a view of a pen according to one or more embodiments of the present disclosure.

FIG. 16 is a view of the pen PN according to one or more embodiments of the present disclosure.

Referring to FIG. 16, the pen PN may include a housing PN-H, a pen tip PN-T, an inductor L, a capacitor C, a resistor R, an elastic body PN-ED, a pressure capacitor C-P, a switch SW-B, and a button capacitor C-B. The pen PN may not include active elements, such as a power source, a transistor, or a diode, notwithstanding the switch SW-B connected to the button capacitor C-B. The components included in the pen PN are not limited to the components described above. At least a portion of the above-described components may be omitted, and other components may be added.

In one or more embodiments of the present disclosure, the pen tip PN-T may include a non-conductive material. The pen tip PN-T may have a structure that protrudes to the outside of the housing PN-H. The pen tip PN-T may be coupled separably from the housing PN-H, and may be a replaceable component.

In one or more embodiments of the present disclosure, the resistor R, the inductor L, and the capacitor C may be connected to each other in series. Thus, the pen PN may have a structure that has a resonance frequency and selectivity, which are characteristics of an RLC series circuit. In this case, a frequency of each of signals provided to the sensor layer 200 (e.g., if the sensor layer 200 is driven to be charged) may correspond to a resonance frequency of the pen PN. The capacitor C, the pressure capacitor C-P, and the button capacitor C-B may have a structure connected to each other in parallel. For reference, the button capacitor C-B may be connected in parallel to the capacitor C if the switch SW-B is turned on.

In one or more embodiments of the present disclosure, as the switch SW-B is turned on and off, the button capacitor C-B may be electrically connected to, or disconnected from, the capacitor C. That is, the switch SW-B may be turned on and off to enable the pen PN to respond to other resonance frequencies. For example, a button may be provided on an outer circumferential surface of the housing PN-H. When the button is pressed, the switch SW-B may be turned on, and the button capacitor C-B may be electrically connected to the capacitor C, and thus, capacitance of the entire pen PN may increase.

In one or more embodiments of the present disclosure, the capacitor C may be provided by cutting some of a plurality of capacitors connected to each other in parallel. For example, during a process of manufacturing the pen PN, the pen PN may tune the capacitor C by cutting or disabling some of the plurality of capacitors to match a target resonance frequency.

In one or more embodiments of the present disclosure, if the pen tip PN-T is partially inserted into the housing PN-H by a pen pressure, then an area, a distance, or the area and the distance corresponding to the capacitance of the pressure capacitor C-P may be changed. Thus, the capacitance of the pressure capacitor C-P may be changed. For example, if the pen pressure is applied to the pen PN, then the capacitance of the pressure capacitor C-P may increase, and the resonance frequency of the pen PN may decrease correspondingly. Thereafter, if the pen pressure is removed, then the capacitance of the pressure capacitor C-P may return to its original state due to the elastic body PN-ED.

FIG. 17A is a view for explaining an operation of the pen PN according to one or more embodiments of the present disclosure. FIG. 17B is a view for explaining an operation of the sensor layer 200 according to one or more embodiments of the present disclosure.

Referring to FIGS. 14, 16, 17A, and 17B, the second mode MD2 may include a charging section MD2-*ch* and a discharging section MD2-*dc*. The charging section MD2-*ch* may correspond to the charging-driving mode, and the discharging section MD2-*dc* may correspond to a pen-sensing-driving mode.

The first signal SG1 and the second signal SG2 may be provided to the sensor layer 200 during a first time period. The first time period may correspond to one charging section MD2-*ch*. During the first time period, the pen PN adjacent to the sensor layer 200 may be charged. For example, the inductor L may generate current by the magnetic fields generated in the sensor layer 200. The generated current may be transferred to the capacitor C. The capacitor C may charge current input from the inductor L. Thereafter, the capacitor C may discharge the charged current to the inductor L, and the inductor L may emit magnetic fields at the resonance frequency.

The section in which the magnetic fields are emitted from the pen PN may correspond to the discharging section MD2-*dc*. The induced current may flow in the sensor layer 200 due to the magnetic fields emitted by the pen PN, and the induced current may be transmitted to the sensor driver 200C as a received signal (e.g., a sensing signal, a signal, and/or the like).

In one or more embodiments of the present disclosure, the charging-driving voltage of the sensor layer 200 may have a sinusoidal wave or a square wave, and FIG. 17B illustrates an example in which the charging-driving voltage has the sinusoidal wave. A voltage charged to the pen PN, or a voltage discharged from the pen PN, may have the sinusoidal wave.

Figure 18A:
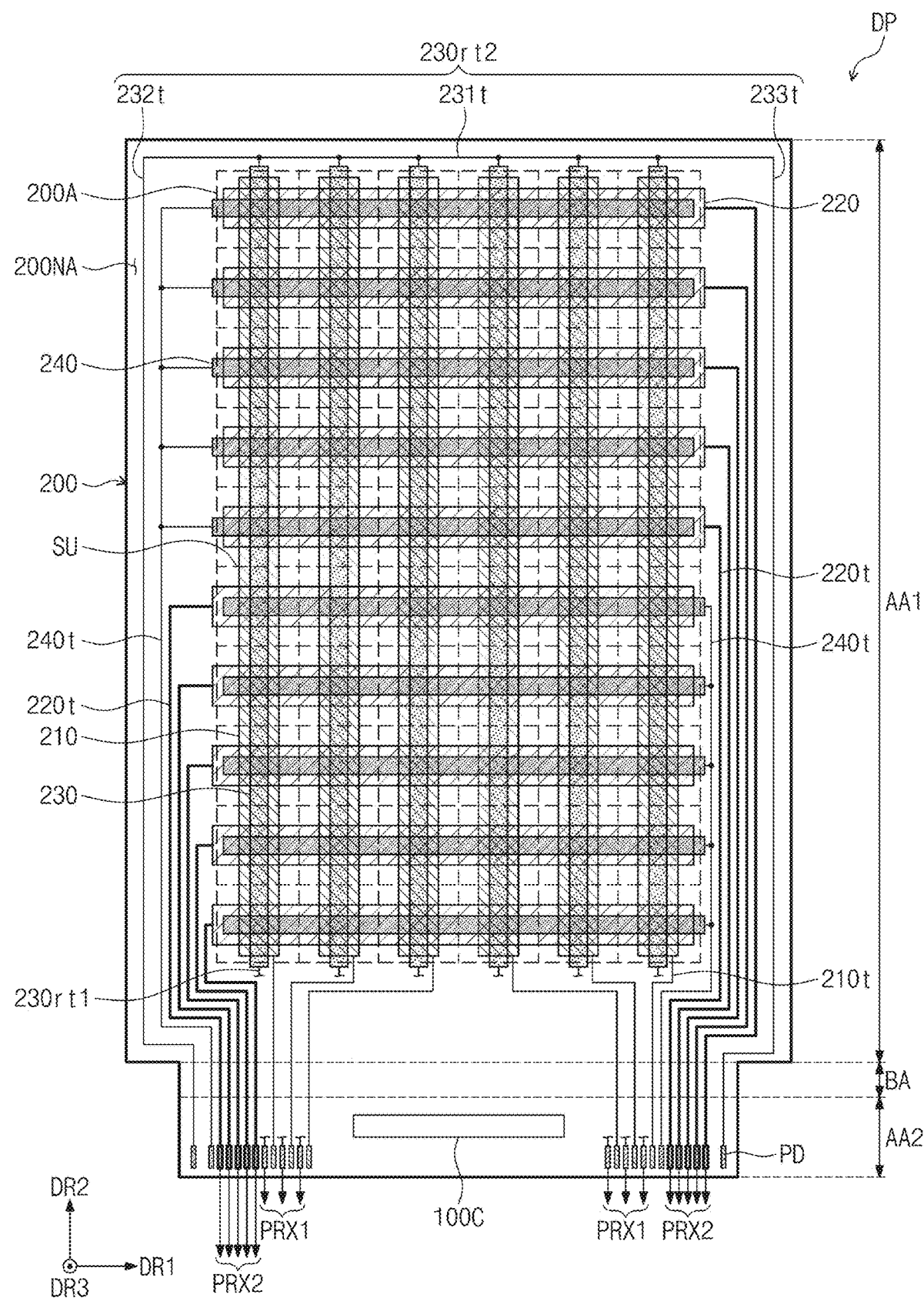
FIG. 18A is a plan view for explaining a second mode according to one or more embodiments of the present disclosure.
Figure 18B:
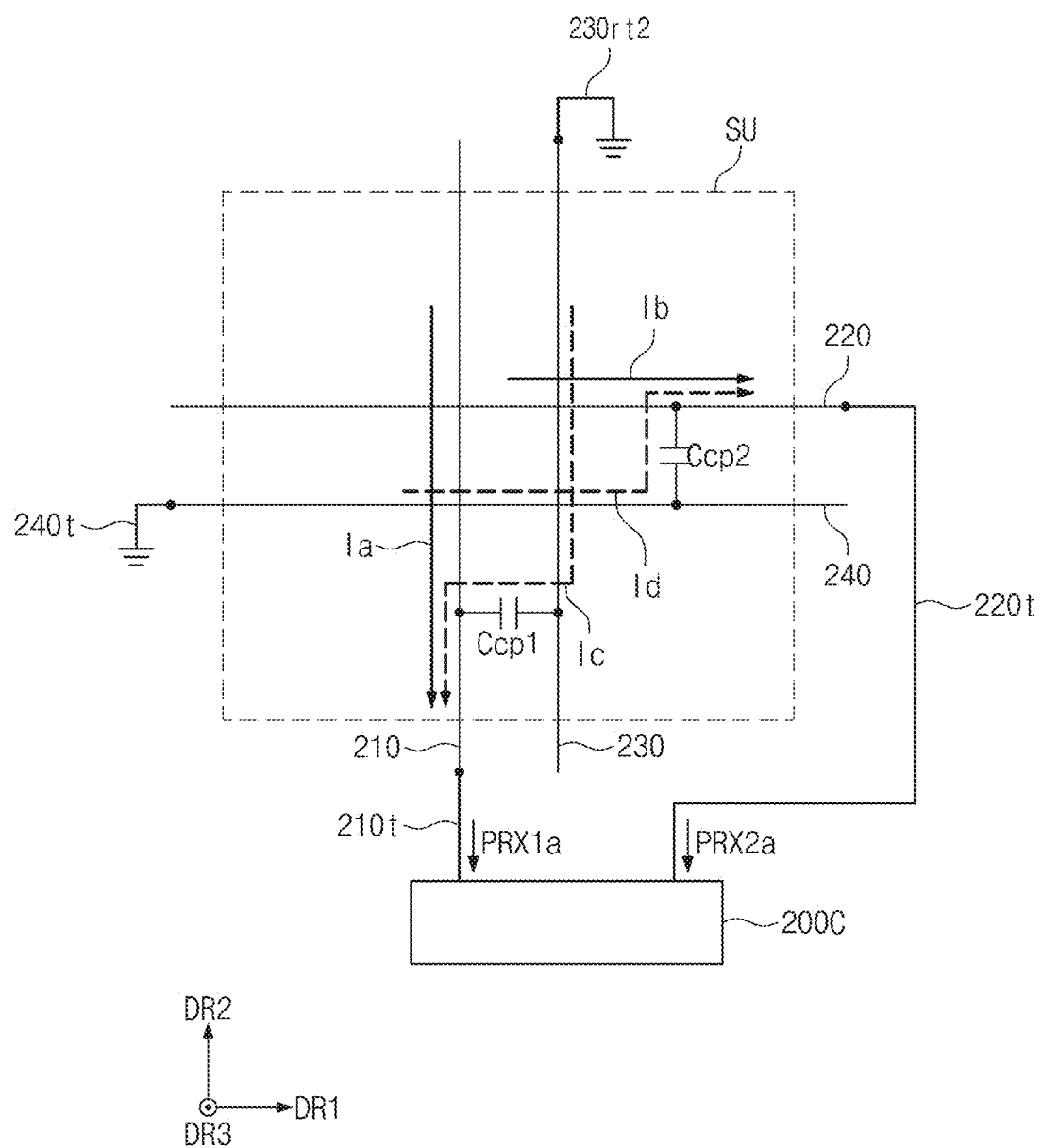
FIG. 18B is a view for explaining the second mode on the basis of one sensing unit according to one or more embodiments of the present disclosure.

FIG. 18A is a plan view for explaining the second mode according to one or more embodiments of the present disclosure. FIG. 18B is a view for explaining the second mode on the basis of one sensing unit SU according to one or more embodiments of the present disclosure.

Referring to FIGS. 18A and 18B, the second mode may include a charging-driving mode and a pen-sensing-driving mode. FIGS. 18A and 18B are views for explaining the pen-sensing-driving mode.

Referring to FIG. 18A, in the pen-sensing driving mode, first received signals PRX1 may be output from the first electrodes 210, and second received signals PRX2 may be output from the second electrodes 220. FIG. 18B illustrates one sensing unit SU through which first to fourth induced current Ia, Ib, Ic, and Id generated by the pen PN flow.

Referring to FIGS. 18A and 18B, routing directions of one electrode and the other electrode of the sensor layer 200, which overlap each other, may be different from each other. For example, a routing direction of the first electrode 210 and a routing direction of the third electrode 230 may be different from each other. In addition, a routing direction of the second electrode 220 and a routing direction of the fourth electrode 240 may be different from each other. The routing direction may be a direction in which the trace line protrudes and extends from a position at which the electrode and the trace line are connected to each other.

For example, in FIG. 18B, the first electrode 210 and the first trace line 210*t* may be connected at a lower portion of the sensing unit SU, and the first trace line 210*t* may protrude and extend from a lower portion of the first electrode 210. The third electrode 230 and the second loop trace line 230*rt*2 may be connected at an upper portion of the sensing unit SU, and the second loop trace line 230*rt*2 may protrude and extend from an upper portion of the third electrode 230. The second electrode 220 and the second trace line 220*t* may be connected at a right side of the sensing unit SU, the second trace line 220*t* may protrude and extend from a right side of the second electrode 220, and the fourth electrode 240 and the auxiliary trace line 240*t* may be connected at a left side of the sensing unit SU, and the auxiliary trace line 240*t* may protrude and extend from a left side of the fourth electrode 240.

An RLC resonance circuit of the pen PN may emit magnetic fields at a resonance frequency while discharging the charged charges. The first induced current Ia may be generated in the first electrode 210, and the second induced current Ib may be generated in the second electrode 220 by the magnetic fields provided from the pen PN. In addition, third induced current Ic may be generated in the third electrode 230, and fourth induced current Id may be generated in the fourth electrode 240.

A first coupling capacitor Ccp1 may be located between the third electrode 230 and the first electrode 210, and a second coupling capacitor Ccp2 may be located between the fourth electrode 240 and the second electrode 220. The third induced current Ic may be transmitted to the first electrode 210 through the first coupling capacitor Ccp1, and the fourth induced current Id may be transmitted to the second electrode 220 through the second coupling capacitor Ccp2.

The sensor driver 200C may receive a first received signal PRX1*a* based on the first induced current Ia and the third induced current Ic from the first electrode 210, and may receive a second received signal PRX2*a* based on the second induced current Ib and the fourth induced current Id from the second electrode 220. The sensor driver 200C may detect input coordinates of the pen PN based on the first received signal PRX1*a* and the second received signal PRX2*a*.

When the sensor driver 200C receives the first received signal PRX1*a* from the first electrode 210, and receives the second received signal PRX2*a* from the second electrode 220, all ends of the third electrode 230 and the fourth electrode 240 may be floated. Thus, compensation of the sensing signal may be improved or maximized by the coupling between the first electrode 210 and the third electrode 230, and by the coupling between the second electrode 220 and the fourth electrode 240.

In addition, the other ends of the third electrode 230 and the fourth electrode 240 may be grounded or floated. Thus, the third induced current Ic and the fourth induced current Id may be respectively sufficiently transmitted to the first electrode 210 and the second electrode 220 by the coupling between the first electrode 210 and the third electrode 230, and the coupling between the second electrode 220 and the fourth electrode 240.

Figure 19:
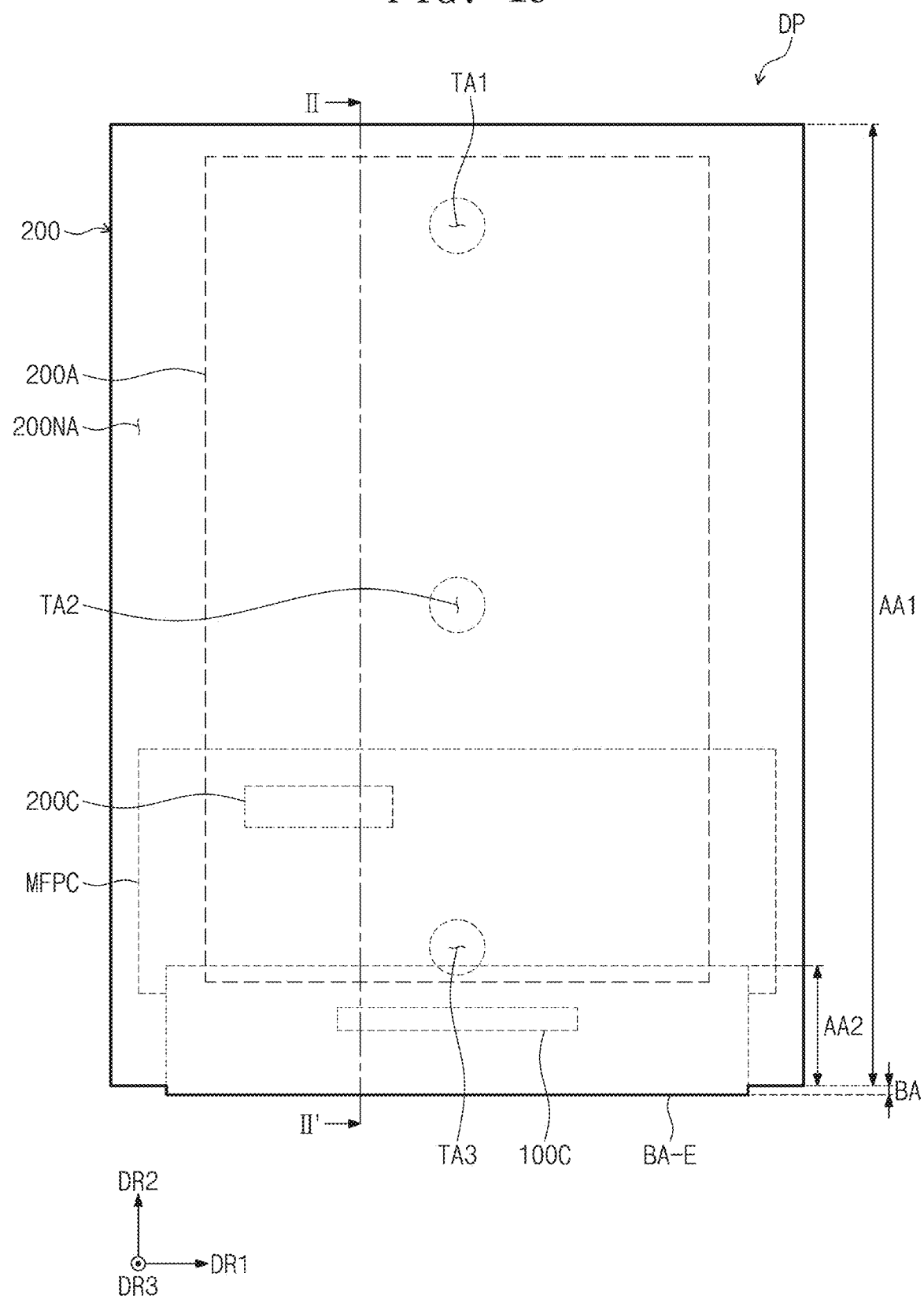
FIG. 19 is a plan view illustrating a display panel and a circuit board according to one or more embodiments of the present disclosure.

FIG. 19 is a plan view illustrating the display panel DP and the circuit board MFPC according to one or more embodiments of the present disclosure.

Referring to FIGS. 7 and 19, a portion of the display panel DP may be bent and modularized. For example, the bending area BA may be bent so that the second area AA2 is located below the first area AA1 (e.g., in the third direction DR3). Thus, the second area AA2 of the display panel DP and the circuit board MFPC may be located beneath the first area AA1.

FIG. 19 illustrates an example in which a first measurement area TA1, a second measurement area TA2, and a third measurement area TA3 overlap the sensing area 200A. The first measurement area TA1 and the second measurement area TA2 may not overlap the second area AA2 and the circuit board MFPC, and the third measurement area TA3 may overlap the second area AA2 and the circuit board MFPC (e.g., in a thickness direction). An input may be provided to correspond to each of the first, second, and third measurement areas TA1, TA2, and TA3, and a signal-to-noise ratio may be measured accordingly.

A portion of the first loop trace lines 230*rt*1 located in the first area AA1, and a portion of the first loop trace lines 230*rt*1 located in the second area AA2, may overlap each other. In addition, a portion of the first loop trace lines 230*rt*1 located in the first area AA1, and a plurality of connection lines 230*c* included in the circuit board MFPC, may overlap each other.

Unlike some embodiments of the present disclosure, if a direction of first magnetic fields generated in the first area AA1, and a direction of second magnetic fields generated in the second area AA2, are different from each other, and are affected by each other, the first magnetic fields and the second magnetic fields may be offset from each other. Thus, strength of the magnetic fields provided by the electronic device 1000 (see FIG. 1A) may be reduced. In this case, the pen PN may not be sufficiently charged, and the magnetic fields emitted from the pen PN may also be insufficient. A signal-to-noise ratio of the third measurement area TA3 may be less than a signal-to-noise ratio of each of the first measurement area TA1 and the second measurement area TA2. As a result, sensing sensitivity of the pen PN of the electronic device 1000 (see FIG. 1A) may be reduced.

According to one or more embodiments of the present disclosure, a structure in which the first magnetic fields generated in the first area AA1 and the second magnetic fields generated in the second area AA2 or the circuit board MFPC are not offset from each other may be provided. For example, an arrangement of the first loop trace lines 230*rt*1, the second loop trace line 230*rt*2, or the plurality of connection lines 230*c* may be adjusted so that the direction of the first magnetic fields generated in the first area AA1 and the direction of the second magnetic fields generated in the second area AA2 or the circuit board MFPC are the same. Alternatively, a shielding structure may be applied to the electronic device 1000 so that the second magnetic fields generated in the second area AA2 or the circuit board MFPC do not affect the first magnetic fields generated in the first area AA1. Thus, the signal-to-noise ratio of the third measurement area TA3 may be improved to a level that is similar to or slightly higher than the signal-to-noise ratio of each of the first measurement area TA1 and the second measurement area TA2. As a result, the sensing sensitivity of the pen PN of the electronic device 1000 (see FIG. 1A) may be improved.

Figure 20:
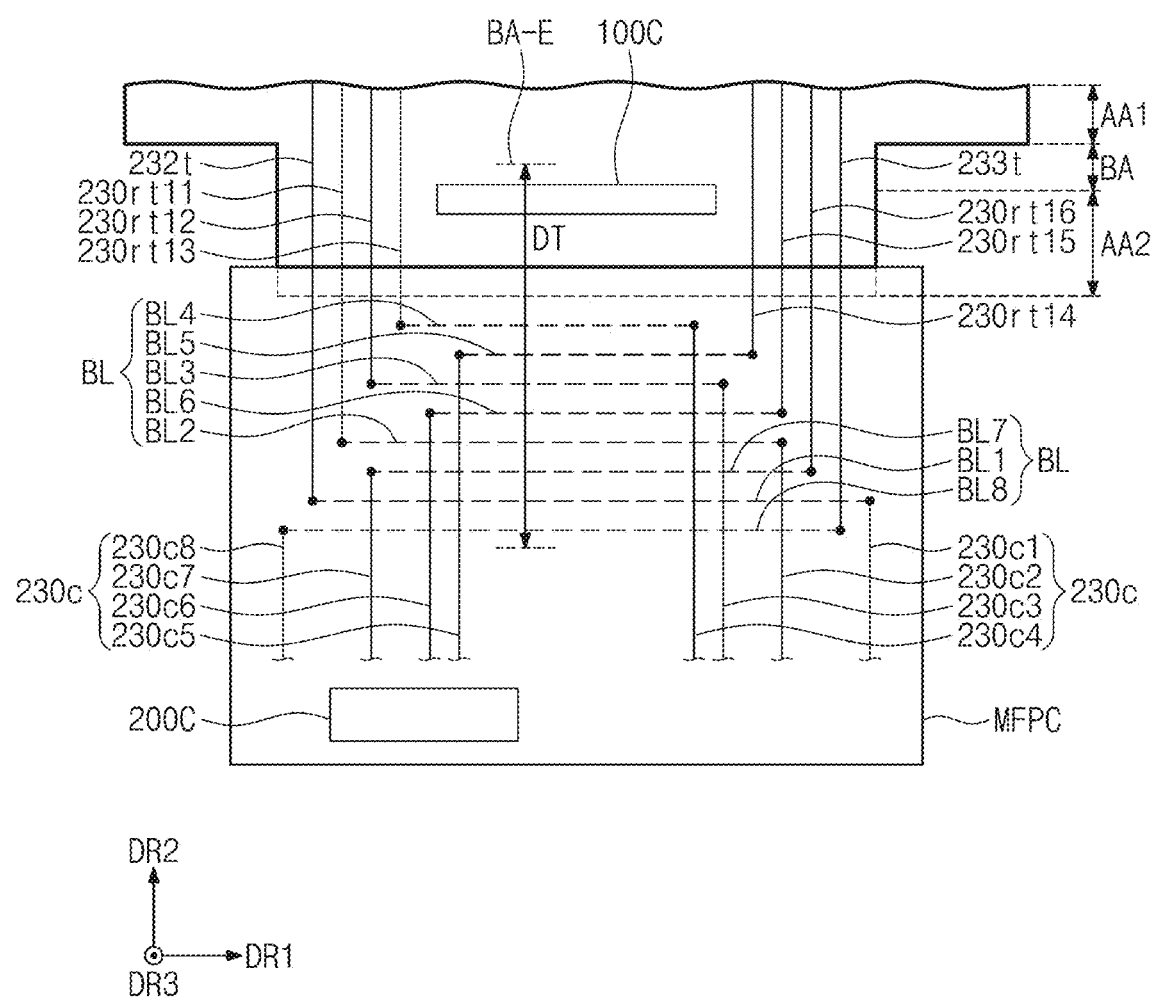
FIG. 20 is a view of a display panel and a circuit board according to one or more embodiments of the present disclosure.

FIG. 20 is a view of the display panel DP and the circuit board MFPC according to one or more embodiments of the present disclosure.

Referring to FIGS. 7, 19, and 20, the first loop trace lines 230*rt*1 may include a first-first loop trace line 230*rt*11, a first-second loop trace line 230*rt*12, a first-third loop trace line 230rt13, a first-fourth loop trace line 230rt14, a first-fifth loop trace line 230rt15, and a first-sixth loop trace line 230rt16.

The second line portion 232t, the first-first to first-sixth loop trace lines 230rt11 to 230rt16, and the third line portion 233t may be sequentially arranged along the first direction DR1. For example, in the display panel DP, the second line portion 232t, the first-first to first-sixth loop trace lines 230rt11 to 230rt16, and the third line portion 233t may extend from the first area AA1 toward the second area AA2 via the bending area BA.

The circuit board MFPC may include a plurality of connection lines 230c that are electrically connected to one-to-one correspond to the second line portion 232t, the first-first to first-sixth loop trace lines 230rt11 to 230rt16, and the third line portion 233t. The plurality of connection lines 230c may include a first connection line 230c1, a second connection line 230c2, a third connection line 230c3, a fourth connection line 230c4, a fifth connection line 230c5, a sixth connection line 230c6, a seventh connection line 230c7, and an eighth connection line 230c8.

According to one or more embodiments of the present disclosure, an arrangement order of the third electrodes 230 may be different from that of the second to seventh connection lines 230c2 to 230c7 that are electrically connected to correspond to the third electrodes 230. In addition, an arrangement order of the second line portion 232t, the first-first to first-sixth loop trace lines 230rt11 to 230rt16, and the third line portion 233t may be different from that of the first to eighth connection lines 230c1 to 230c8, which are electrically connected to each other correspondingly. For example, the second line portion 232t, the first-first to first-sixth loop trace lines 230rt11 to 230rt16, and the third line portion 233t may be sequentially arranged along the first direction DR1, and at least some of the first to eighth connection lines 230c1 to 230c8 may be sequentially arranged along a direction opposite to the first direction DR1.

In one or more embodiments of the present disclosure, all of the first to eighth connection lines 230c1 to 230c8 may be sequentially arranged along the direction opposite to the first direction DR1. In this case, the first connection line 230c1 electrically connected to the second line portion 232t may be located at the far right side, and the eighth connection line 230c8 electrically connected to the third line portion 233t may be located at the far left side. That is, if the second line portion 232t, the first-first to first-sixth loop trace lines 230rt11 to 230rt16, and the third line portion 233t are arranged in forward order, the first to the eighth connection lines 230c1 to 230c8 may be arranged in reverse order.

In one or more embodiments of the present disclosure, only the second to seventh connection lines 230c2 to 230c7 electrically connected to the first-first to first-sixth loop trace lines 230rt11 to 230rt16 among the first to eighth connection lines 230c1 to 230c8 may be arranged along the direction opposite to the first direction DR1. In this case, the first connection line 230c1, the seventh connection line 230c7, the sixth connection line 230c6, the fifth connection line 230c5, the fourth connection line 230c4, the third connection line 230c3, the second connection line 230c2, and the eighth connection line 230c8 may be sequentially arranged along the first direction DR1.

According to one or more embodiments of the present disclosure, the circuit board MFPC may further include a plurality of bridge lines BL. The bridge lines BL may include first to eighth bridge lines BL1, BL2, BL3, BL4, BL5, BL6, BL7, and BL8. The first to eighth bridge lines BL1, BL2, BL3, BL4, BL5, BL6, BL7, and BL8 may be electrically connected to one-to-one correspond to the first to eighth connection lines 230c1 to 230c8. In addition, the first to eighth bridge lines BL1, BL2, BL3, BL4, BL5, BL6, BL7, and BL8 may be electrically connected to one-to-one correspond to the second line portion 232t and the first-first to first-sixth loop trace lines 230rt11 to 230rt16, and the third line portion 233t.

The first to eighth bridge lines BL1, BL2, BL3, BL4, BL5, BL6, BL7, and BL8 may extend along the first direction DR1 and may be arranged to be spaced apart from each other in the second direction DR2. However, this is only an example, and the first to eighth bridge lines BL1, BL2, BL3, BL4, BL5, BL6, BL7, and BL8 may have various shapes and be variously arranged if the arrangement order of the second line portion 232t, the first-first to first-sixth loop trace lines 230rt11 to 230rt16, and the third line portion 233t and the arrangement order of the first to eighth connection lines 230c1 to 230c8, which are electrically connected correspondingly are adjusted differently.

According to one or more embodiments of the present disclosure, each of the second line portion 232t, the first-first to first-sixth loop trace lines 230rt11 to 230rt16, and the third line portion 233t and the first to eighth connection lines 230c1 to 230c8, which are electrically connected to correspond thereto may be spaced apart from each other in the first direction DR1. For example, one loop trace line and one connection line electrically connected thereto may be spaced apart from each other in the first direction DR1.

Referring to FIG. 19 together, the bending area BA may be bent, and the second area AA2 and the circuit board MFPC may be located below the first area AA1. In this case, a bending edge BA-E may be defined in the bending area BA. According to one or more embodiments of the present disclosure, if the display panel DP is bent, then the first to eighth bridge lines BL1, BL2, BL3, BL4, BL5, BL6, BL7, and BL8 may be located within a limited distance (e.g., predetermined distance) DT from the bending edge BA-E. For example, the limited distance (e.g., predetermined distance) DT may be about 50 mm, but the present disclosure is not particularly limited thereto. In an area within the limited distance DT from the bending edge BA-E, the arrangement order of the second line portion 232t, the first-first to first-sixth loop trace lines 230rt11 to 230rt16 and the third line portion 233t may be changed.

Lines having the same arrangement order as that of the second line portion 232t, the first-first to first-sixth loop trace lines 230rt11 to 230rt16, and the third line portion 233t may overlap each other on a plane, and directions of the overlapping magnetic fields may be reversed, and thus the magnetic fields may be offset from each other. Thus, the positions of the first to eighth bridge lines BL1, BL2, BL3, BL4, BL5, BL6, BL7, and BL8 may be closer to the bending edge BA-E, an area in the magnetic fields are offset in the state in which the display panel DP is bent may be further reduced.

According to one or more embodiments of the present disclosure, if the bending area BA of the display panel DP is bent and assembled, then the direction of the first magnetic fields generated in the first area AA1 in the charging-driving mode and the direction of the second magnetic fields generated in the circuit board MFPC may be the same. Thus, the magnetic fields in the third measurement area TA3 and the area adjacent thereto may not be offset. For example, strength of the magnetic fields received by the pen PN adjacent to the third measurement area TA3 may be equal to or greater than that of the magnetic fields received by the pen PN adjacent to the first measurement area TA1 or the second measurement area TA2. Thus, the signal-to-noise ratio of the third measurement area TA3 may be improved to a level that is similar to or slightly higher than the signal-to-noise ratio of each of the first measurement area TA1 and the second measurement area TA2. As a result, the sensing sensitivity of the pen PN of the electronic device 1000 (see FIG. 1A) may be improved.

Figure 21:
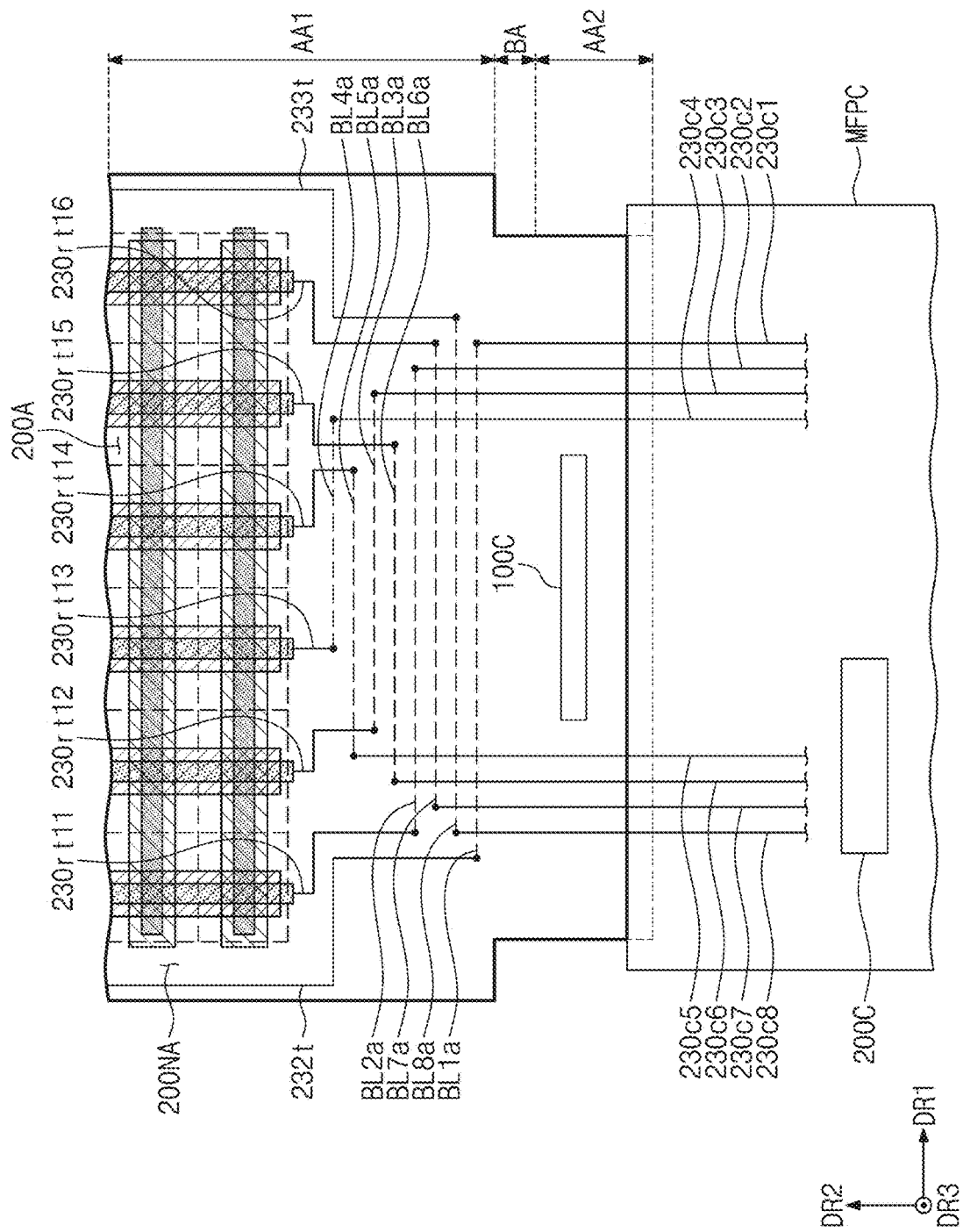
FIG. 21 is a view of a display panel and a circuit board according to one or more embodiments of the present disclosure.

FIG. 21 is a view of a display panel and a circuit board MFPC according to one or more embodiments of the present disclosure. In description of FIG. 21, the same reference numeral may be given to components that are the same as the components of FIG. 20, and their detailed descriptions will be omitted.

Referring to FIGS. 7, 19, and 21, the arrangement order of the second line portion 232t, the first-first to first-sixth loop trace lines 230rt11 to 230rt16, and the third line portion 233t may be different from that of the first to eighth connection lines 230c1 to 230c8, which are electrically connected to each other correspondingly. For example, the second line portion 232t, the first-first to first-sixth loop trace lines 230rt11 to 230rt16, and the third line portion 233t may be sequentially arranged along the first direction DR1, and at least some of the first to eighth connection lines 230c1 to 230c8 may be sequentially arranged along a direction opposite to the first direction DR1.

The arrangement order of the second line portion 232t, the first-first to first-sixth loop trace lines 230rt11 to 230rt16, and the third line portion 233t may be changed within the display panel DP. For example, the arrangement order may be changed in the peripheral area 200NA.

According to one or more embodiments of the present disclosure, the display panel DP may include first to eighth bridge lines BL1a, BL2a, BL3a, BL4a, BL5a, BL6a, BL7a, and BL8a. The first to eighth bridge lines BL1a to BL8a may be arranged in the first area AA1. In addition, the first to eighth bridge lines BL1a to BL8a may be located in the peripheral area 200NA.

The second line portion 232t, the first-first to first-sixth loop trace lines 230rt11 to 230rt16, and the third line portion 233t may be electrically connected to one-to-one correspond to the first to eighth bridge lines BL1a, BL2a, BL3a, BL4a, BL5a, BL6a, BL7a, and BL8a. The first to eighth connection lines 230c1 to 230c8 may be electrically connected to one-to-one correspond to the first to eighth bridge lines BL1a, BL2a, BL3a, BL4a, BL5a, BL6a, BL7a, and BL8a.

The arrangement order of the first to eighth connection lines 230c1 to 230c8 that receive the same signal as the second line portion 232t, the first-first to first-sixth loop trace lines 230rt11 to 230rt16, and the third line portion 233t may be changed through the first to eighth bridge lines BL1a, BL2a, BL3a, BL4a, BL5a, BL6a, BL7a, and BL8a.

Thus, if the bending area BA of the display panel DP is bent and assembled, then the direction of the first magnetic fields generated in the first area AA1 in the charging-driving mode and the direction of the second magnetic fields generated in the second area AA2 and the circuit board MFPC may be the same. Thus, the magnetic fields in the third measurement area TA3 and the area adjacent thereto may not be offset. Thus, the signal-to-noise ratio of the third measurement area TA3 may be improved to a level that is similar to or slightly higher than the signal-to-noise ratio of each of the first measurement area TA1 and the second measurement area TA2. As a result, the sensing sensitivity of the pen PN of the electronic device 1000 (see FIG. 1A) may be improved.

Figure 22:
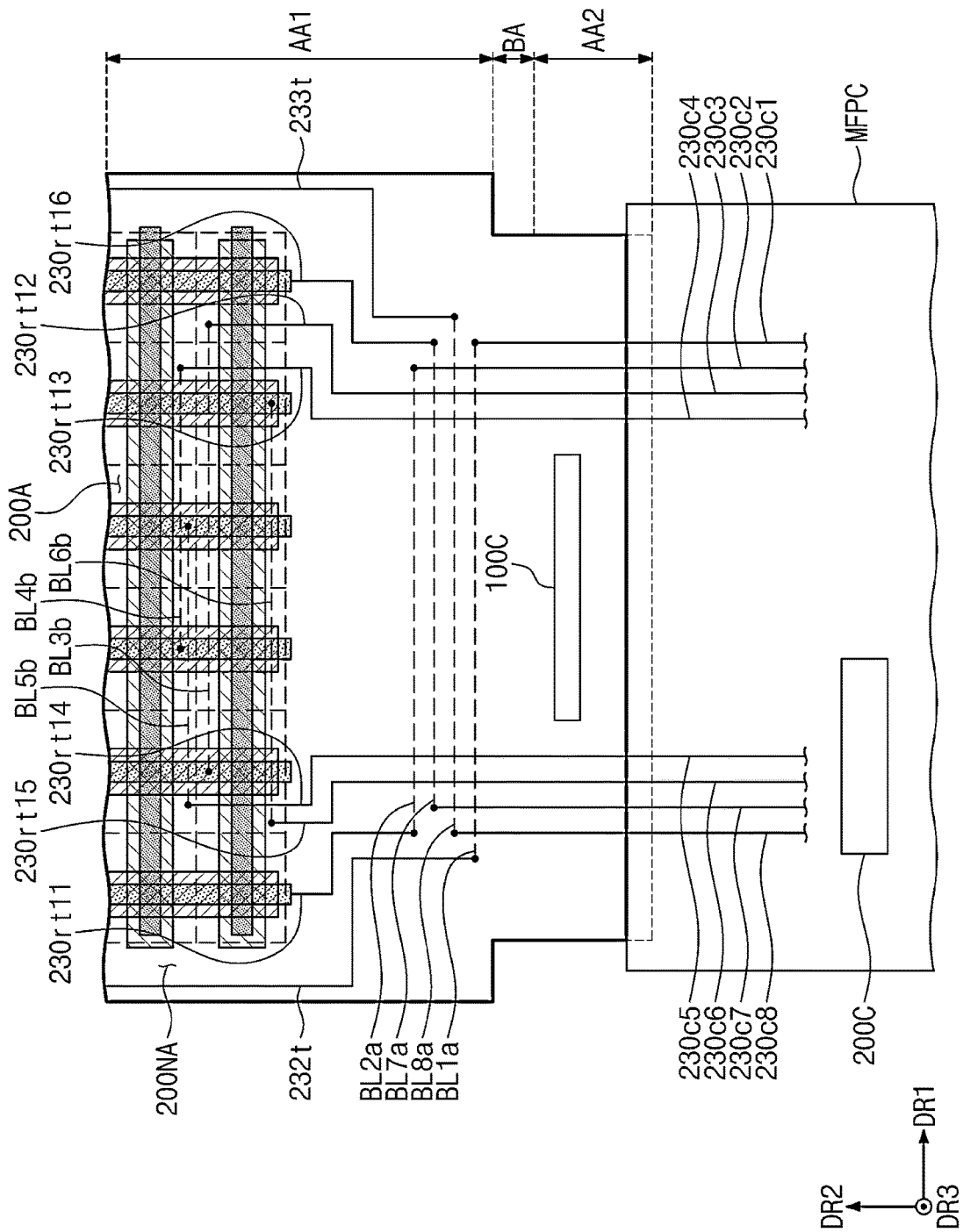
FIG. 22 is a view of a display panel and a circuit board according to one or more embodiments of the present disclosure.

FIG. 22 is a view of a display panel and a circuit board MFPC according to one or more embodiments of the present disclosure. In the description of FIG. 22, the same reference numerals are used for the components described in FIGS. 20 and 21, and descriptions thereof will be omitted.

Referring to FIGS. 7, 19, and 22, the display panel DP may include first to eighth bridge lines BL1a, BL2a, BL3b, BL4b, BL5b, BL6b, BL7a, and BL8a. The first to eighth bridge lines BL1a, BL2a, BL3b, BL4b, BL5b, BL6b, BL7a, and BL8a may be arranged in the first area AA1.

In one or more embodiments of the present disclosure, at least some of the first to eighth bridge lines BL1a, BL2a, BL3b, BL4b, BL5b, BL6b, BL7a, and BL8a may overlap the sensing area 200A. For example, the third to sixth bridge lines BL3b, BL4b, BL5b, and BL6b may be located in the sensing area 200A, and the first, second, seventh, and eighth bridge lines BL1a, BL2a, BL7a, and BL8a may be located in the peripheral area 200NA. However, this is only an example and the arrangement relationship may be modified in various manners.

In one or more embodiments of the present disclosure, some of the third electrodes 230 may be directly connected to the third to sixth bridge lines BL3b, BL4b, BL5b, and BL6b. That is, the first-second loop trace line 230rt12, the first-third loop trace line 230rt13, the first-fourth loop trace line 230rt14, and the first-fifth loop trace line 230rt15 may be connected to the third electrodes 230 corresponding to the third to sixth bridge lines BL3b, BL4b, BL5b, and BL6b.

According to one or more embodiments of the present disclosure, if the bending area BA of the display panel DP is bent and assembled, then the direction of the first magnetic fields generated in the first area AA1 in the charging-driving mode and the direction of the second magnetic fields generated in the circuit board MFPC and the second area AA2 may be the same. Thus, the signal-to-noise ratio of the third measurement area TA3 may be improved to a level that is similar to or slightly higher than the signal-to-noise ratio of each of the first measurement area TA1 and the second measurement area TA2. As a result, the sensing sensitivity of the pen PN of the electronic device 1000 (see FIG. 1A) may be improved.

Figure 23:
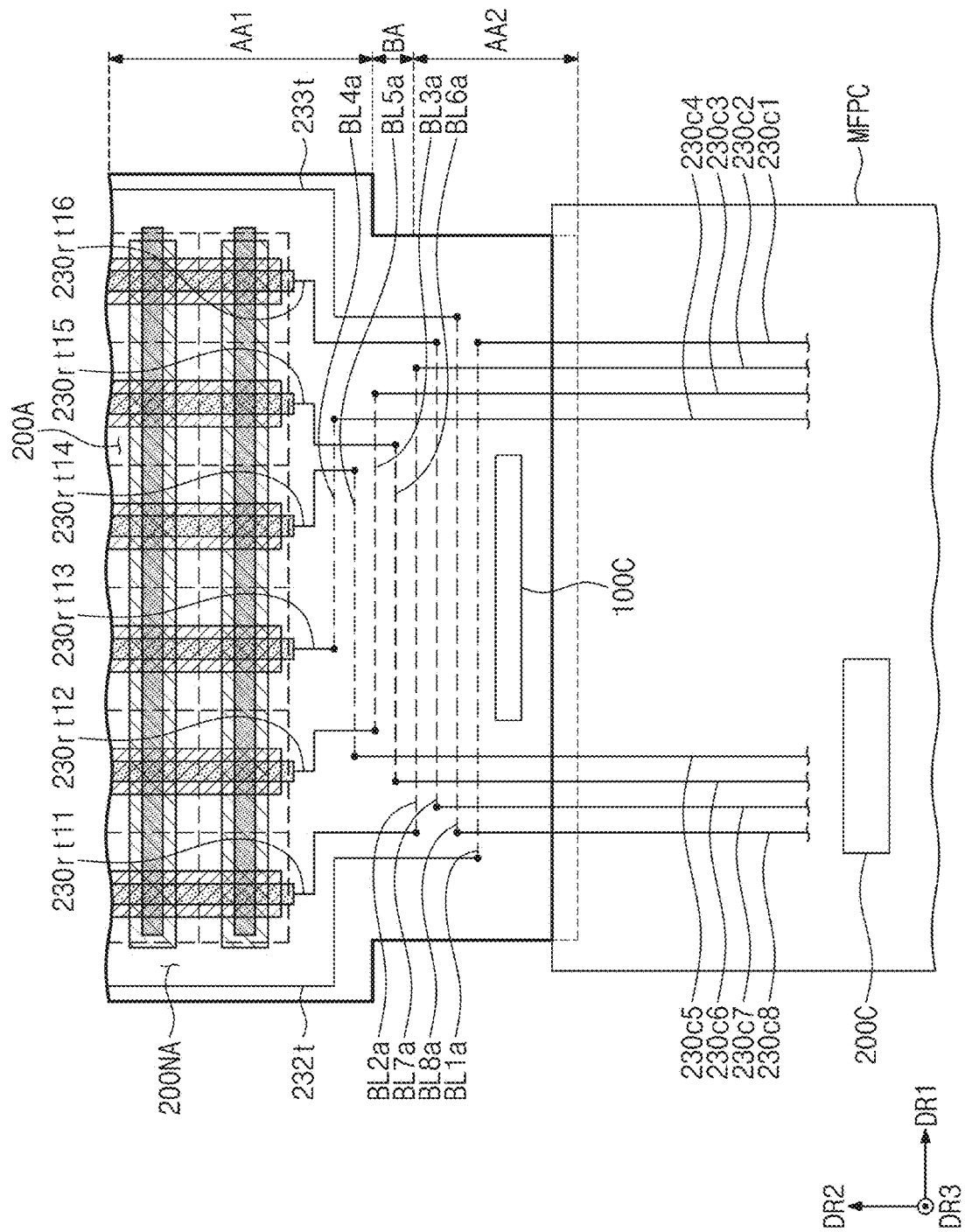
FIG. 23 is a view of a display panel and a circuit board according to one or more embodiments of the present disclosure.

FIG. 23 is a view of a display panel and a circuit board MFPC according to one or more embodiments of the present disclosure. In description of FIG. 23, the same reference numeral may be given to components that are the same as the components of FIG. 21, and their detailed descriptions will be omitted.

Referring to FIGS. 7, 19, and 23, the display panel DP may include first to eighth bridge lines BL1a, BL2a, BL3a, BL4a, BL5a, BL6a, BL7a, and BL8a. The first to eighth bridge lines BL1a to BL8a may be located in the peripheral area 200NA. For example, the first to eighth bridge lines BL1a to BL8a may be located in at least one of the first area AA1, the bending area BA, or the second area AA2. FIG. 23 illustrates an example in which the first to eighth bridge lines BL1a to BL8a are evenly located in the first area AA1, the bending area BA, and the second area AA2.

According to one or more embodiments of the present disclosure, when the bending area BA of the display panel DP is bent and assembled, the direction of the first magnetic fields generated in the first area AA1, particularly in the sensing area 200A in the charging-driving mode and the direction of the second magnetic fields generated in the circuit board MFPC may be the same. Thus, the signal-to-noise ratio of the third measurement area TA3 may be improved to a level that is similar to or slightly higher than the signal-to-noise ratio of each of the first measurement area TA1 and the second measurement area TA2. As a result, the sensing sensitivity of the pen PN of the electronic device 1000 (see FIG. 1A) may be improved.

Figure 24:
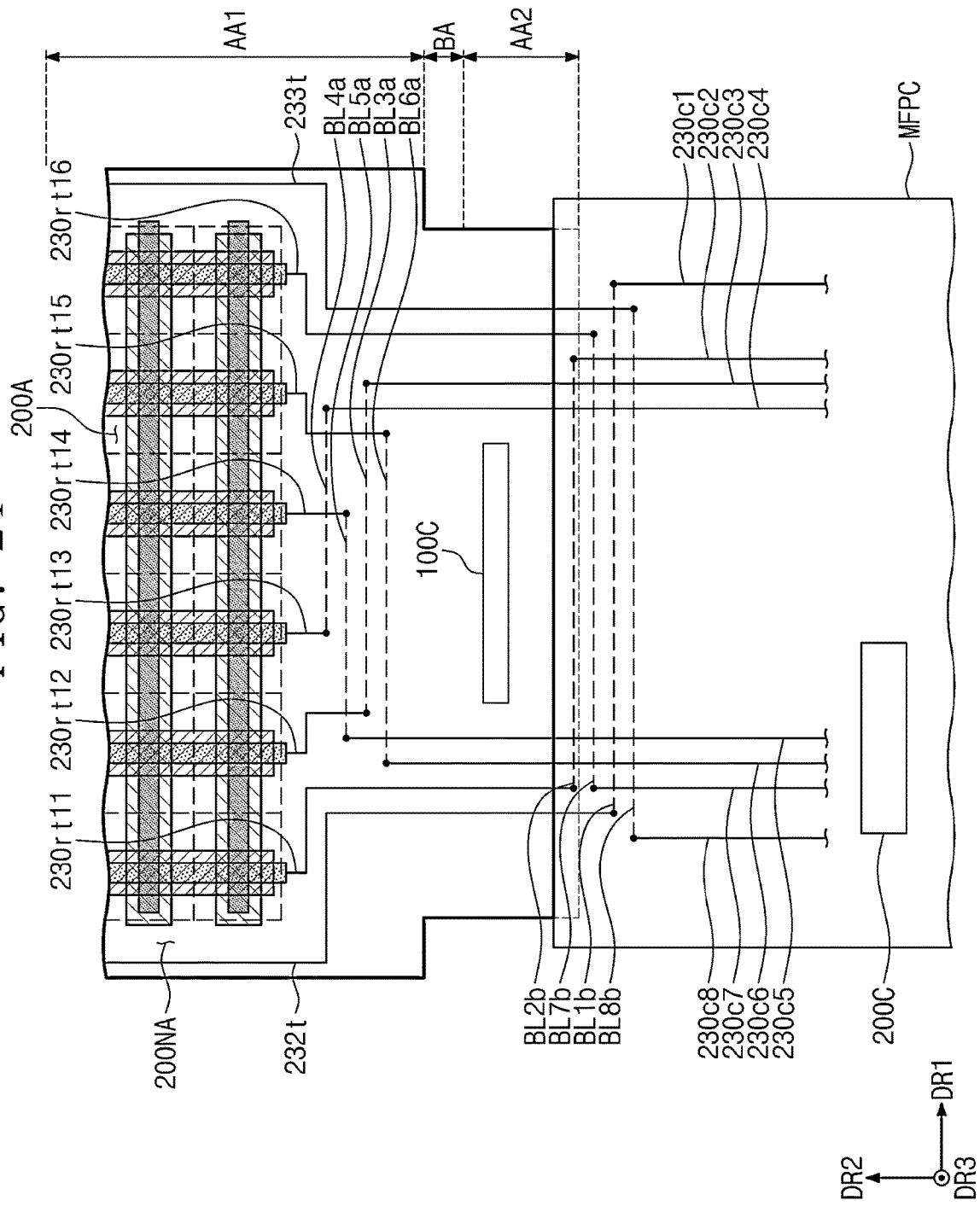
FIG. 24 is a view of a display panel and a circuit board according to one or more embodiments of the present disclosure.

FIG. 24 is a view of a display panel and a circuit board MFPC according to one or more embodiments of the present disclosure. In the description of FIG. 24, the same reference numerals are used for the components described in FIGS. 20 and 21, and descriptions thereof will be omitted.

Referring to FIGS. 7, 19, and 24, at least one of the display panel DP or the circuit board MFPC may include first to eighth bridge lines BL1b, BL2b, BL3a, BL4a, BL5a, BL6a, BL7b, and BL8b. For example, the first, second, seventh, and eighth bridge lines BL1b, BL2b, BL7b, and BL8b may be included in the circuit board MFPC, and the third, fourth, fifth, and sixth bridge lines BL3a, BL4a, BL5a, and BL6a may be included in the display panel DP. However, this is only an example, and an arrangement position of the first to eighth bridge lines BL1b, BL2b, BL3a, BL4a, BL5a, BL6a, BL7b, and BL8b may be modified in various manners.

Additionally, as shown in FIG. 24, the first-first to first-sixth loop trace lines 230rt11 to 230rt16 may be respectively connected to the third electrodes 230.

Figure 25A:
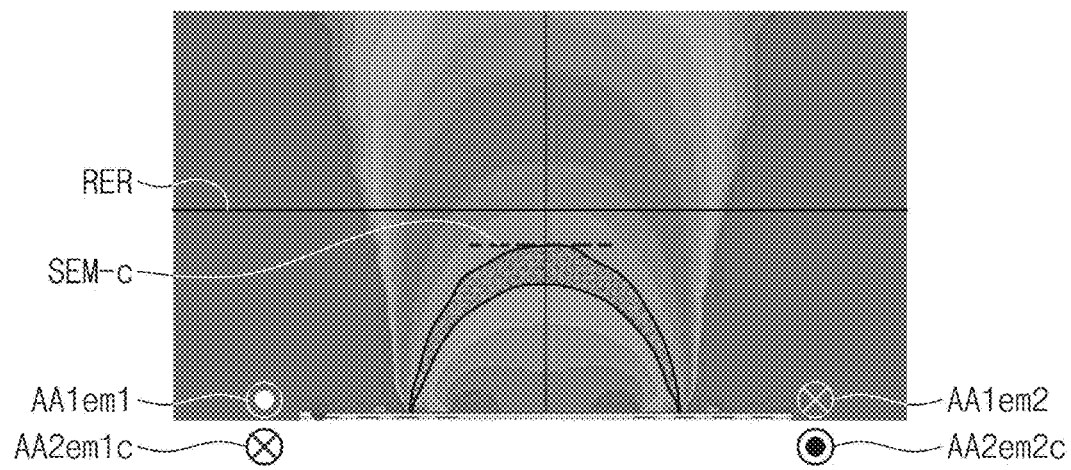
FIG. 25A is a view illustrating results of simulating magnetic fields on a surface of a display panel according to a comparative example of the present disclosure.
Figure 25B:
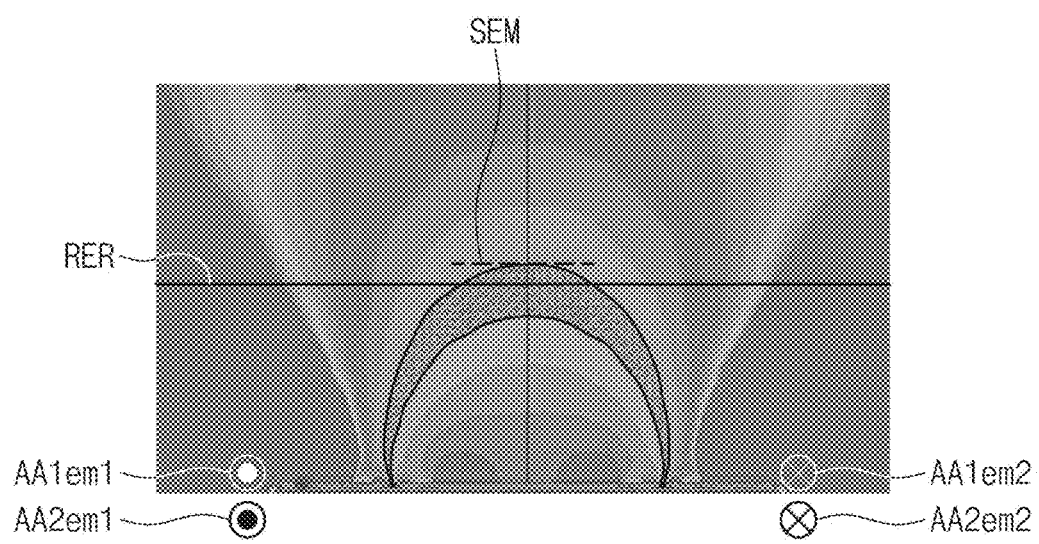
FIG. 25B is a view illustrating results of simulating magnetic fields on a surface of a display panel according to an embodiment of the present disclosure.

FIG. 25A is a view illustrating results of simulating magnetic fields on a surface of a display panel according to a comparative example of the present disclosure. FIG. 25B is a view illustrating results of simulating magnetic fields on a surface of a display panel according to an embodiment of the present disclosure.

Referring to FIGS. 7, 19, 25A, and 25B, in simulation results of FIGS. 25A and 25B, magnetic fields measured in the third measurement area TA3 are expressed by a contour line.

A reference line RER illustrated in FIGS. 25A and 25B indicates a height at which strength of reference magnetic fields are measured if the display panel DP is not bent as illustrated in FIG. 7. The strength of the reference magnetic fields may be, for example, about $3 \times 10^{-7}$ T.

According to a comparative example of the present disclosure, an arrangement order of the first loop trace lines 230rt1 electrically connected to the third electrodes 230 may extend without being changed and electrically connected to the sensor driver 200C. Referring to FIG. 25A, if the display panel DP is bent and assembled, then a direction of current AA1em1 and AA1em2 in the first area AA1 and a direction of current AA2em1c and AA2em2c in the second area AA2 or the circuit board MFPC in the charging-driving mode may be different from each other. Thus, the direction of the first magnetic fields generated in the first area AA1 and the direction of the second magnetic fields generated in the second area AA2 and the circuit board MFPC may be different from each other. As a result, a height SEM-c with the strength of the reference magnetic fields may be less than the reference line RER.

According to one or more embodiments of the present disclosure, as previously described with reference to FIGS. 20 to 24, the arrangement order of the first loop trace lines 230rt1 electrically connected to the third electrodes 230 may be changed to be electrically connected to the sensor driver 200C. Referring to FIG. 25B, if the display panel DP is bent and assembled, then a direction of current AA1em1 and AA1em2 in the first area AA1 and a direction of current AA2em1 and AA2em2 in the second area AA2 or the circuit board MFPC in the charging-driving mode may be the same. Thus, the direction of the first magnetic fields generated in the first area AA1 and the direction of the second magnetic fields generated in the second area AA2 and the circuit board MFPC may be the same. As a result, a height SEM with the strength of the reference magnetic fields may be greater than the reference line RER.

Figure 26:
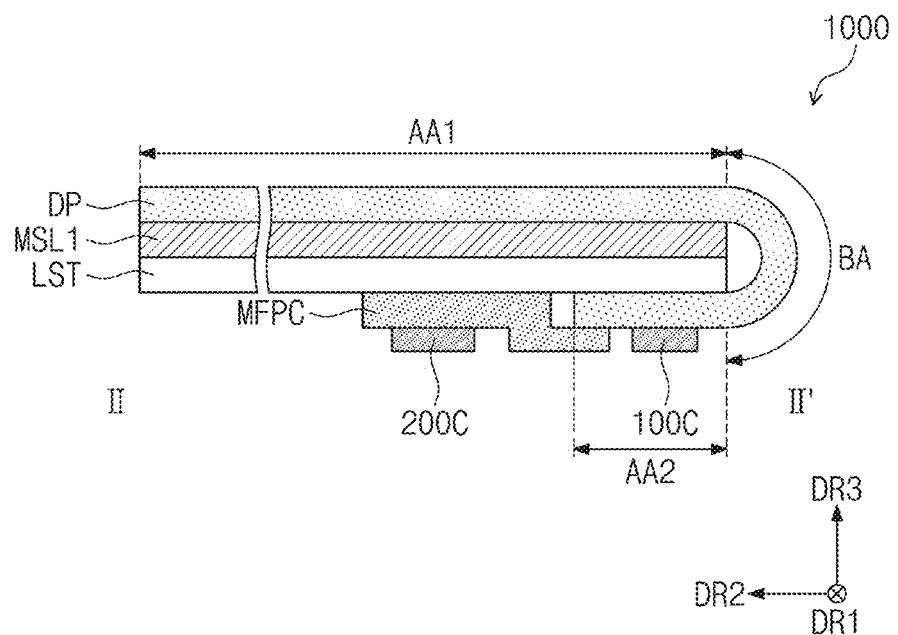
FIG. 26 is a cross-sectional view of an electronic device, taken along the line II-II' of FIG. 19 according to one or more embodiments of the present disclosure.

FIG. 26 is a cross-sectional view of an electronic device 1000, taken along the line II-II' of FIG. 19 according to one or more embodiments of the present disclosure.

Referring to FIGS. 7, 19, and 26, if the bending area BA of the display panel DP is bent, then the first area AA1 may overlap the second area AA2 and the circuit board MFPC. Therefore, as described with reference to FIGS. 20 to 24, the arrangement order of the first loop trace lines 230rt1 electrically connected to the third electrodes 230 may be changed to be electrically connected to the sensor driver 200C.

In the charge driving mode, the direction of the first magnetic fields generated in the first area AA1 and the direction of the second magnetic fields generated in the second area AA2 and the circuit board MFPC may be the same. Thus, the magnetic fields in the third measurement area TA3 and the area adjacent thereto may not be offset. Thus, the signal-to-noise ratio of the third measurement area TA3 may be improved to a level that is similar to or slightly higher than the signal-to-noise ratio of each of the first measurement area TA1 and the second measurement area TA2. As a result, the sensing sensitivity of the pen PN of the electronic device 1000 (see FIG. 1A) may be improved.

According to one or more embodiments of the present disclosure, the electronic device 1000 may further include a first magnetic-field-shielding layer MSL1 located below the first area AA1 of the display panel DP and a lower sheet (e.g., a metal lower sheet) LST located below the first magnetic-field-shielding layer MSL1. The second area AA2 and the circuit board MFPC may be located below the lower sheet LST.

The first magnetic-field-shielding layer MSL1 may include magnetic metal powder. The first magnetic-field-shielding layer MSL1 may be referred to as a ferrite sheet, a magnetic metal powder layer, a magnetic layer, a magnetic circuit layer, or a magnetic path layer. The first magnetic-field-shielding layer MSL1 may shield the magnetic fields from the first area AA1 of the display panel DP to the second area AA2 of the display panel DP. For example, the first magnetic-field-shielding layer MSL1 may serve to guide the direction of the transmitted magnetic fields in another direction. Thus, the magnetic fields that reach the first magnetic-field-shielding layer MSL1 may be shielded without leaking to the outside, for example, to a lower portion of the first magnetic-field-shielding layer MSL1.

The lower sheet LST may be a sheet that serves to reflect the magnetic fields toward the first magnetic-field-shielding layer MSL1. The lower sheet LST may include a metal or a metal alloy. For example, the lower sheet LST may include aluminum, copper, or a copper alloy.

Figure 27:
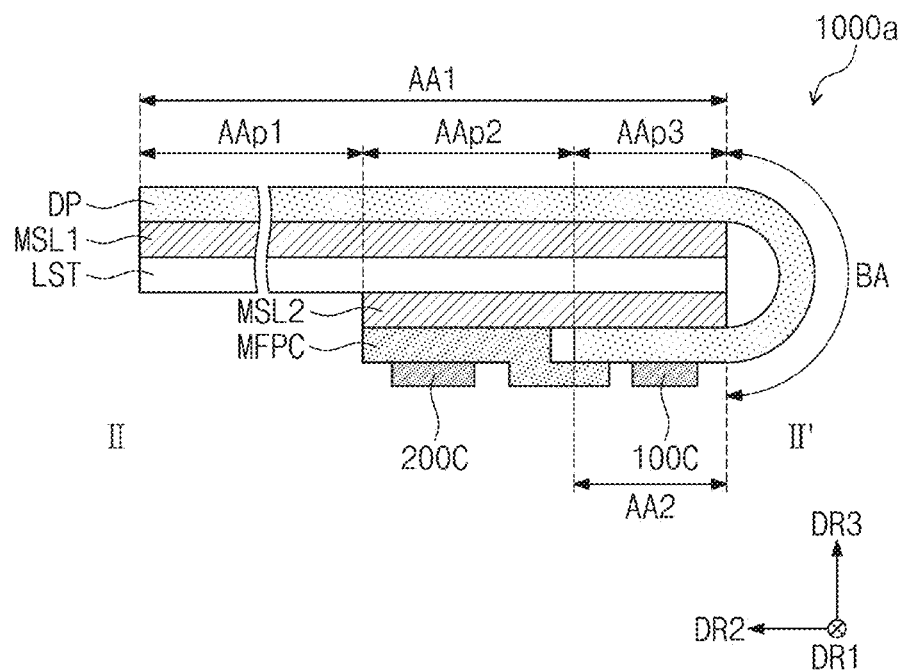
FIG. 27 is a cross-sectional view of an electronic device, taken along the line II-II' of FIG. 19 according to one or more embodiments of the present disclosure.

FIG. 27 is a cross-sectional view of an electronic device 1000a, taken along the line II-II' of FIG. 19 according to one or more embodiments of the present disclosure. In description of FIG. 27, the same reference numeral may be given to components that are the same as the components of FIG. 26, and their detailed descriptions will be omitted.

Referring to FIGS. 7 and 27, an electronic device 1000a may further include a first magnetic-field-shielding layer MSL1 located below the first area AA1 of the display panel DP, a lower sheet LST located below the first magnetic-field-shielding layer MSL1, and a second magnetic-field-shielding layer MSL2 located below the lower sheet LST.

The second area AA2 and the circuit board MFPC may be located under the second magnetic-field-shielding layer MSL2.

The second magnetic-field-shielding layer MSL2 may also include substantially the same material as the first magnetic-field-shielding layer MSL1. Thus, according to one or more embodiments of the present disclosure, two or more magnetic-field-shielding layers MSL1 and MSL2 may be located between the first area AA1 of the display panel DP and the second area AA2 of the display panel DP and between the first area AA1 of the display panel DP and the circuit board MFPC. Thus, possibility that the magnetic fields generated in the first area AA1 and the magnetic fields generated in the second area AA2 and the circuit board MFPCa are affected by each other may be lowered.

According to one or more embodiments of the present disclosure, an area (e.g., surface area) of the first magnetic-field-shielding layer MSL1 may be greater than that of the second magnetic-field-shielding layer MSL2. For example, the first magnetic-field-shielding layer MSL1 may entirely overlap the first area AA1 of the display panel DP, and the second magnetic-field-shielding layer MSL2 may overlap the second area AA2 of the display panel DP and the circuit board MFPC.

The first area AA1 may include a first partial area AAp1, a second partial area AAp2, and a third partial area AAp3. The first partial area AAp1 may be an area that is non-overlapping with the second area AA2 of the display panel DP and the circuit board MFPC.

Magnetic fields generated in the first partial area AAp1 may not be offset, or may be offset only slightly, by magnetic fields generated in the second area AA2 and the circuit board MFPC.

The second partial area AAp2 may be an area overlapping the circuit board MFPC. The third partial area AAp3 may be an area overlapping the second area AA2 of the display panel DP. That is, magnetic fields generated in the second partial area AAp2 and the third partial area AAp3 may be offset by the magnetic fields generated in the second area AA2 and the circuit board MFPC. Thus, in one or more embodiments, two or more magnetic field shielding layers MSL1 and MSL2 may be located between the second and third partial areas AAp2 and AAp3 and the circuit board MFPC to reduce or minimize the offset of the magnetic fields. Thus, possibility that the magnetic fields generated in the first area AA1 and the magnetic fields generated in the second area AA2 and the circuit board MFPC are influenced by each other may be reduced.

In the case of the one or more embodiments corresponding to FIG. 27, it may be combined with each of the embodiments previously described with reference to FIGS. 20 to 24. In addition, the one or more embodiments corresponding to FIG. 27 may be combined with a structure in which the arrangement order of the first loop trace lines 230rt1 electrically connected to the third electrodes 230 extends without being changed and is electrically connected to the sensor driver 200C.

Figure 28:
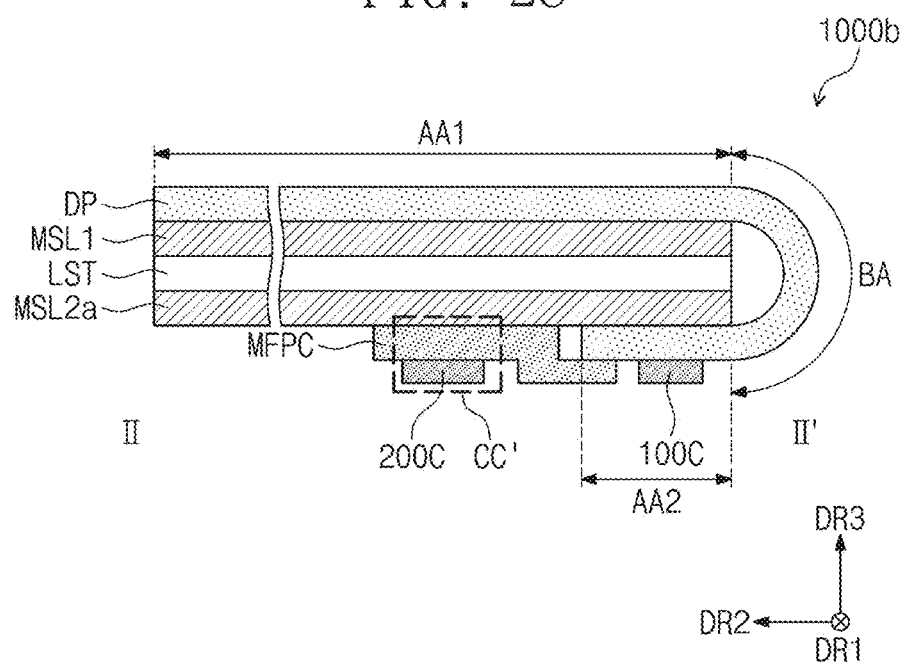
FIG. 28 is a cross-sectional view of an electronic device, taken along the line II-II' of FIG. 19 according to one or more embodiments of the present disclosure.

FIG. 28 is a cross-sectional view of an electronic device 1000b, taken along the line II-II' of FIG. 19 according to one or more embodiments of the present disclosure. In description of FIG. 28, the same reference numeral may be given to components that are the same as the components of FIG. 27, and their detailed descriptions will be omitted.

Referring to FIGS. 7 and 28, an electronic device 1000b may further include a first magnetic-field-shielding layer MSL1 located below the first area AA1 of the display panel DP, a lower sheet LST located below the first magnetic-field-shielding layer MSL1, and a second magnetic-field-shielding layer MSL2a located below the lower sheet LST. The second area AA2 and the circuit board MFPC may be located under the second magnetic-field-shielding layer MSL2a.

According to one or more embodiments of the present disclosure, an area of the first magnetic-field-shielding layer MSL1 may be substantially the same as that of the second magnetic-field-shielding layer MSL2a. For example, each of the first magnetic-field-shielding layer MSL1 and the second magnetic-field-shielding layer MSL2a may entirely overlap the first area AA1 of the display panel DP.

In the case of the one or more embodiments corresponding to FIG. 28, it may be combined with each of the embodiments previously described with reference to FIGS. 20 to 24. In addition, the one or more embodiments corresponding to FIG. 28 may be combined with a structure in which the arrangement order of the first loop trace lines 230rt1 electrically connected to the third electrodes 230 extends without being changed and is electrically connected to the sensor driver 200C.

Figure 29:
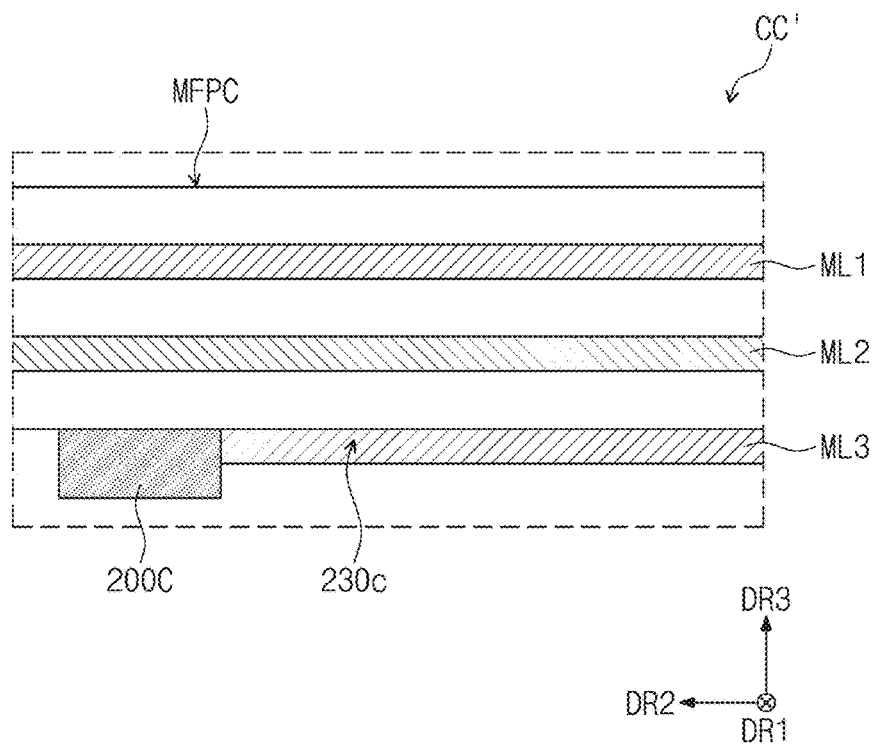
FIG. 29 is a cross-sectional view of a circuit board according to one or more embodiments of the present disclosure.

FIG. 29 is a cross-sectional view of the circuit board MFPC according to one or more embodiments of the present disclosure. For example, FIG. 29 is an enlarged plan view of an area CC' illustrated in FIG. 28.

Referring to FIGS. 28 and 29, the circuit board MFPC may include a plurality of conductive layers ML1, ML2, and ML3, and a plurality of connection lines 230c may be included in a conductive layer ML3 that is a layer furthest from the first area AA1 of the display panel DP among the plurality of conductive layers ML1, ML2, and ML3. The plurality of conductive layers ML1, and ML2 may be referred to as conductive shielding layers.

FIG. 29 illustrates an example in which the circuit board MFPC includes three conductive layers ML1, ML2, and ML3, but the present disclosure is not particularly limited thereto. For example, the circuit board MFPC may include two conductive layers, or may include four or more conductive layers.

Figure 30A:
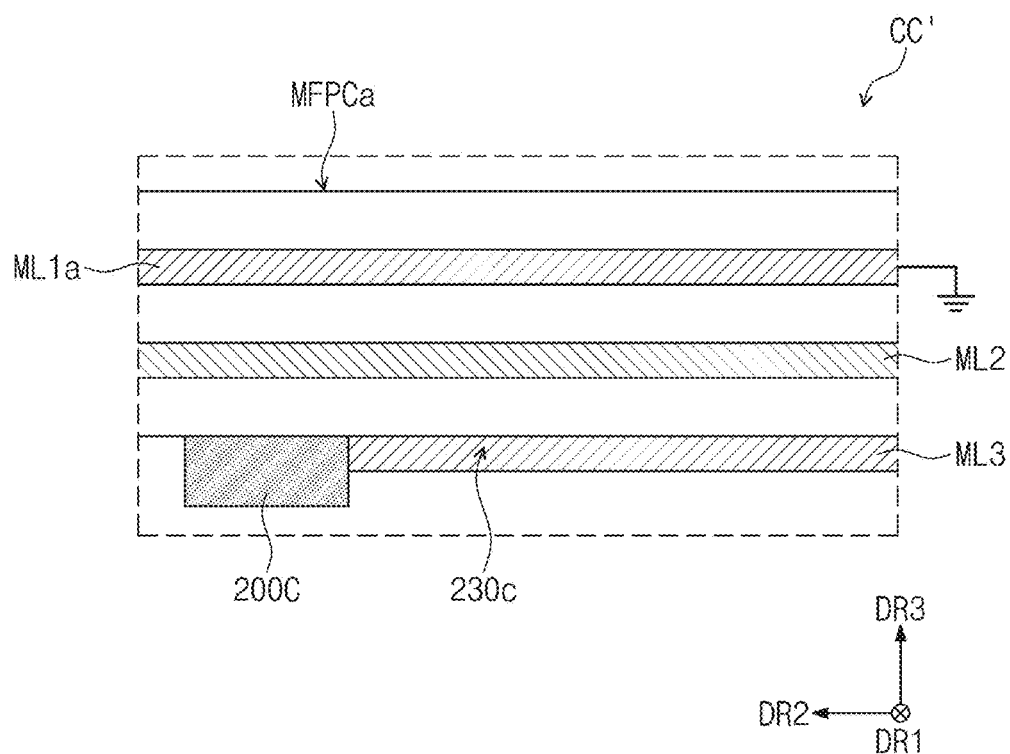
FIG. 30A is a cross-sectional view of a circuit board according to one or more embodiments of the present disclosure.
Figure 30B:
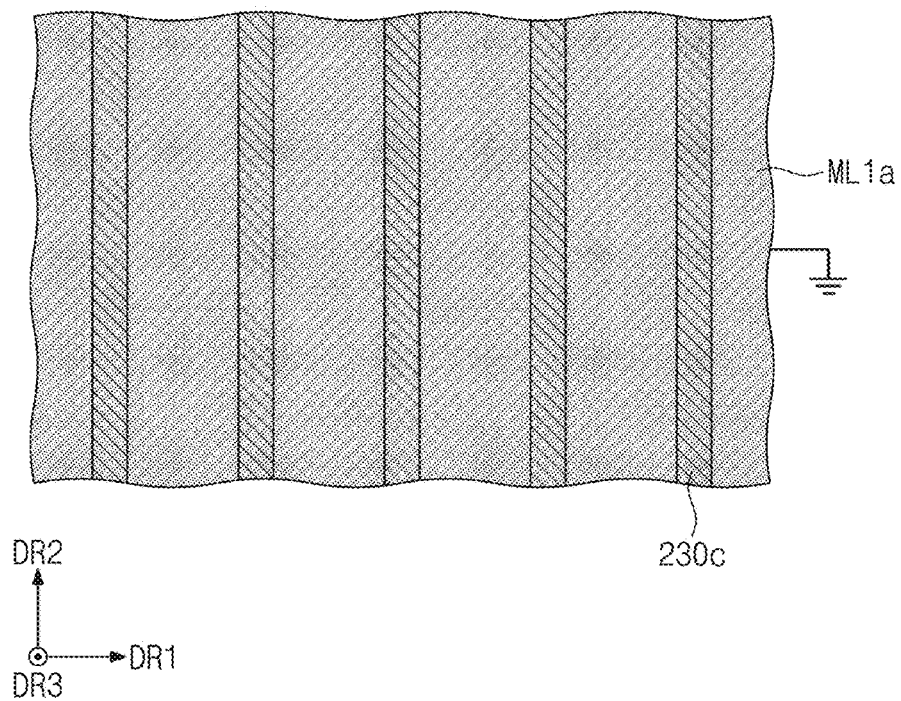
FIG. 30B is a plan view of the circuit board according to one or more embodiments of the present disclosure.

FIG. 30A is a cross-sectional view of a circuit board MFPCa according to one or more embodiments of the present disclosure. FIG. 30B is a plan view of the circuit board MFPCa according to one or more embodiments of the present disclosure. FIG. 30A is an enlarged plan view of an area CC' of FIG. 28.

Referring to FIGS. 28, 30A, and 30B, the circuit board MFPCa may include a plurality of conductive layers ML1a, ML2, and ML3, and a plurality of connection lines 230c may be included in a conductive layer ML3 that is a layer furthest from the first area AA1 of the display panel DP among the plurality of conductive layers ML1a, ML2, and ML3.

In one or more embodiments of the present disclosure, a shielding layer ML1a may be provided between the connection lines 230c and the first area AA1 of the display panel DP. That is, at least one conductive layer of the plurality of conductive layers ML1a, ML2, and ML3 may function as the shielding layer ML1a, which may be referred to as the shielding layer ML1a. When viewed on the plane, for example, viewed in the third direction DR3, the shielding layer ML1a may overlap all of the connection lines 230c.

In one or more embodiments of the present disclosure, the shielding layer ML1a may be grounded or may be provided at a constant voltage (e.g., predetermined constant voltage). In this case, possibility that the magnetic fields generated in the first area AA1 and the magnetic fields generated in the second area AA2 and the circuit board MFPC are affected by each other may be lowered by the shielding layer ML1a.

The one or more embodiments corresponding to FIGS. 30A and 30B may be combined with each of the embodiments previously described with reference to FIGS. 20 to 24. In addition, the one or more embodiments corresponding to FIGS. 30A and 30B may be combined with a structure in which the arrangement order of the first loop trace lines 230rt1 electrically connected to the third electrodes 230 extends without being changed and is electrically connected to the sensor driver 200C. In addition, the one or more embodiments corresponding to FIGS. 30A and 30B may be combined with each of the embodiments previously described with reference to FIGS. 26 to 28. In addition, the one or more embodiments corresponding to FIGS. 30A and 30B may be combined with each of the embodiments described with reference to FIGS. 20 to 24 and the embodiments described with reference to FIGS. 26 to 28.

Figure 31:
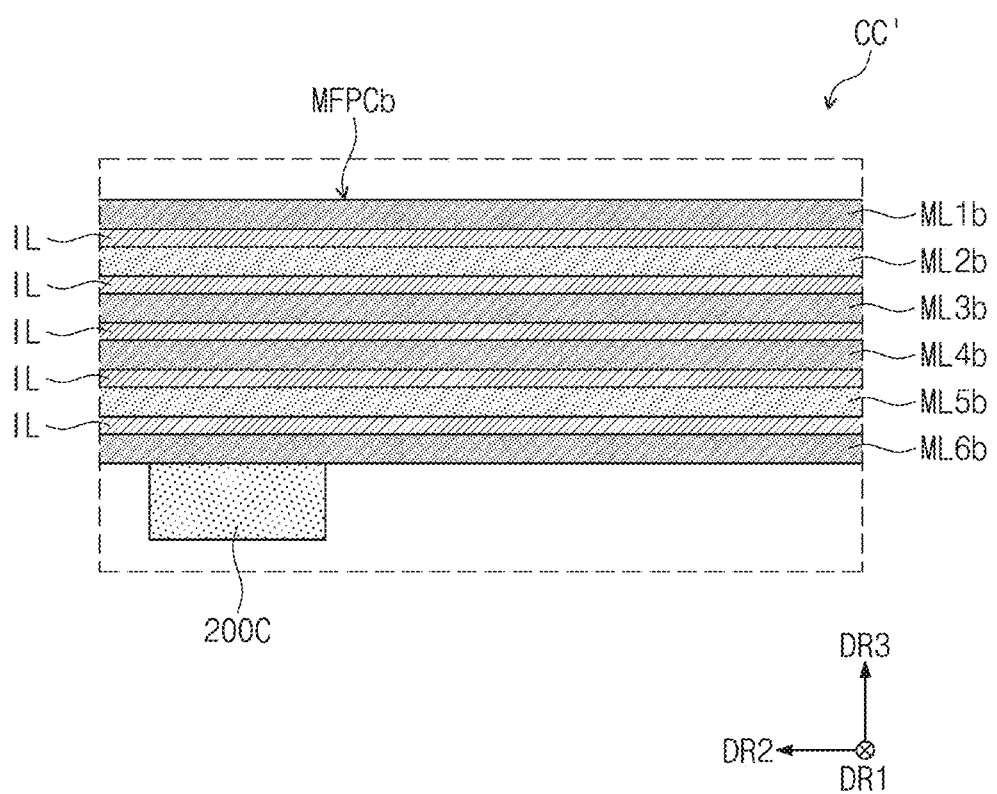
FIG. 31 is a cross-sectional view of a circuit board according to one or more embodiments of the present disclosure.

FIG. 31 is a cross-sectional view of a circuit board MFPCb according to one or more embodiments of the present disclosure. For example, FIG. 31 is an enlarged plan view of an area CC' of FIG. 28.

Referring to FIGS. 28 and 31, the circuit board MFPCb may include a plurality of layers ML1b, ML2b, ML3b, ML4b, ML5b, and ML6b and insulating layers IL located between the plurality of layers ML1b, ML2b, ML3b, ML4b, ML5b, and ML6b. The plurality of layers ML1b, ML2b, ML3b, ML4b, ML5b, and ML6b may include a first shielding layer ML1b, a first line layer ML2b, a second shielding layer ML3b, a third shielding layer ML4b, a second line layer ML5b, and a fourth shielding layer ML6b.

The first shielding layer ML1b may be a layer closest to the display panel DP (see FIG. 7). Thus, it may be understood that the first shielding layer ML1b, the first line layer ML2b, the second shielding layer ML3b, the third shielding layer ML4b, the second line layer ML5b, and the fourth shielding layer ML6b are sequentially laminated in a direction away from the display panel DP.

Figure 32A:
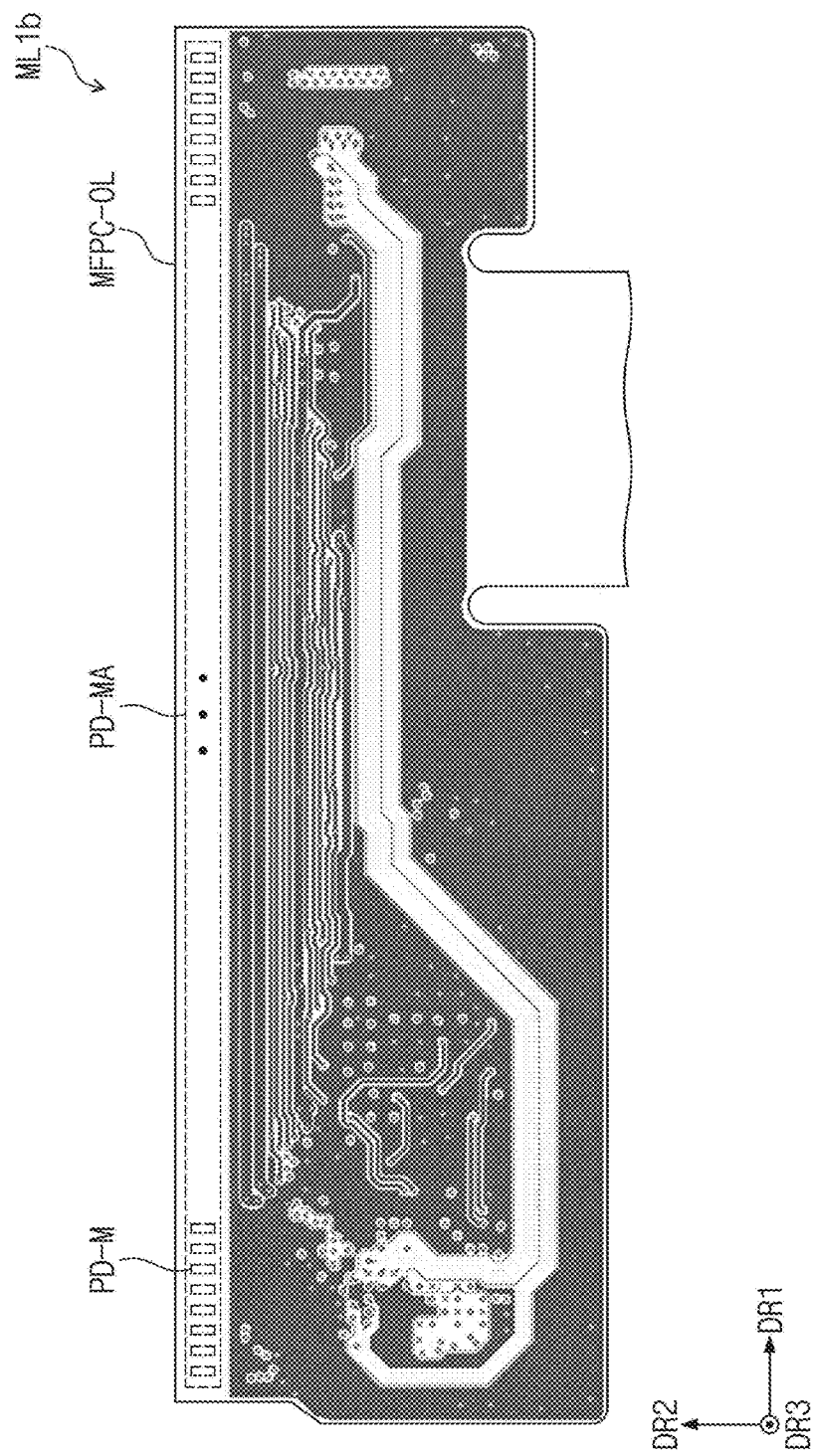
FIG. 32A is a plan view of a first shielding layer according to one or more embodiments of the present disclosure.

FIG. 32A is a plan view of a first shielding layer (e.g., first conductive shielding layer) ML1b according to one or more embodiments of the present disclosure.

Referring to FIGS. 31 and 32A, the first shielding layer ML1b and an outer line MFPC-OL of the circuit board MFPCb are illustrated together. The first shielding layer ML1b may not cover a pad area PD-MA in which pads PD-M of the circuit board MFPCb are located.

Figure 32B:
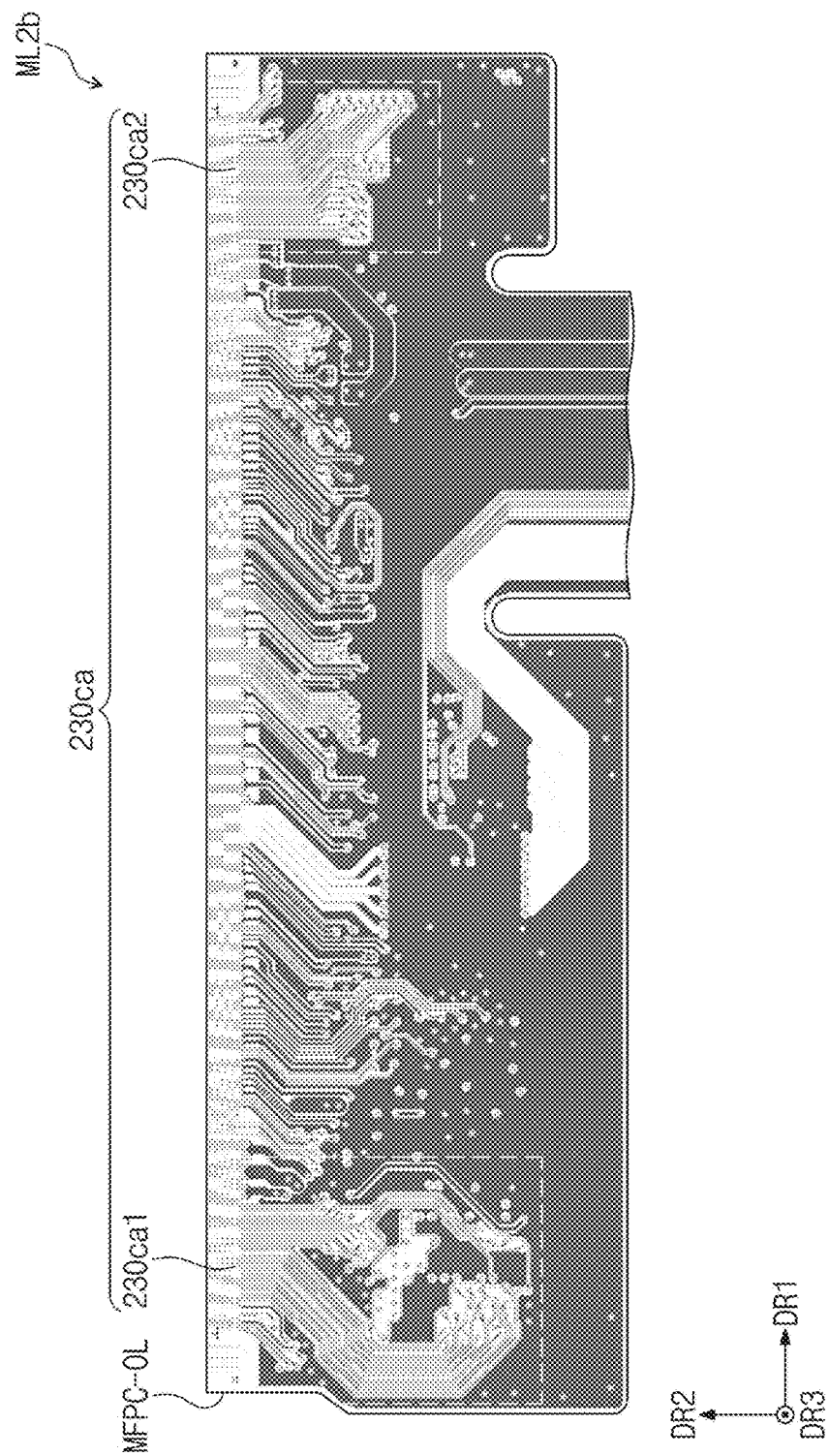
FIG. 32B is a plan view of a first line layer according to one or more embodiments of the present disclosure.

FIG. 32B is a plan view of a first line layer ML2b according to one or more embodiments of the present disclosure.

Referring to FIGS. 31 and 32B, the circuit board MFPCb may include a plurality of connection lines 230ca. FIG. 32B illustrates some of the connection lines 230ca included in the first line layer (e.g., first conductive layer) ML2b.

The connection lines 230ca may include a plurality of first connection lines 230ca1 and a plurality of second connection lines 230ca2. The first connection lines 230ca1 and the second connection lines 230ca2 may be spaced apart from each other in the first direction DR1.

The sensor driver 200C may be mounted adjacent to either one of the first connection lines 230ca1 or the second connection lines 230ca2. In this case, any one of the first connection lines 230ca1 and the second connection lines 230ca2 may be connected to the sensor driver 200C via extension connection lines 230ca2-CL (see FIG. 32F) extending along a width direction of the circuit board MFPCb, for example, along the first direction DR1.

According to one or more embodiments of the present disclosure, the first line layer ML2b may correspond to a layer that is located closer to the display panel DP (see FIG. 7) than the second line layer ML5b to be described later. Thus, a portion extending along the width direction of the circuit board MFPCb, for example, along the first direction DR1 may not be included in the first line layer ML2b.

The first shielding layer ML1b is disposed between the connection lines 230ca and the first electrode portions. The first electrode portions may comprise at least one of first portions of the first loop trace lines 230rt1 (see FIG. 7), a first portion of the second line portion 232t (see FIG. 7), a first portion of the third line portion 233t (see FIG. 7), and each of the third electrodes 230 (see FIG. 7) are disposed in the first area AA1 (see FIG. 7).

Figure 32C:
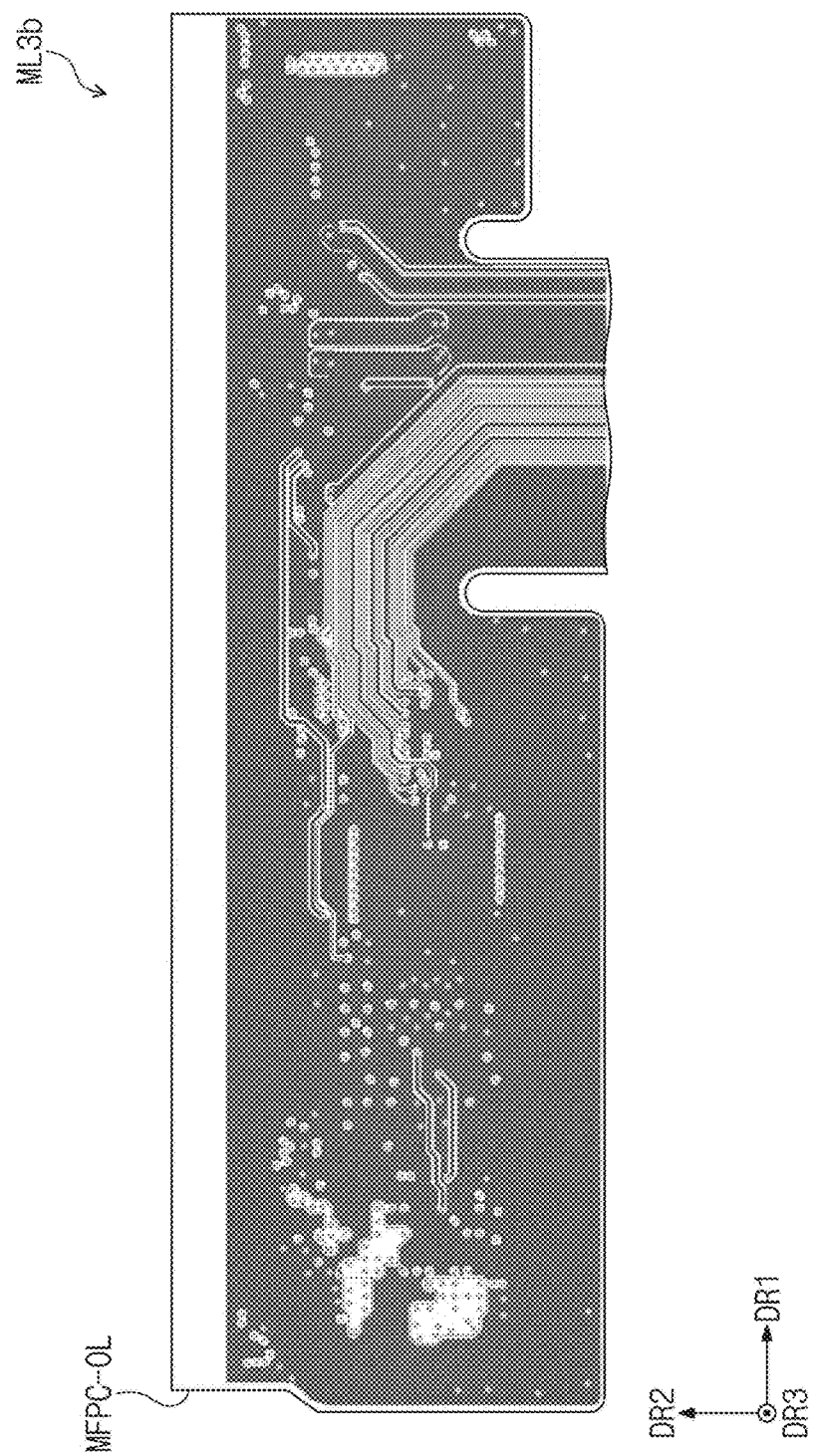
FIG. 32C is a plan view of a second shielding layer according to one or more embodiments of the present disclosure.
Figure 32D:
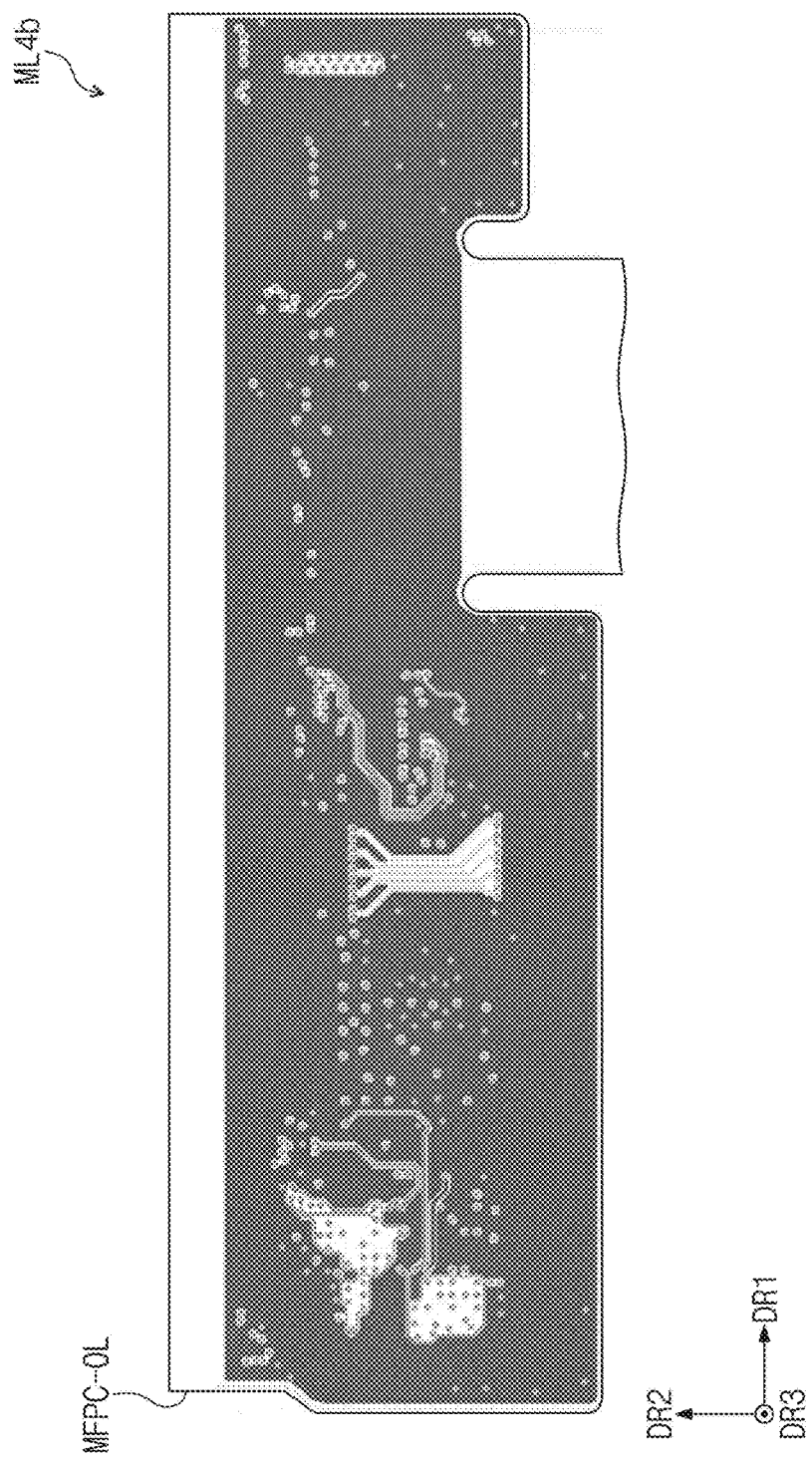
FIG. 32D is a plan view of a third shielding layer according to one or more embodiments of the present disclosure.

FIG. 32C is a plan view of a second shielding layer ML3b according to one or more embodiments of the present disclosure. FIG. 32D is a plan view of a third shielding layer ML4b according to one or more embodiments of the present disclosure.

Referring to FIGS. 32A, 32B, 32C, and 32D, the first shielding layer ML1b or each of the second shielding layer (e.g., second conductive shielding layer) ML3b and the third shielding layer (e.g., third conductive shielding layer) ML4b may be grounded or provided with a constant voltage (e.g., predetermined constant voltage). However, the present disclosure is not limited thereto, and the second shielding layer ML3b and the third shielding layer ML4b may also be floated.

Each of the second shielding layer ML3b and the third shielding layer ML4b may include a conductive material. Thus, the second shielding layer ML3b and the third shielding layer ML4b may further include lines through which a signal (e.g., predetermined signal) is transmitted.

Figure 32E:
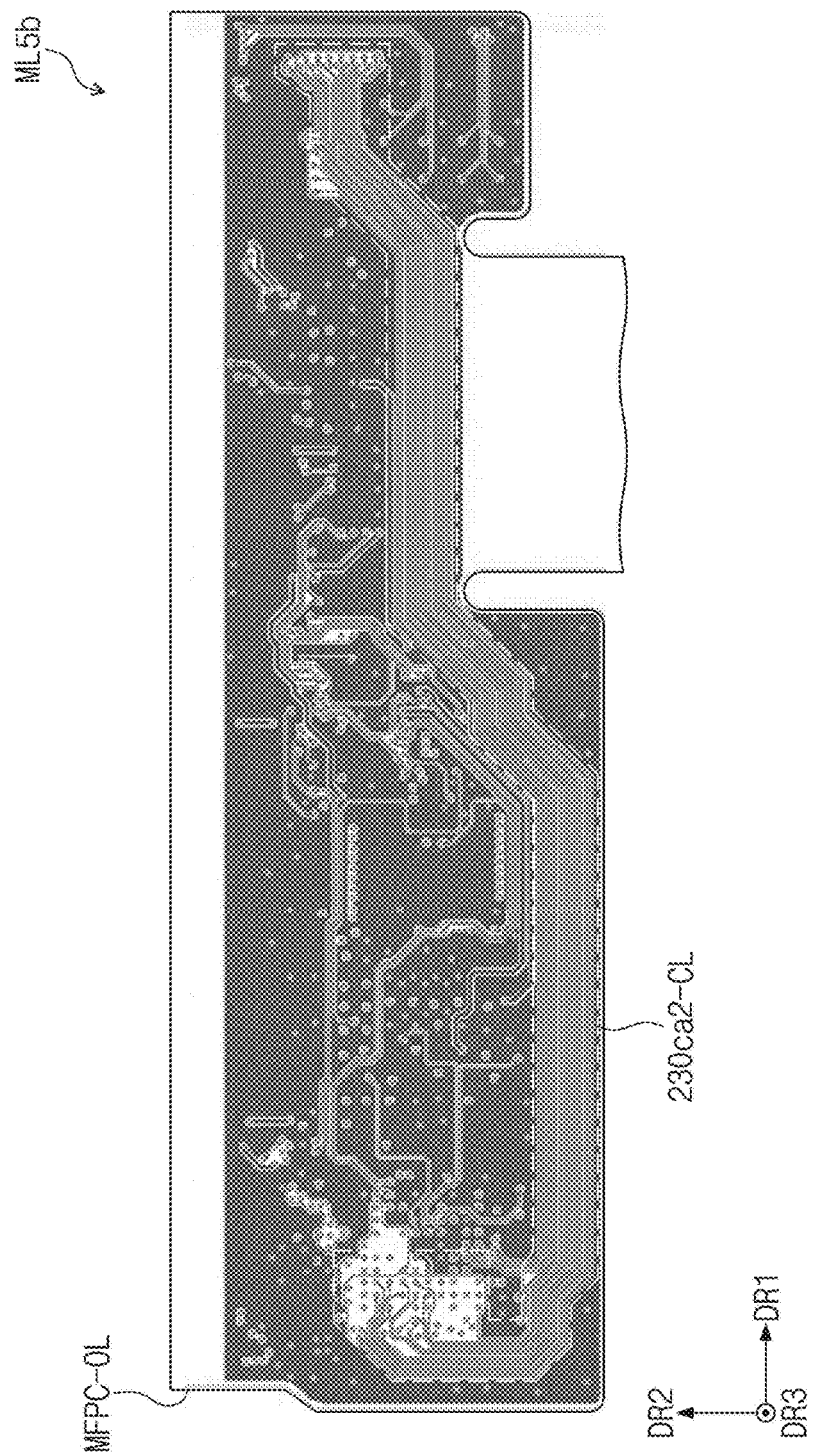
FIG. 32E is a plan view of a second line layer according to one or more embodiments of the present disclosure.
Figure 32F:
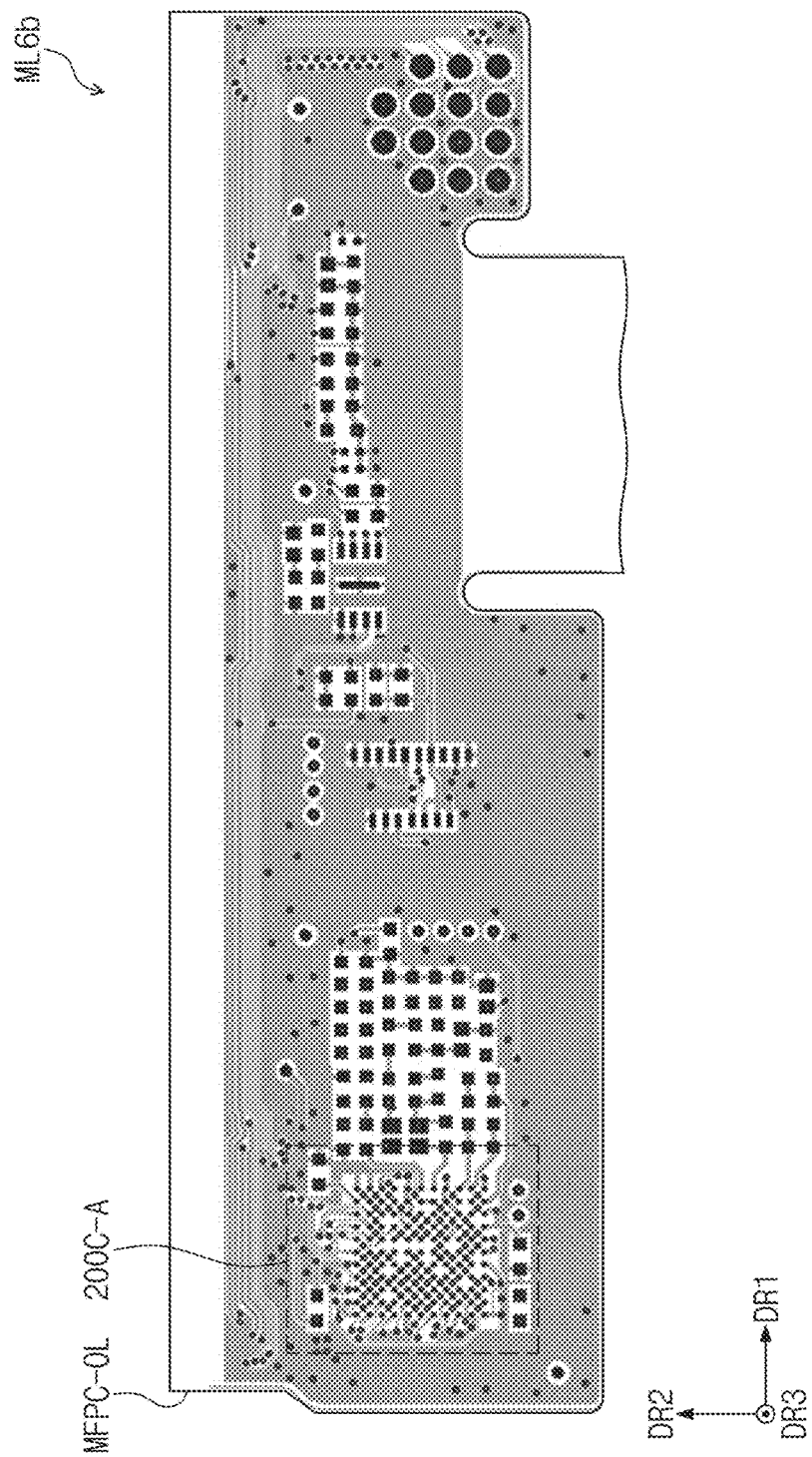
FIG. 32F is a plan view of a fourth shielding layer according to one or more embodiments of the present disclosure.

FIG. 32E is a plan view of a second line layer ML5b according to one or more embodiments of the present disclosure. FIG. 32F is a plan view of a fourth shielding layer ML6b according to one or more embodiments of the present disclosure.

Referring to FIGS. 32B, 32E, and 32F, the second line layer (e.g., second conductive layer) ML5b may include extension connection lines 230ca2-CL. The extension connection lines 230ca2-CL may be connected to the second connection lines 230ca2 to extend along the width direction of the circuit board MFPCb.

The second shielding layer ML3b (see FIG. 32C) and the third shielding layer ML4b (see FIG. 32D) are disposed between the connection lines 230ca and the extension connection lines 230ca2-CL.

Referring to FIG. 32F, a mounting area 200C-A on which the sensor driver 200C is mounted is illustrated. Thus, the extension connection lines 230ca2-CL may be provided to allow the second connection lines 230ca2, which are relatively far apart from the sensor driver 200C, to extend up to a mounting area 200C-A that overlaps the sensor driver 200C.

A length of the extension connection lines 230ca2-CL may be longer than a length of the second connection lines 230ca2. Thus, the extension connection lines 230ca2-CL may be designed to be included in the second line layer ML5b that is relatively far from the display panel DP (see FIG. 7) among the first line layer ML2b and the second line layer ML5b.

The fourth shielding layer ML6b may cover the second line layer ML5b. The sensor driver 200C may be mounted on the mounting area 200C-A illustrated on the fourth shielding layer ML6b.

Referring to FIG. 7, FIG. 31 and FIGS. 32A to 32F, the circuit board MFPCb may be designed to reduce or minimize the offset of the magnetic fields generated in the first area AA1 of the display panel DP by the connection lines 230*ca*. For example, the circuit board MFPCb may include at least two line layers including the connection lines 230*ca*, and a portion having a relatively long length may be located on a layer farthest from the display panel DP. In addition, the circuit board MFPCb may be provided with a plurality of shielding layers, for example, the second shielding layer ML3*b* and the third shielding layer ML4*b*, not only between the first shielding layer ML1*b* and the fourth shielding layer ML6*b* arranged at the outermost portion, but also between the first line layer ML2*b* and the second line layer ML5*b*, and thus, possibility that the magnetic fields generated in the first area AA1 and the magnetic fields generated in the circuit board MFPCb are influenced by each other may be further reduced.

As described above, the input by the pen as well as the touch input may be sensed using the sensor layer. Therefore, because the separate component (for example, the digitizer) for pen sensing does not need to be added to the electronic device, the increase in thickness and weight of the electronic device, and the deterioration in flexibility of the electronic device due to the addition of the digitizer, may not occur. In addition, the structure may be provided in which the first magnetic fields generated in the first area of the display panel and the second magnetic fields generated in the second area or the circuit board are not offset. In this case, the signal-to-noise ratio of the second area of the display panel and one area of the electronic device that overlaps the circuit board may be improved to be similar to, or slightly greater than, the signal-to-noise ratio of the first area of the display panel and another area of the electronic device that does not overlap the circuit board. Therefore, the pen-sensing sensibility of the electronic device may be improved.

It will be apparent to those skilled in the art that various modifications and deviations can be made in the present disclosure. Thus, it is intended that the present disclosure covers the modifications and deviations of the disclosed embodiments provided they come within the scope of the appended claims and their equivalents. Accordingly, the technical scope of the present disclosure should not be limited to the contents described in the detailed description of the specification, but should be determined by the claims.

What is claimed is:

1. An electronic device comprising:
    a display panel comprising:
        a first area;
        a bending area at which the display panel is bent;
        a second area overlapped by the first area;
        first electrodes arranged in a first direction in the first area;
        second electrodes arranged in a second direction crossing the first direction in the first area, and crossing the first electrodes; and
        third electrodes in the first area, and overlapping with the first electrodes;
    a circuit board coupled to the display panel at the second area, and comprising connection lines arranged in the first direction, and respectively electrically connected to the third electrodes;
    a metal lower sheet between the display panel and the circuit board;
    a first magnetic-field-shielding layer between the third electrodes of the display panel and the metal lower sheet; and
    a second magnetic-field-shielding layer between the connection lines of the circuit board and the metal lower sheet.

2. The electronic device of claim 1, wherein the connection lines are respectively electrically connected to the third electrodes at the first area, at the bending area, or at the second area.

3. The electronic device of claim 1, wherein the display panel further comprises a display layer and a sensor layer, the sensor layer comprising:
    first loop trace lines respectively electrically connected to first ends of the third electrodes, and arranged in the first direction; and
    a second loop trace line electrically connected to second ends of the third electrodes.

4. The electronic device of claim 3, wherein the first loop trace lines are spaced from the connection lines respectively electrically connected thereto in the first direction.

5. The electronic device of claim 3, wherein the second loop trace line comprises:
    a first line portion electrically connected to the third electrodes;
    a second line portion extending from a first end of the first line portion in the second direction; and
    a third line portion extending from a second end of the first line portion in the second direction,
    wherein the second line portion, the first loop trace lines, and the third line portion are sequentially arranged in the first direction.

6. The electronic device of claim 3, wherein at least one of the display panel or the circuit board further comprises bridge lines respectively electrically connecting the connection lines and the third electrodes.

7. The electronic device of claim 6, wherein the bridge lines extend in the first direction.

8. The electronic device of claim 6, wherein the bridge lines are in the first area.

9. The electronic device of claim 6, wherein the first area comprises a sensing area for sensing an external input, and a peripheral area adjacent to the sensing area, and
    wherein at least some of the bridge lines are in the peripheral area.

10. The electronic device of claim 6, wherein the bridge lines are separated from the bending area.

11. The electronic device of claim 6, wherein some of the bridge lines are in the first area, and wherein others of the bridge lines are in the circuit board.

12. An electronic device comprising:
    a display panel comprising:
        a first area;
        a bending area at which the display panel is bent;
        a second area overlapped by the first area;
        first electrode portions arranged in a first direction in the first area;
        second electrode portions arranged in the first direction in the bending area, and electrically connected to the first electrode portions; and
        third electrode portions arranged in the first direction in the second area, and electrically connected to the second electrode portions;
    a circuit board coupled to the display panel at the second area, and comprising connection lines arranged in the first direction, and electrically connected to the third electrode portions;
    a metal lower sheet between the first electrode portions and the connection lines;
    a first magnetic-field-shielding layer between the first electrode portions and the metal lower sheet; and
    a second magnetic-field-shielding layer between the connection lines and the metal lower sheet.

13. The electronic device of claim 12, wherein the connection lines have an arrangement order in the first direction that is different from an arrangement order in the first direction of the third electrode portions respectively connected thereto.

14. The electronic device of claim 13, wherein the arrangement order of the third electrode portions is opposite to the arrangement order of the connection lines.

15. An electronic device comprising:
a display panel comprising:
a first area;
a bending area at which the display panel is bent;
a second area overlapped by the first area;
first electrode portions arranged in a first direction in the first area;
second electrode portions arranged in the first direction in the bending area, and electrically connected to the first electrode portions; and
third electrode portions arranged in the first direction in the second area, and electrically connected to the second electrode portions;
a circuit board coupled to the display panel at the second area, and comprising:
connection lines electrically connected to the third electrode portions at a first layer;
extension connection lines connected to the connection lines at a second layer that is different from the first layer;
a first conductive shielding layer between the first electrode portions and the connection lines; and
a second conductive shielding layer between the connection lines and the extension connection lines;
a metal lower sheet between the display panel and the circuit board; and
a magnetic-field-shielding layer between the display panel and the metal lower sheet.

16. The electronic device of claim 15, wherein the first conductive shielding layer or the second conductive shielding layer is grounded.

17. The electronic device of claim 15, wherein the first conductive shielding layer or the second conductive shielding layer is configured to receive a constant voltage.

18. The electronic device of claim 15, wherein the circuit board is below the display panel at the first area, and further comprises a first conductive layer comprising the connection lines and a second conductive layer comprising the extension connection lines, and
the first conductive layer is between the second conductive layer and the first area of the display panel.

19. The electronic device of claim 18, wherein the first conductive layer is below the first conductive shielding layer, and partially overlaps the second area of the display panel.

20. The electronic device of claim 18, wherein the second conductive layer is below the second conductive shielding layer, and partially overlaps the second area of the display panel.

21. An electronic device comprising:
a substrate comprising a first area, a bending area at which the substrate is bent, and a second area overlapped by the first area;
a circuit layer above the substrate, and comprising a transistor;
a light-emitting element layer above the circuit layer, and comprising a light-emitting element electrically connected to the transistor;
a sensor layer above the light-emitting element layer, and comprising electrodes arranged in a first direction in the first area;
a sensor driver configured to use the electrodes to generate a magnetic field for charging a pen comprising an RLC resonance circuit;
a circuit board coupled to the substrate at the second area, and comprising connection lines electrically connected to the electrodes;
a metal lower sheet between the electrodes and the connection lines;
a first magnetic-field-shielding layer between the electrodes and the metal lower sheet; and
a second magnetic-field-shielding layer between the connection lines and the metal lower sheet.

22. The electronic device of claim 21, wherein the sensor driver is configured to selectively operate in a first mode in which the sensor layer is driven to sense a touch input, or in a second mode comprising a charging-driving mode in which the sensor layer is driven to sense a pen input.

23. The electronic device of claim 22, wherein the sensor layer is configured to sense the pen input by applying a first signal to at least one of the electrodes, and by applying a second signal to at least one other of the electrodes.

24. The electronic device of claim 21, wherein the sensor layer further comprises a first mesh line having a first width, a second mesh line above the first mesh line and having a second width that is equal to or greater than the first width, and an intermediate insulating layer between the first mesh line and the second mesh line.

25. The electronic device of claim 21, wherein the connection lines have an arrangement order in the first direction that is different from an arrangement order in the first direction of the electrodes respectively connected thereto.

26. The electronic device of claim 21, further comprising bridge lines in the first area of the substrate and/or in the circuit board, the bridge lines respectively electrically connecting the electrodes to the connection lines.

27. The electronic device of claim 26, wherein the bridge lines are within a limited distance from a bending edge defined in the bending area.

28. The electronic device of claim 21, further comprising a display driver in the second area and configured to control the circuit layer,
wherein the circuit board overlaps the first area.

29. The electronic device of claim 21, wherein the second magnetic-field-shielding layer overlaps the second area of the substrate and the circuit board.

30. The electronic device of claim 21, wherein the first magnetic-field-shielding layer has a surface area that is equal to or greater than that of the second magnetic-field-shielding layer.

* * * * *